United States Patent
Adamovich et al.

(10) Patent No.: US 10,749,113 B2
(45) Date of Patent: Aug. 18, 2020

(54) ORGANIC ELECTROLUMINESCENT MATERIALS AND DEVICES

(71) Applicant: Universal Display Corporation, Ewing, NJ (US)

(72) Inventors: Vadim Adamovich, Yardley, PA (US); Lichang Zeng, Lawrenceville, NJ (US); Ting-Chih Wang, Lawrenceville, NJ (US); Chuanjun Xia, Lawrenceville, NJ (US); Michael S. Weaver, Princeton, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 405 days.

(21) Appl. No.: 14/863,768

(22) Filed: Sep. 24, 2015

(65) Prior Publication Data
US 2016/0093808 A1 Mar. 31, 2016

Related U.S. Application Data

(60) Provisional application No. 62/056,940, filed on Sep. 29, 2014.

(51) Int. Cl.
| | | |
|---|---|---|
| H01L 51/00 | (2006.01) | |
| C09K 11/06 | (2006.01) | |
| H01L 51/50 | (2006.01) | |

(52) U.S. Cl.
CPC .......... H01L 51/0054 (2013.01); C09K 11/06 (2013.01); H01L 51/001 (2013.01); H01L 51/0052 (2013.01); H01L 51/0058 (2013.01); H01L 51/0067 (2013.01); H01L 51/0071 (2013.01); H01L 51/0072 (2013.01); H01L 51/0073 (2013.01); H01L 51/0074 (2013.01); H01L 51/0085 (2013.01); C09K 2211/1007 (2013.01); C09K 2211/1029 (2013.01); C09K 2211/185 (2013.01); H01L 51/5004 (2013.01); H01L 51/5016 (2013.01); H01L 51/5024 (2013.01); H01L 2251/5384 (2013.01); H01L 2251/556 (2013.01)

(58) Field of Classification Search
CPC ............ C09K 11/06; C09K 2211/1007; C09K 2211/1029; C09K 2211/185; H01L 2251/5384; H01L 2251/556; H01L 51/001; H01L 51/0052; H01L 51/0054; H01L 51/0058; H01L 51/0067; H01L 51/0071; H01L 51/0072; H01L 51/0073; H01L 51/0074; H01L 51/0085; H01L 51/5004; H01L 51/5016; H01L 51/5024

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 5,981,092 | A | 11/1999 | Arai et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,821,643 | B1 | 11/2004 | Hu et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |

(Continued)

FOREIGN PATENT DOCUMENTS

| | | |
|---|---|---|
| CN | 102850329 | 1/2013 |
| EP | 0650955 | 5/1995 |

(Continued)

OTHER PUBLICATIONS

Harton et al., "Carbon-13 Labeling for Improved Tracer Depth Profiling of Organic Materials Using Secondary Ion Mass Spectrometry" J. Am. Soc. Mass Spectrom, (2006), vol. 17, pp. 1142-1145.

Harton et al., "Carbon-13 Labeling for Quantitative Analysis of Molecular Movement in Heterogeneous Organic Materials Using Secondary Ion Mass Spectrometry" Anal. Chem., (2007), vol. 79, pp. 5358-5363.

Ye, Hua et al., "Conjugated polymers containing trifluoren-2-ylamine, trifluoren-2-ylbenzene and trifluoren-2-yltriazine or electroluminescence" polymer 54 (2013) 162-173.

Extended European Search Report dated Jan. 1, 2016 for corresponding EP Application No. 15175686.3.

(Continued)

Primary Examiner — Dawn L Garrett
(74) Attorney, Agent, or Firm — Duane Morris LLP

(57) ABSTRACT

A mixture containing three different compounds that is useful as a stable co-evaporation source material for a vacuum deposition tool is disclosed. The mixture comprises a first compound; a second compound; and a third compound that are all organic compounds and have different chemical structures from each other and each has an evaporation temperature T1, T2, and T3, respectively, in the range of 150 to 350° C. T1, T2, and T3 differ from each other by less than 20° C. The first compound has a concentration C1 in the first mixture and a concentration C2 in a film deposited by evaporating the first mixture in a high vacuum deposition tool under a predefined deposition condition where |(C1−C2)/C1| is less than 5%.

3 Claims, 6 Drawing Sheets

(56) References Cited

U.S. PATENT DOCUMENTS

| | | |
|---|---|---|
| 7,154,114 B2 | 12/2006 | Brooks et al. |
| 7,250,226 B2 | 7/2007 | Tokito et al. |
| 7,252,859 B2 | 8/2007 | Ng et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 8,679,647 B2 | 3/2014 | Pflumm et al. |
| 9,831,437 B2 | 11/2017 | Zeng et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0151042 A1 | 8/2003 | Marks et al. |
| 2003/0152802 A1 | 8/2003 | Tsuboyama et al. |
| 2003/0175553 A1 | 9/2003 | Thompson et al. |
| 2003/0230980 A1 | 12/2003 | Forrest et al. |
| 2004/0016907 A1 | 1/2004 | Shi |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0134317 A1 | 6/2006 | Yang et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0249148 A1 | 10/2007 | Werner et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Pakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2010/0187984 A1* | 7/2010 | Lin .................... C07D 491/04 313/504 |
| 2011/0037057 A1 | 2/2011 | Lecloux et al. |
| 2011/0227049 A1* | 9/2011 | Xia .................... C07F 15/0033 257/40 |
| 2011/0260138 A1 | 10/2011 | Xia et al. |
| 2012/0126208 A1 | 5/2012 | Kawamura et al. |
| 2013/0112952 A1 | 5/2013 | Adamovich et al. |
| 2013/0264560 A1 | 10/2013 | Dobbs et al. |
| 2014/0001456 A1 | 1/2014 | Mizutani et al. |
| 2014/0231769 A1* | 8/2014 | Nishimura .......... H01L 51/0073 257/40 |
| 2014/0264292 A1 | 9/2014 | Xia et al. |
| 2014/0299192 A1 | 10/2014 | Lee et al. |
| 2014/0312338 A1 | 10/2014 | Mizutani et al. |
| 2015/0001524 A1 | 1/2015 | Brooks et al. |
| 2015/0014649 A1 | 1/2015 | Ma et al. |
| 2015/0025239 A1 | 1/2015 | Ahn et al. |
| 2015/0053938 A1 | 2/2015 | Zeng et al. |
| 2015/0053939 A1 | 2/2015 | Adamovich et al. |
| 2015/0214489 A1 | 7/2015 | Parham et al. |
| 2015/0249221 A1 | 9/2015 | Zeng et al. |
| 2015/0266863 A1 | 9/2015 | Dyatkin et al. |
| 2016/0141505 A1 | 5/2016 | Park et al. |
| 2016/0149139 A1 | 5/2016 | Xia et al. |

FOREIGN PATENT DOCUMENTS

| | | |
|---|---|---|
| EP | 1156536 A2 | 11/2001 |
| EP | 1725079 | 11/2006 |
| EP | 2034538 | 3/2009 |
| JP | 2004022334 | 1/2004 |
| JP | 200511610 | 1/2005 |
| JP | 2007123392 | 5/2007 |
| JP | 2007254297 | 10/2007 |
| JP | 2008074939 | 4/2008 |
| JP | 2011-63584 | 3/2011 |
| JP | 2014125449 | 7/2014 |
| JP | 2015-134743 | 7/2015 |
| KR | 20120078301 | 7/2012 |
| KR | 20120129733 | 11/2012 |
| WO | 2001039234 | 5/2001 |
| WO | 2002002714 | 1/2002 |
| WO | 200215645 | 2/2002 |
| WO | 2003040257 | 5/2003 |
| WO | 2003060956 | 7/2003 |
| WO | 2004070787 A2 | 8/2004 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2011136755 A1 | 11/2011 |
| WO | WO 2012/023947 * | 2/2012 |
| WO | 2012/033061 | 3/2012 |
| WO | 2012/133644 | 10/2012 |
| WO | 2013/032297 | 3/2013 |
| WO | 2013/191177 | 12/2013 |
| WO | 2014/104515 | 7/2014 |
| WO | 2015/111848 | 7/2015 |

(56) References Cited

OTHER PUBLICATIONS

Notice of Reasons for Rejection dated Dec. 11, 2018 for corresponding Japanese Patent Application No. JP 2015-136658.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3 Date: 2007.

Baldo et al., Highly Efficient Phosphorescent Emission from Organic Electroluminescent Devices; Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al.; "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett, 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko,"1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett, 77(15):2280-2282 (2000).

Lo, Shih-Chun et al., "Blue Phosphorescence from Iridium(III) Complexes at Room Temperature," Chem. Mater., 18(21)5119-5129(2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120(37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91209-215 (1997).

Shirota, Yasuhiko et al., "Starburst Molecules Based on p-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 87:171-177 (1997).

Takizawa; Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater.; 17(8)1059-1064 (2005).

Van Slyke, S. A. et al., "Organic Electroluminescent Devices with Improved Stability," Appl. Phys. Lett., 69(15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

(56) References Cited

OTHER PUBLICATIONS

Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Applications No. 62/056,940, filed on Sep. 29, 2014, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to organic materials used in such devices. More specifically, the present invention relates to a novel evaporation source comprising a mixture of two organic compounds that allows stable co-evaporation of the two organic compounds in fabrication of various layers in phosphorescent organic light emitting devices (PHOLEDs).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

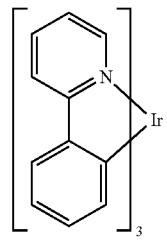

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

The present disclosure provides a first mixture containing three different compounds that is useful as a stable co-evaporation source material for a vacuum deposition tool. The first mixture comprises: a first compound; a second compound; and a third compound. The first compound, the second compound, and the third compound are all organic compounds and have different chemical structures from each other. The first compound, the second compound, and the third compound each has an evaporation temperature T1, T2, and T3, respectively, and is in the range of 150 to 350° C., wherein T1, T2, and T3 differ from each other by less than 20° C. The first compound has a concentration C1 in the first mixture and a concentration C2 in a film deposited by evaporating the first mixture in a high vacuum deposition tool with a chamber base pressure between $1\times10^{-6}$ Torr to $1\times10^{-9}$ Torr under a first deposition condition which is defined as depositing at a 2 Å/sec deposition rate onto a surface positioned at a predefined distance from the first mixture evaporation source, wherein $|(C1-C2)/C1|$ is less than 5%. The first compound has a concentration C1' in a second mixture of the first and second compounds or has a concentration C1" in a third mixture of the first and third compounds, and the first compound has a concentration C2' in a film formed by evaporating the second mixture under the first deposition condition or has a concentration C2" in a film formed by evaporating the third mixture under the first deposition condition, and at least one of $|(C1'-C2')/C1'|$ and $|(C1"-C2")/C1"|$ is greater than 5%.

According to an embodiment, a method of fabricating a first device is disclosed. The method comprises: providing a first container that contains a first mixture, the first mixture comprising: a first compound; a second compound; and a third compound, wherein the first compound, the second compound, and the third compound are all organic compounds and have different chemical structures from each other, wherein the first compound, the second compound, and the third compound each has an evaporation temperature T1, T2, and T3, respectively, and is in the range of 150 to 350° C., wherein the T1, T2, and T3 differ from each other by less than 20° C.; providing a substrate having a first electrode disposed thereon; depositing an organic layer over the first electrode by evaporating the first mixture in the first container in a high vacuum deposition tool under a first deposition condition which is defined as depositing at a 2 Å/sec deposition rate with a chamber base pressure between $1\times10^{-6}$ Torr to $1\times10^{-9}$ Torr onto a surface positioned at a predefined distance from the first mixture, wherein the first compound has a concentration C1 in the first mixture and a concentration C2 in the emissive layer and $|(C1-C2)/C1|$ is less than 5%; and depositing a second electrode over the emissive layer.

According to an embodiment of the present disclosure, a first device comprising a first organic light emitting device is also disclosed. The first organic light emitting device comprises: an anode; a cathode; and an organic layer, disposed between the anode and the cathode, comprising a mixture of a first compound, a second compound, and a third compound, wherein the first compound, the second compound, and the third compound are all organic compounds and have different chemical structures from each other, wherein the first compound, the second compound, and the third compound each has an evaporation temperature T1, T2, and T3, respectively, and is in the range of 150 to 350° C., wherein the T1, T2, and T3 differ from each other by less than 20° C., wherein the first compound has a concentration C1 in the first mixture and a concentration C2 in a film deposited by evaporating the first mixture in a high vacuum deposition tool under a first deposition condition which is defined as depositing at a 2 Å/sec deposition rate with a chamber base pressure between $1\times10^{-6}$ Torr to $1\times10^{-9}$ Torr onto a surface positioned at a predefined distance from the first mixture, wherein $|(C1-C2)/C1|$ is less than 5%, wherein the first compound has a concentration C1' in a second mixture of the first and second compounds or has a concentration C1" in a third mixture of the first and third compounds, and the first compound has a concentration C2' in a film formed by evaporating the second mixture under the first deposition condition or has a concentration C2" in a film formed by evaporating the third mixture under the first deposition condition, and wherein at least one of $|(C1'-C2')/C1'|$ and $|(C1"-C2")/C1"|$ is greater than 5%.

In fabricating OLEDs, the disclosed first mixture can be deposited as a thin film by thermal vapor deposition where the first mixture is used as a single-source co-evaporation material. This allows for a simpler OLED device fabrication process.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
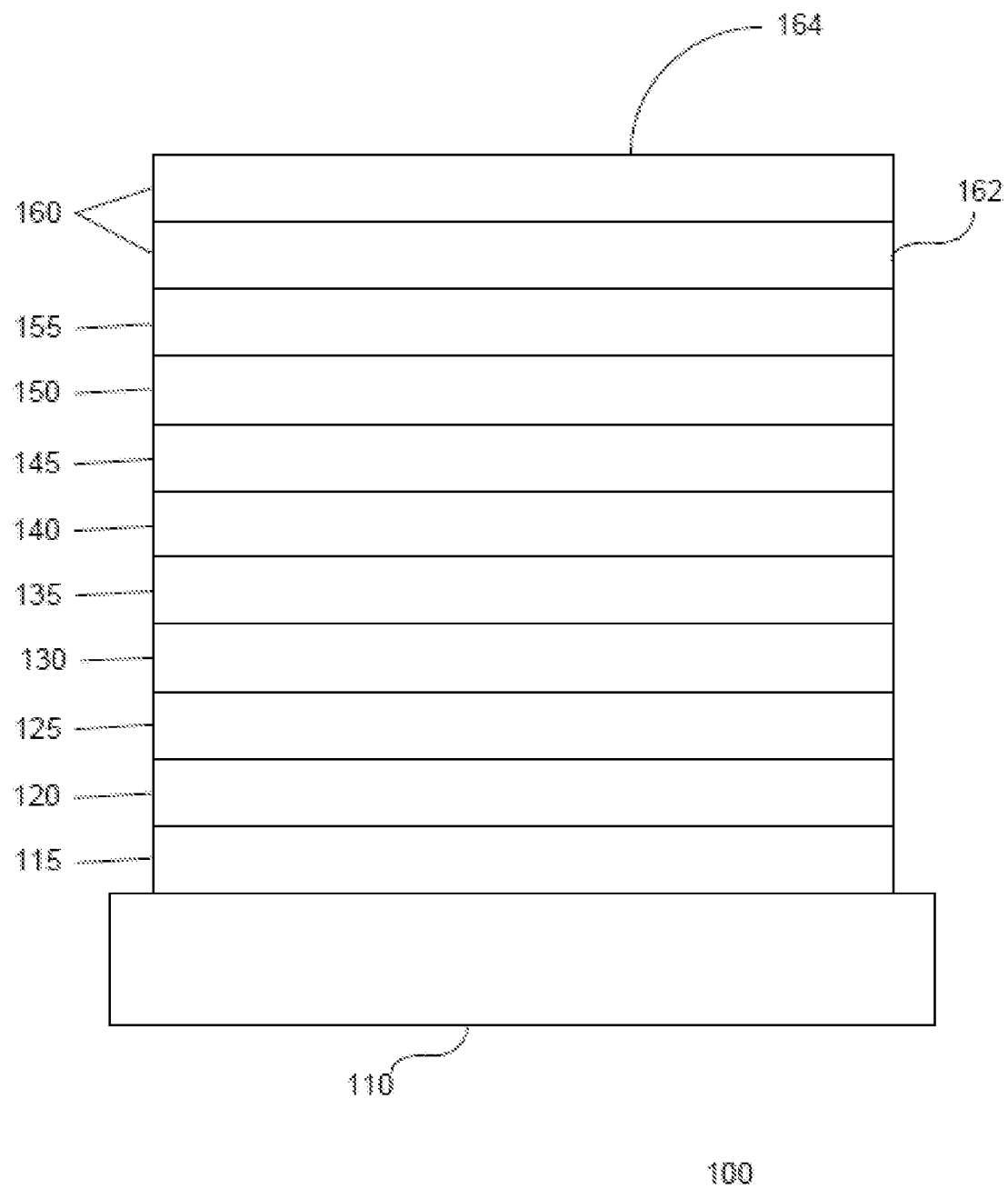
FIG. 1 shows an organic light emitting device that can incorporate the inventive host material disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
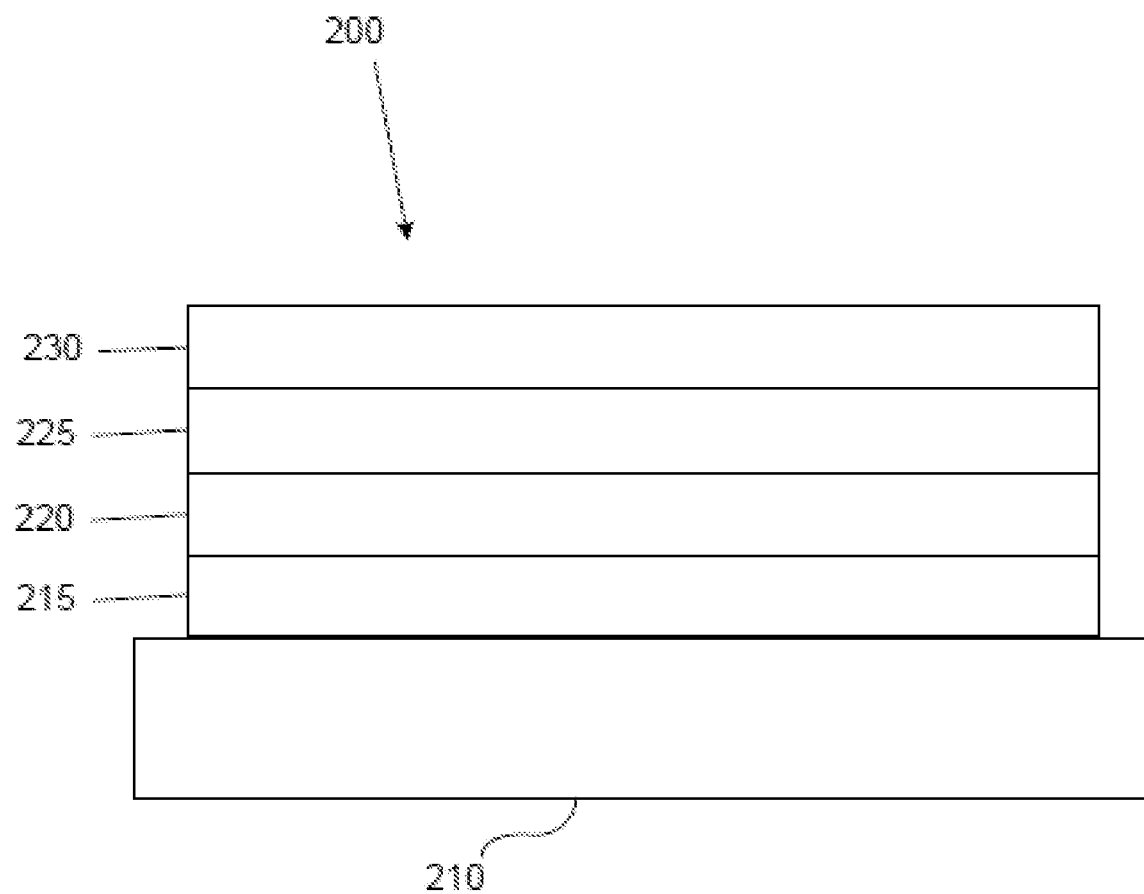
FIG. 2 shows an inverted organic light emitting device that can incorporate the inventive host material disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.), but could be used outside this temperature range, for example, from −40° C. to +80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also refer to heteroaryl. Preferred hetero-non-aromatic cyclic groups are those containing 3 or 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

Often, the emissive layer (EML) of OLED devices exhibiting good lifetime and efficiency requires more than two components (e.g. 3 or 4 components). For example, an OLED emissive layer can require a hole-transporting co-host (h-host), an electron-transporting co-host (e-host), and an emissive dopant. For this purpose, 3 or 4 source materials are required to fabricate such an EML, which is very complicated and costly compared to a standard two-component EML with a single host and an emitter, which requires only two sources. Conventionally, in order to fabricate such EML requiring two or more components, a separate evaporation source for each component is required. Because the relative concentrations of the components of the EML is important for the device performance, the rate of deposition of each component is measured individually during the deposition in order to monitor the relative concentrations. This makes the fabrication process complicated and costly. Thus, it is desirable to premix the materials for the two or more components and evaporate them from a single source in order to reduce the complexity of the fabrication process.

However, the co-evaporation must be stable, i.e. the composition of the deposited film should remain constant throughout the manufacturing process, as any composition change may affect the device performance adversely. In order to obtain a stable co-evaporation from a mixture of compounds under vacuum, one would assume that the materials must have the same evaporation temperature under the same condition.

However, this may not be the only parameter one has to consider. When the two or more compounds are mixed together, they may interact with each other and their evaporation properties may differ from their individual properties. On the other hand, materials with slightly different evaporation temperatures may form a stable co-evaporation mixture. Therefore, it is extremely difficult to achieve a stable co-evaporation mixture. "Evaporation temperature" of a material is measured in a high vacuum deposition tool with a chamber base pressure, between $1\times10^{-6}$ Torr to $1\times10^{-9}$ Torr, at a 2 Å/sec deposition rate on a surface positioned at a set distance away from the evaporation source of the material being evaporated, e.g. sublimation crucible in a VTE tool. The various measured values such as temperature, pressure, deposition rate, etc. disclosed herein are expected to have nominal variations because of the expected tolerances in the measurements that produced these quantitative values as understood by one of ordinary skill in the art.

This disclosure describes a novel mixture of two or more organic compounds, particularly a mixture of three compounds, that can be used as a stable co-evaporation source in vacuum deposition processes. Many factors other than temperatures can contribute to the evaporation, such as miscibility of different materials, different phase transition. The inventors found that when two or more materials have similar evaporation temperature, and similar mass loss rate or similar vapor pressure, the two or more materials can co-evaporate consistently. Mass loss rate is defined as percentage of mass lost over time (minute) and is determined by measuring the time it takes to lose the first 10% of the mass as measured by thermal gravity analysis (TGA) under same experimental condition at a same constant given temperature for each compound after the composition reach a steady evaporation state. The constant given temperature is one temperature point that is chosen so that the value of mass loss rate is between about 0.05 to 0.50 percentage/min. Skilled person in this field should appreciate that in order to compare two parameters, the experimental condition should be consistent. The method of measuring mass loss rate and vapor pressure is well known in the art and can be found, for example, in Bull. et al. Mater. Sci. 2011, 34, 7.

Searching for a high-performance mixture for stable single-source co-evaporation could be a tedious process. A process of searching for a stable mixture would include identifying compounds with similar evaporation temperatures and monitoring the composition of the evaporated mixture. It is often the case that the mixture materials show slight separation as evaporation goes on. Adjusting the evaporation temperature by changing the chemical structure often, unfortunately, lead to much reduced device performance due to the change in chemical, electrical and/or optical properties. Chemical structure modifications also impact the evaporation temperature much more significantly than needed, resulting in unstable mixtures.

To address these difficulties, the present disclosure describes a method where a mixture of three compounds is used as a single source for evaporation. We envision two scenarios as detailed below.

In one scenario, two of the three component compounds have their concentrations changing in the opposite directions during evaporation, i.e. the concentration of the first component increases while the second component decreases, but the overall concentration of these two components, and consequently, the concentration of the third component, remain constant. Therefore, the constant overall concentration of the first two components together with the constant concentration of the third component are expected to ensure that the device performance remain unchanged throughout the manufacturing process. For an EML requiring h-host, e-host and dopant, the first two components with changing concentrations could be two h-hosts, two e-hosts or two dopants.

In another scenario, the introduction of the third component compound assists the co-evaporation of the first and the second components. This third component could be called a carrier compound or co-evaporation assisting compound. Some of the mechanisms to realize this co-evaporation are intermolecular interaction between the first and second components by, for instance, van der Waals force, electrostatic force, hydrogen bond, chemical bond. An analogy in nature is the oil-water-surfactant system, where surfactant as the third component greatly facilitates the intermixing between oil and water. The third component is also an essential component for EML, and could be an h-host, an e-host or a dopant.

According to an embodiment, a first mixture useful as a stable single-source co-evaporation mixture of three compounds is disclosed. The first mixture comprises: a first compound; a second compound; and a third compound, wherein the first compound, the second compound, and the third compound are all organic compounds and have different chemical structures from each other, wherein the first compound, the second compound, and the third compound each has an evaporation temperature T1, T2, and T3, respectively, and is in the range of 150 to 350° C., wherein the T1, T2, and T3 differ from each other by less than 20° C.

Furthermore, the first compound has a concentration C1 in the first mixture and a concentration C2 in a film deposited by evaporating the first mixture in a high vacuum deposition tool under a first deposition condition which is defined as depositing at a 2 Å/sec deposition rate with a chamber base pressure between $1\times10^{-6}$ Torr to $1\times10^{-9}$ Torr onto a surface positioned at a predefined distance from the first mixture. The absolute value of (C1−C2)/C1, represented herein as |(C1−C2)/C1|, is less than 5%, the first compound has a concentration C1' in a second mixture of the first and second compounds or has a concentration C1" in a third mixture of the first and third compounds, and the first compound has a concentration C2' in a film formed by evaporating the second mixture under the first deposition condition or has a concentration C2" in a film formed by evaporating the third mixture under the first deposition condition, and at least one of |(C1'−C2')/C1'| and |(C1"−C2")/C1"| is greater than 5%.

In some embodiments of the disclosed mixture, both of |(C1'−C2')/C1'| and |(C"−C2")/C1"| are larger than 5%.

In a preferred embodiment, |(C1−C2)/C1| is less than 3%.

One of ordinary skill in this field should realize that the concentration of each component is expressed as a relative percentage. The concentration of each component in the mixture can be measured by suitable analytical methods such as high pressure liquid chromatography (HPLC) and nuclear magnetic resonance spectroscopy (NMR).

The inventors used HPLC and the percentage was calculated by dividing the integration area under the HPLC trace of each component by the total integration area. HPLC can use different detectors such as UV-vis, photo diode array detector, refractive index detector, fluorescence detector, and light scattering detector. Due to different materials properties, each component in the mixture may respond differently. Therefore, the measured concentration may differ from their real concentration in the mixture, however the relative ratio value of (C1−C2)/C1 is independent of these variables as long as the experimental condition is kept consistent, for example, all concentrations should be calculated under the exact same HPLC parameters for each component. It is sometimes preferred to select a measurement condition that gives calculated concentration close to the real concentration. However, it is not necessary. It is important to select a detecting condition that accurately detects each component. For example, fluorescence detector should not be used if one of the components does not fluoresce.

In another embodiment of the mixture disclosed herein, T1, T2, and T3 are in the range of 200 to 350° C.

In another embodiment, the second compound has a concentration C3 in the first mixture, and the second compound has a concentration C4 in a film formed by evaporating the first mixture under the first condition, wherein |(C3-C4)/C3| is less than 5%.

In other embodiments, the first compound, the second compound, and the third compound are each independently selected from the group consisting of a h-host, an e-host, and an emitter. The emitter can be a phosphorescent emitter or a fluorescent emitter.

The e-host material can be selected from the group consisting of a compound having a structure of

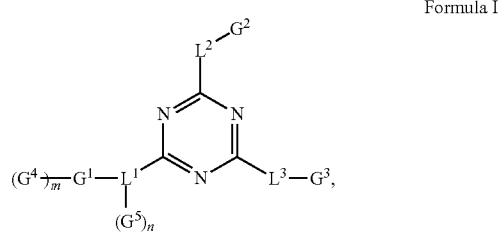

Formula I and a compound having a structure of

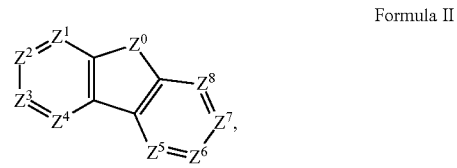

Formula II wherein $G^1$ is selected from the group consisting of dibenzofuran, dibenzothiophene, dibenzoselenophene, and fluorene;

wherein $L^1$, $L^2$ and $L^3$ are each independently selected from the group consisting of direct bond, phenyl, biphenyl, terphenyl, pyridine, pyrimidine, and combinations thereof;

wherein $G^4$ is selected from the group consisting of phenyl, biphenyl, terphenyl, naphthalene, phenanthrene, pyridine, pyrimidine, pyrazine, quinoline, isoquinoline, phenanthroline, fluorene, and combinations thereof;

wherein $G^2$, $G^3$, and $G^5$ are each independently selected from the group consisting of phenyl, biphenyl, terphenyl, fluorene, naphthalene, phenanthrene, pyridine, pyrimidine, pyrazine, quinoline, isoquinoline, phenanthroline, aza-fluorene, and combinations thereof;

wherein $G^2$, $G^3$, $G^4$, and $G^5$ are each optionally further substituted with one or more unfused substituents selected from the group consisting of deuterium, alkyl, alkoxyl, cycloalkyl, cycloalkoxyl, halogen, nitro, nitrite, silyl, phenyl, biphenyl, terphenyl, pyridine, and combinations thereof;

wherein m is an integer from 0 to 7,
wherein n is an integer from 0 to 4;
wherein, when m or n is larger than 1, each $G^4$ or $G^5$ can be same or different;
wherein when n is 0, m is equal to or greater than 1, and each $G^4$ is selected from the group consisting of phenyl, and biphenyl;
wherein when n is equal to or greater than 1, $L^1$ is not a direct bond;
wherein when m and n are both 0, $L^1$ is biphenyl;

wherein when $G^4$ is present and is fluorene, $L^1$ is not a direct bond;
wherein $Z^0$ is selected from the group consisting of O, S, Se, $NR^1$ and $CR^2R^3$;
wherein $Z^1$ to $Z^8$ are each independently selected from the group consisting of N and $CR^4$, and at least one of $Z^1$ to $Z^8$ is N; and
wherein $R^1$, $R^2$, $R^3$ and $R^4$ are each independently selected from the group consisting of hydrogen, deuterium, alkyl, alkoxyl, cycloalkyl, cycloalkoxyl, halogen, nitro, nitrile, silyl, aryl, heteraryl and combinations thereof.

In some embodiments, the e-host is selected from the group consisting of:

Compound A1 through A3, each represented by the formula

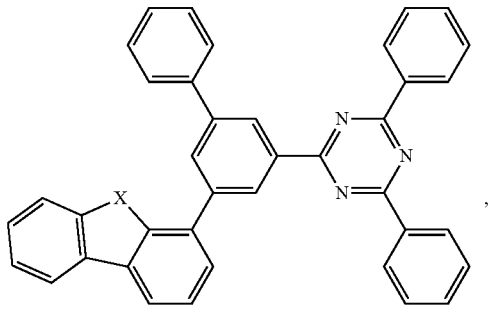

wherein in Compound A1: X = O,
in Compound A2: X = S,
in Compound A3: X = Se

Compound A4 through A6, each represented by the formula

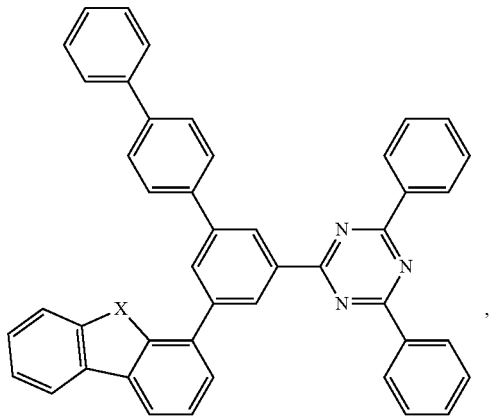

wherein in Compound A4: X = O,
in Compound A5: X = S,
in Compound A6: X = Se

Compound A7 through A9, each represented by the formula

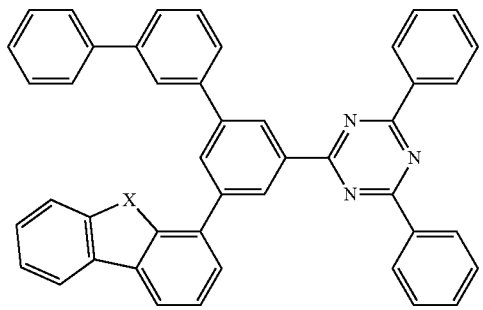

wherein in Compound A7: X = O,
in Compound A8: X = S,
in Compound A9: X = Se

Compound A10 through A12, each represented by the formula

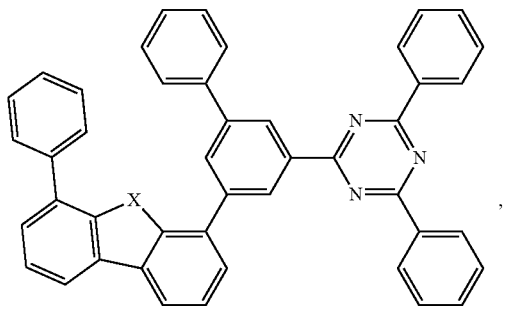

wherein in Compound A10: X = O,
in Compound A11: X = S,
in Compound A12: X = Se

Compound A13 through A15, each represented by the formula

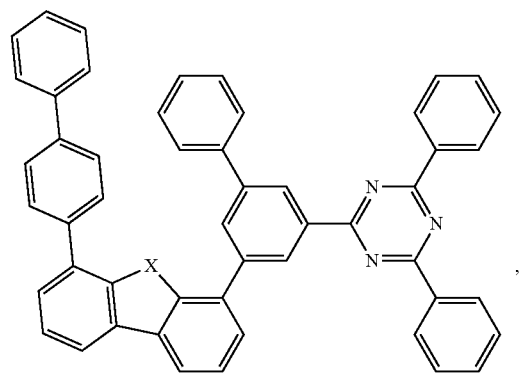

wherein in Compound A13: X = O,
in Compound A14: X = S,
in Compound A15: X = Se

Compound A16 through A18, each represented by the formula

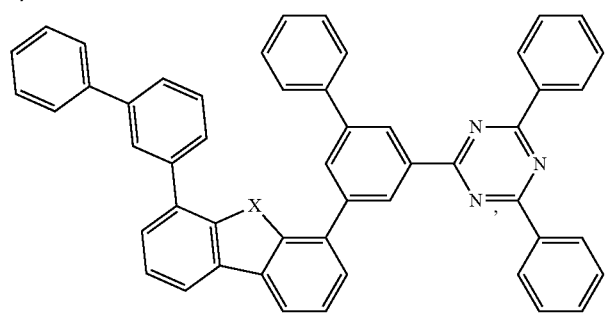

wherein in Compound A16: X = O,
in Compound A17: X = S,
in Compound A18: X = Se

Compound A19 through A21, each represented by the formula

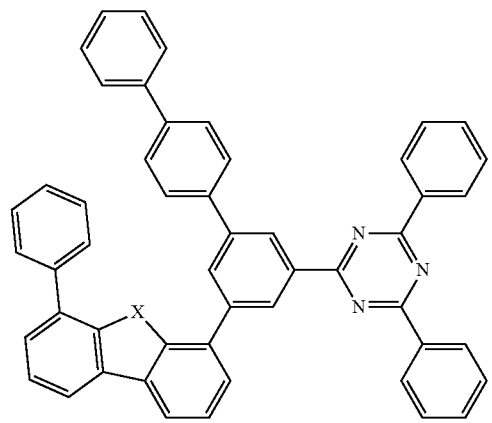

wherein in Compound A19: X = O,
in Compound A20: X = S,
in Compound A21: X = Se

Compound A22 through A24, each represented by the formula

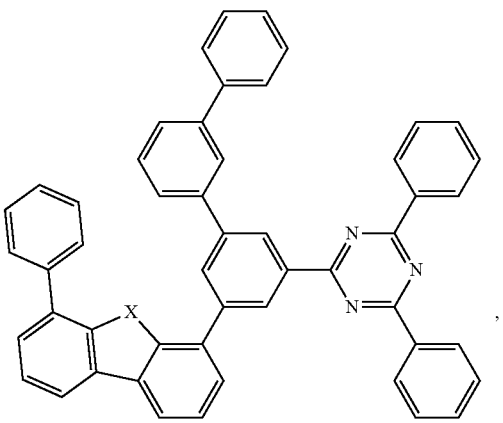

wherein in Compound A22: X = O,
in Compound A23: X = S,
in Compound A24: X = Se

Compound A25 through A27, each represented by the formula

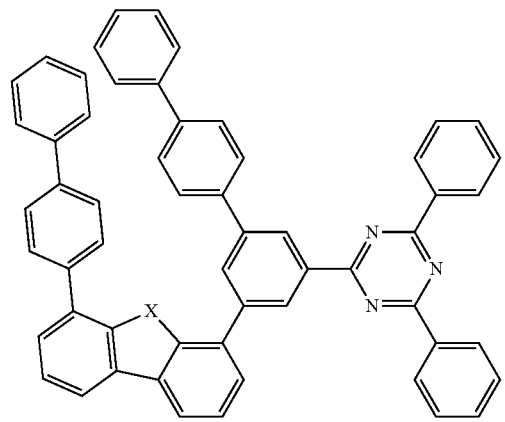

wherein in Compound A25: X = O,
in Compound A26: X = S,
in Compound A27: X = Se

Compound A28 through A30, each represented by the formula

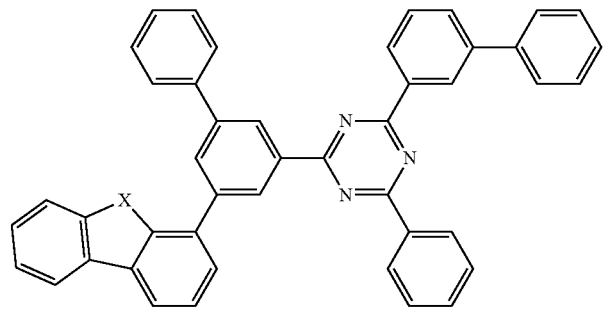

wherein in Compound A28: X = O,
in Compound A29: X = S,
in Compound A30: X = Se

Compound A31 through A33, each represented by the formula

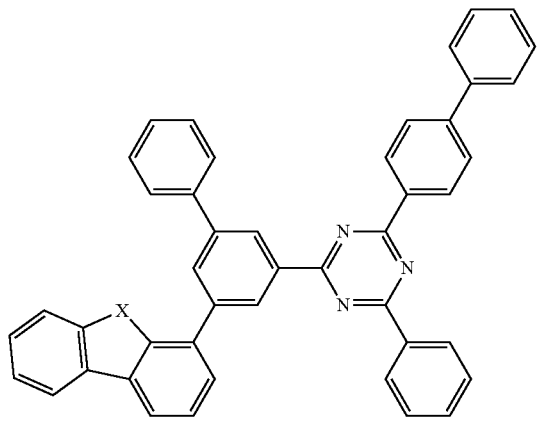

wherein in Compound A31: X = O,
in Compound A32: X = S,
in Compound A33: X = Se

Compound A34 through A36, each represented by the formula

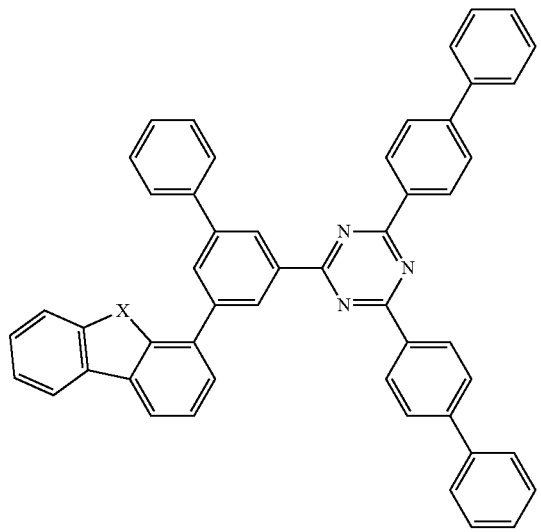

wherein in Compound A34: X = O,
in Compound A35: X = S,
in Compound A36: X = Se

Compound A37 through A39, each represented by the formula

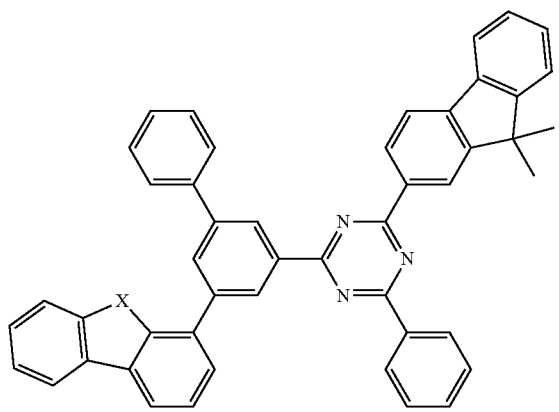

wherein in Compound A37: X = O,
in Compound A38: X = S,
in Compound A39: X = Se

Compound A40 through A42, each represented by the formula

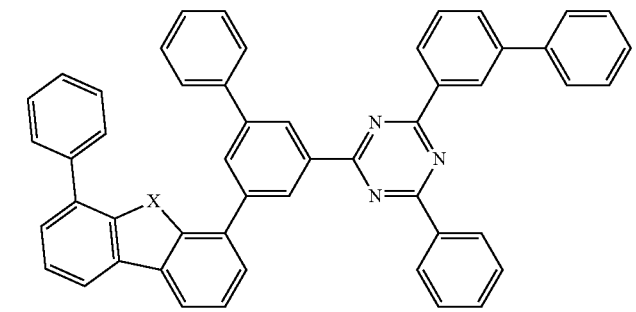

wherein in Compound A40: X = O,
in Compound A41: X = S,
in Compound A42: X = Se

Compound A43 through A45, each represented by the formula

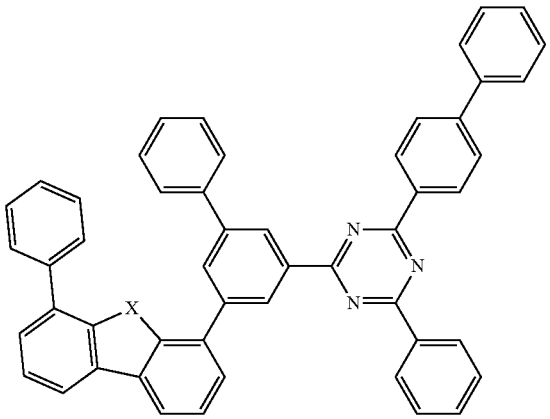

wherein in Compound A43: X = O,
in Compound A44: X = S,
in Compound A45: X = Se

Compound A46 through A48, each represented by the formula

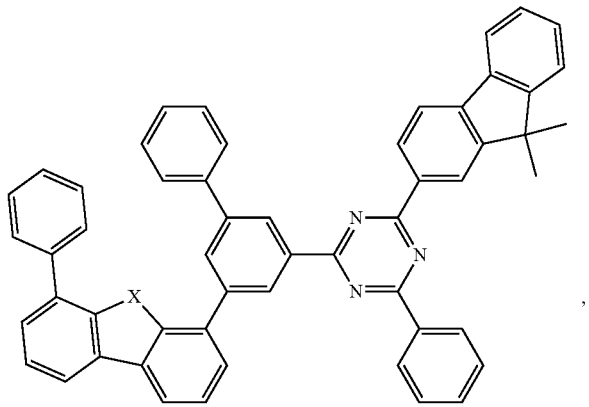

wherein in Compound A46: X = O,
in Compound A47: X = S,
in Compound A48: X = Se

Compound A49 through A51, each represented by the formula

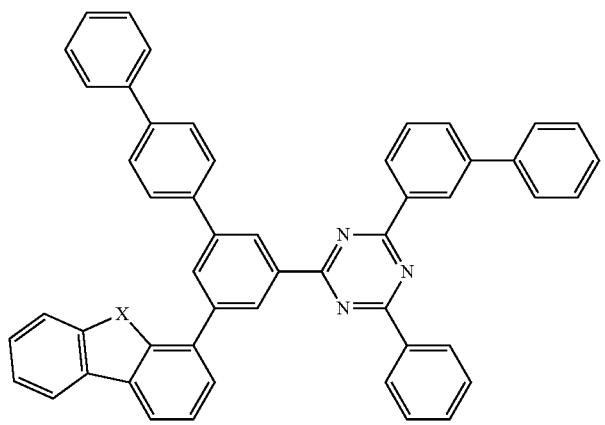

wherein in Compound A49: X = O,
in Compound A50: X = S,
in Compound A51: X = Se

Compound A52 through A54, each represented by the formula

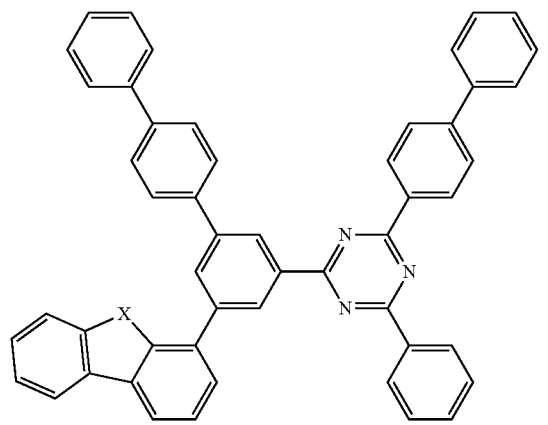

wherein in Compound A52: X = O,
in Compound A53: X = S,
in Compound A54: X = Se

Compound A55 through A57, each represented by the formula

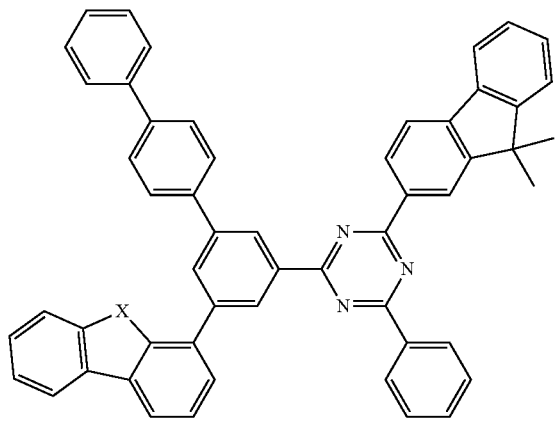

wherein in Compound A55: X = O,
in Compound A56: X = S,
in Compound A57: X = Se

Compound A58 through A60, each represented by the formula

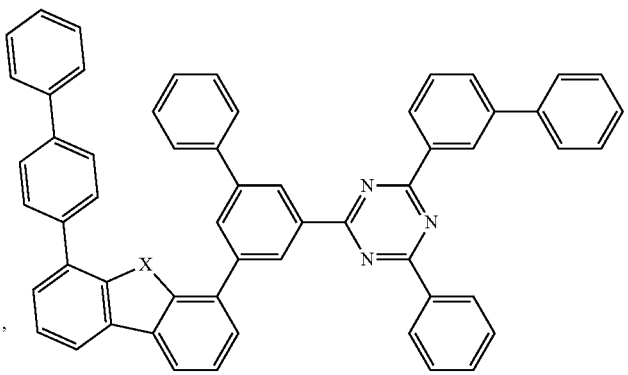

wherein in Compound A58: X = O,
in Compound A59: X = S,
in Compound A60: X = Se

Compound A61 through A63, each represented by the formula

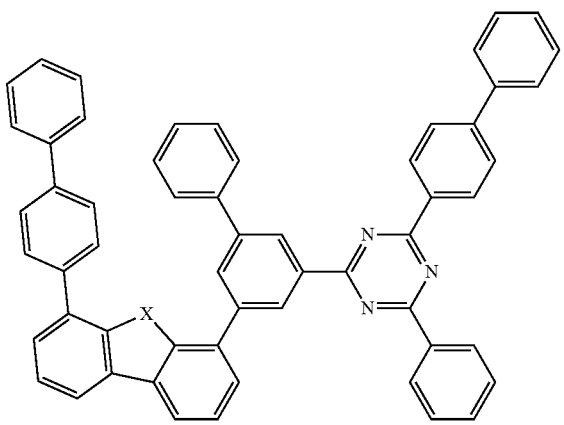

wherein in Compound A61: X = O,
in Compound A62: X = S,
in Compound A63: X = Se

Compound A64 through A66, each represented by the formula

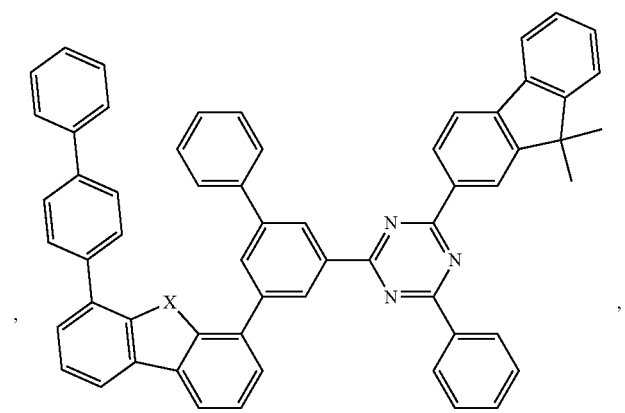

wherein in Compound A64: X = O,
in Compound A65: X = S,
in Compound A66: X = Se

Compound A67 through A69, each represented by the formula

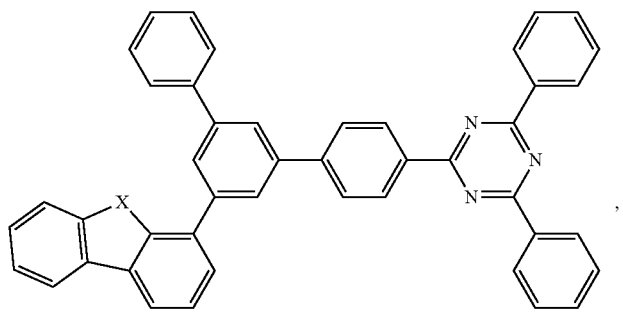

wherein in Compound A67: X = O,
in Compound A68: X = S,
in Compound A69: X = Se

Compound A70 through A72, each represented by the formula

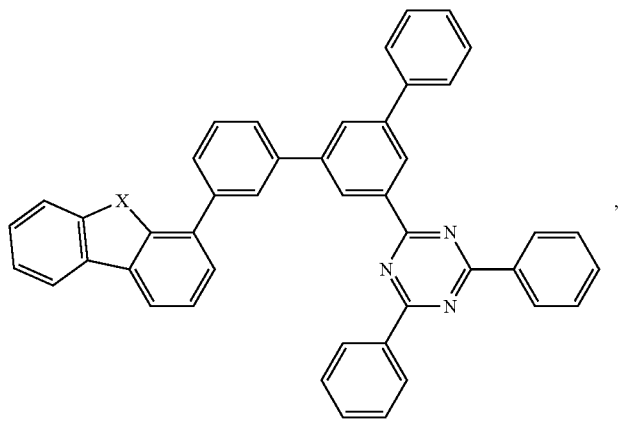

wherein in Compound A70: X = O,
in Compound A71: X = S,
in Compound A72: X = Se

Compound A73 through A75, each represented by the formula

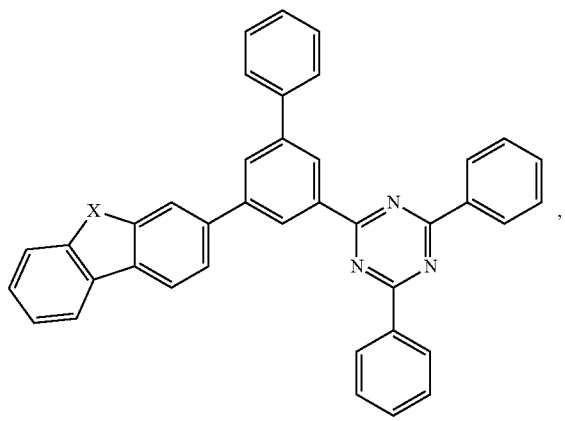

wherein Compound A73: X = O,
in Compound A74: X = S,
in Compound A75: X = Se

Compound A76 through A78, each represented by the formula

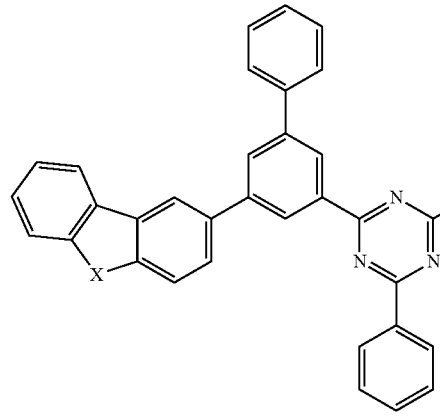

wherein Compound A76: X = O,
in Compound A77: X = S,
in Compound A78: X = Se

Compound A79 through A81, each represented by the formula

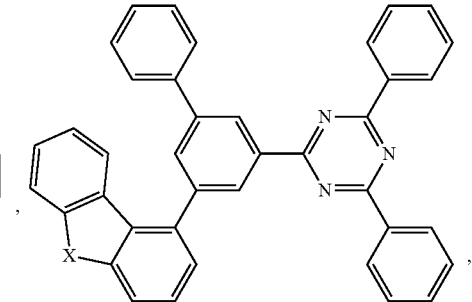

wherein in Compound A79: X = O,
in Compound A80: X = S,
in Compound A81: X = Se

Compound A82 through A84, each represented by the formula

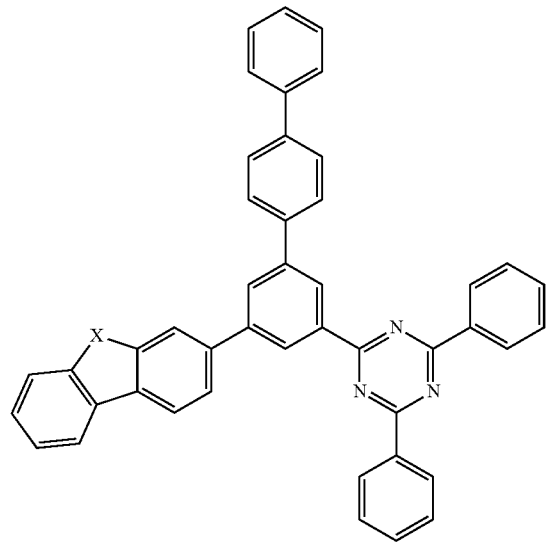

wherein in Compound A82: X = O,
in Compound A83: X = S,
in Compound A84: X = Se

Compound A85 through A87, each represented by the formula

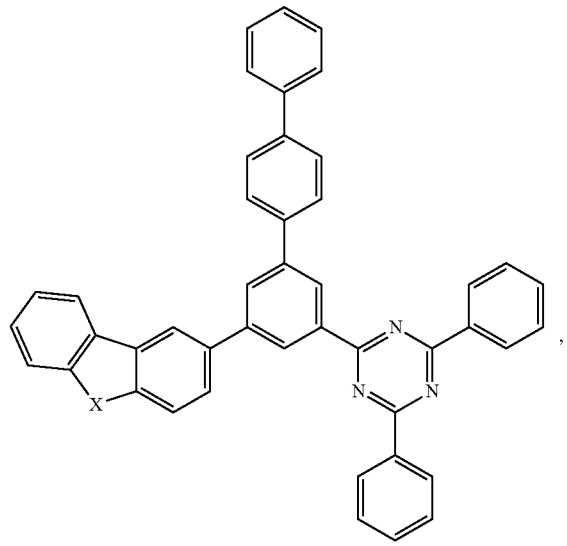

wherein in Compound A85: X = O,
in Compound A86: X = S,
in Compound A87: X = Se

Compound A88 through A90, each represented by the formula

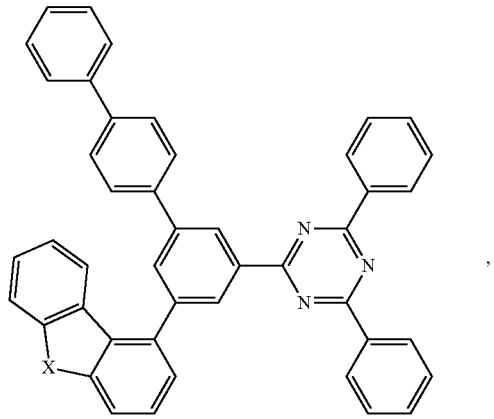

wherein in Compound A88: X = O,
in Compound A89: X = S,
in Compound A90: X = Se

Compound A91 through A93, each represented by the formula

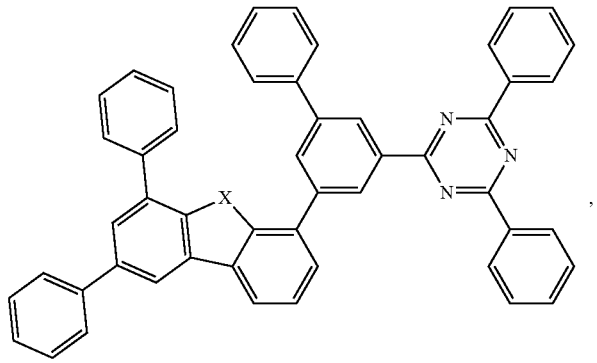

wherein Compound A91: X = O,
in Compound A92: X = S,
in Compound A93: X = Se

Compound A94 through A96, each represented by the formula

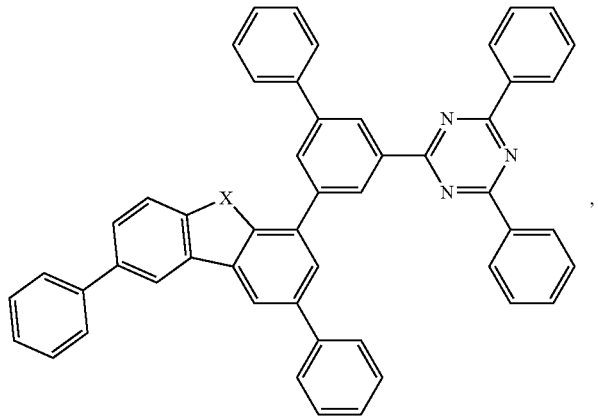

wherein Compound A94: X = O,
in Compound A95: X = S,
in Compound A96: X = Se

Compound A97 through A99, each represented by the formula

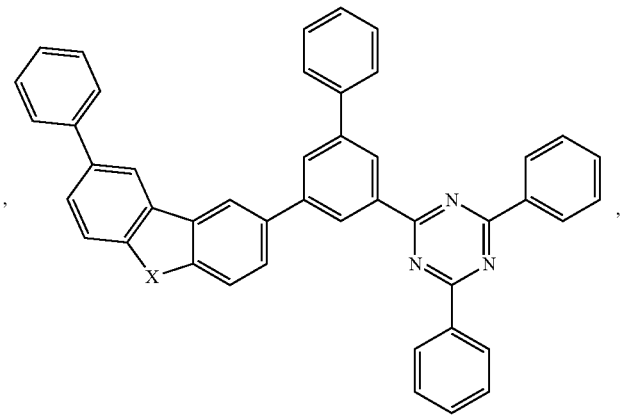

wherein in Compound A97: X = O,
in Compound A98: X = S,
in Compound A99: X = Se

Compound A100 through A102, each represented by the formula

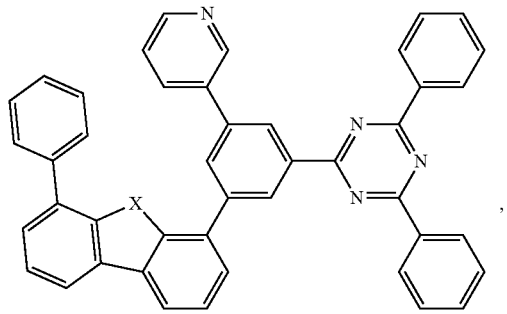

wherein in Compound A100: X = O,
in Compound A101: X = S,
in Compound A102: X = Se Compound A103 through A105, each represented by the formula

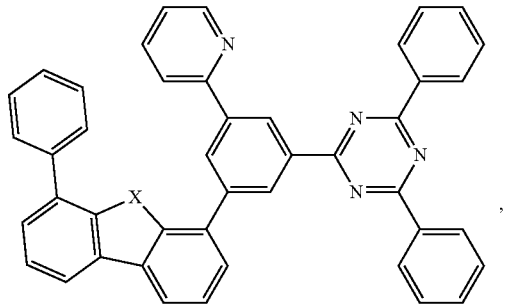

wherein in Compound A103: X = O,
in Compound A104: X = S,
in Compound A105: X = Se Compound A106 through A108, each represented by the formula

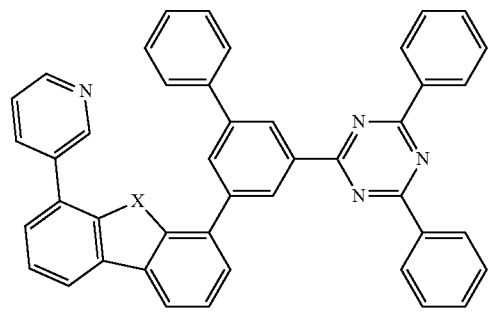

wherein in Compound A106: X = O,
in Compound A107: X = S,
in Compound A108: X = Se Compound A109 through A111, each represented by the formula

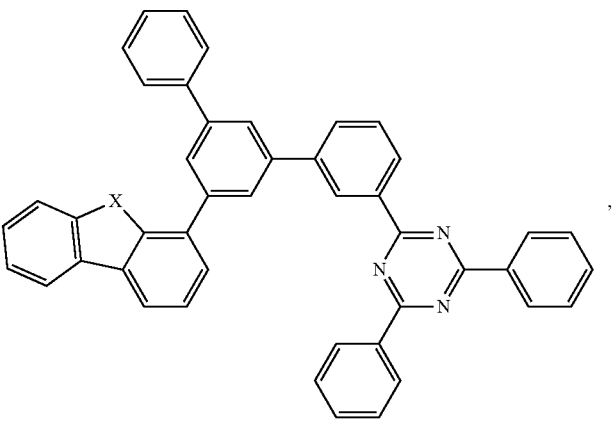

wherein in Compound A109: X = O,
in Compound A110: X = S,
in Compound A111: X = Se Compound A112 through A114, each represented by the formula

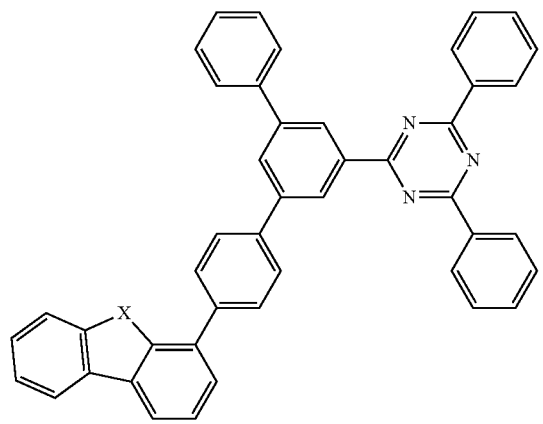

wherein in Compound A112: X = O,
in Compound A113: X = S,
in Compound A114: X = Se Compound A115 through A117, each represented by the formula

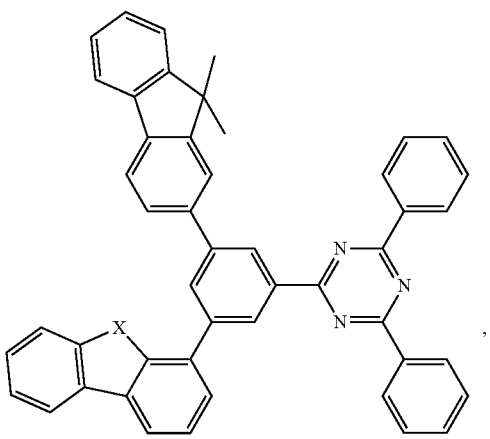

wherein in Compound A115: X = O,
in Compound A116: X = S,
in Compound A117: X = Se

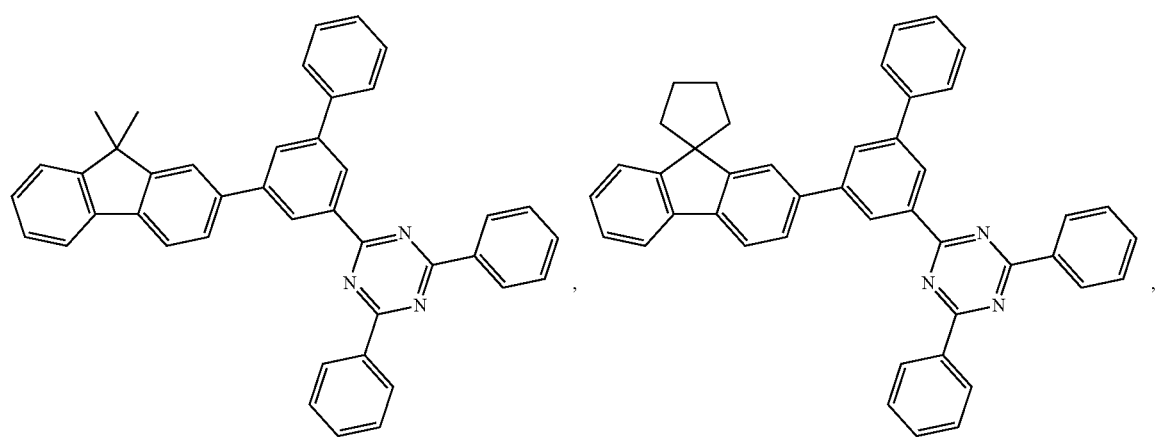

Compound B1

Compound B2

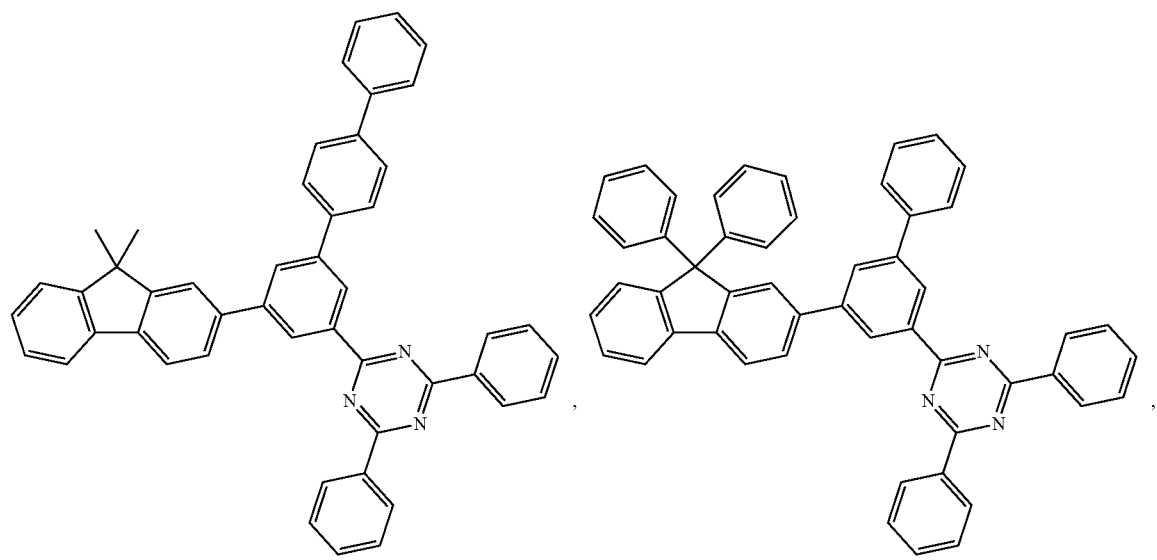
Compound B3, Compound B4
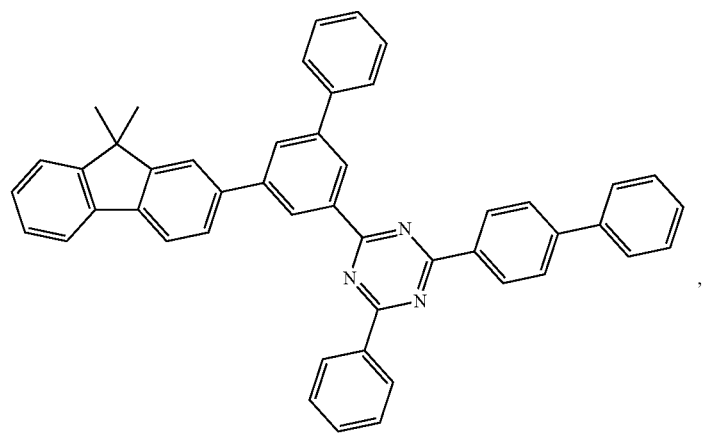
Compound B5
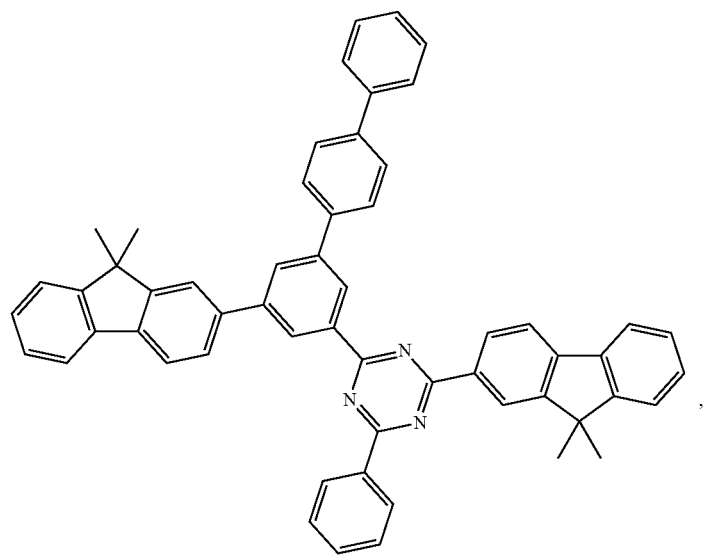
Compound B6

-continued

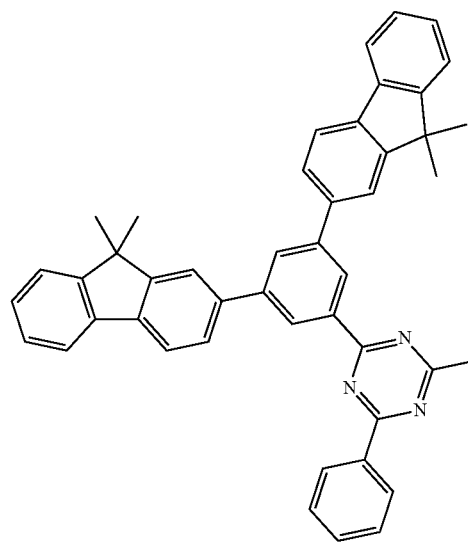

Compound B7

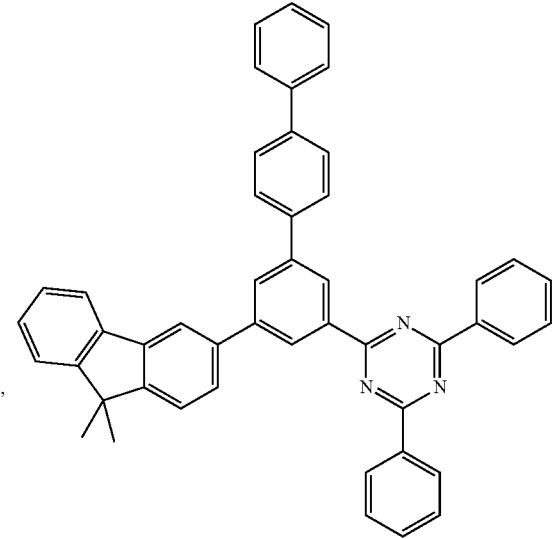

Compound B8

Compound C1 through C3, each represented by the formula

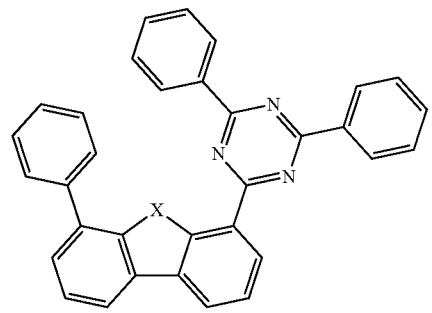

wherein Compound C1: X = O,
in Compound C2: X = S,
in Compound C3: X = Se

Compound C4 through C6, each represented by the formula

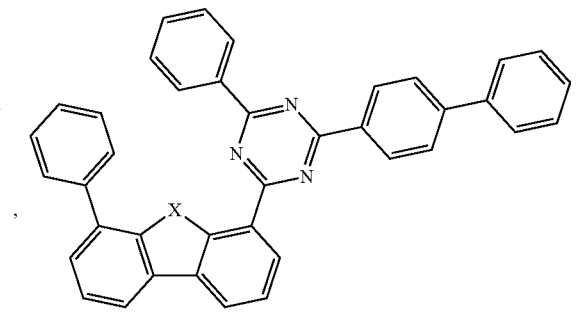

wherein Compound C4: X = O,
in Compound C5: X = S,
in Compound C6: X = Se

Compound C7 through C9, each represented by the formula

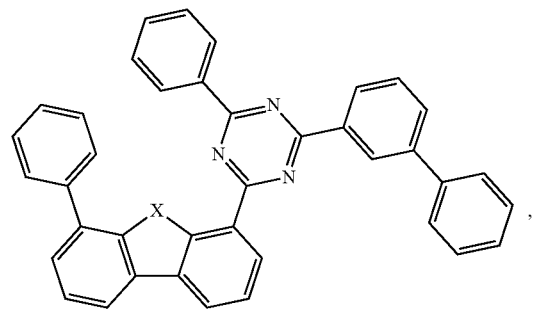

wherein Compound C7: X = O,
in Compound C8: X = S,
in Compound C9: X = Se

Compound C10 through C12, each represented by the formula

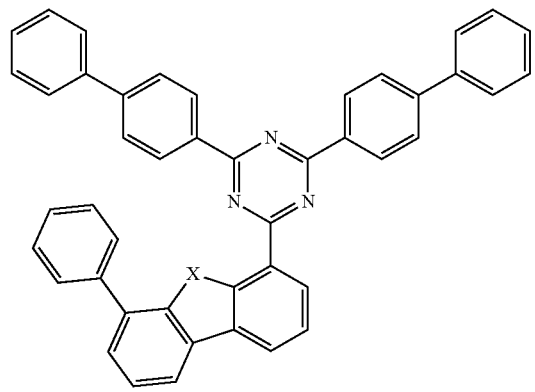

wherein Compound C10: X = O,
in Compound C11: X = S,
in Compound C12: X = Se

Compound C13 through C15, each represented by the formula

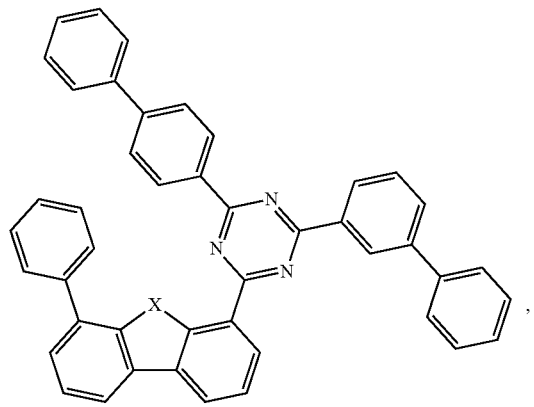

wherein Compound C13: X = O,
in Compound C14: X = S,
in Compound C15: X = Se

Compound C16 through C18, each represented by the formula

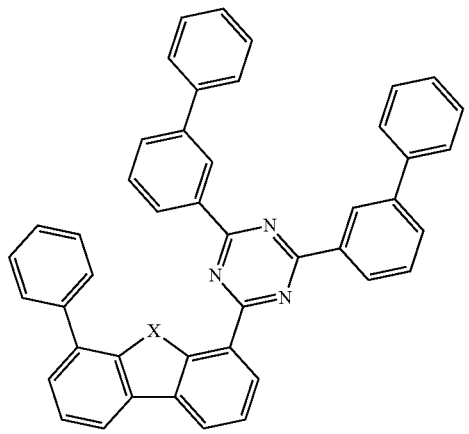

wherein Compound C16: X = O,
in Compound C17: X = S,
in Compound C18: X = Se

Compound C19 through C21, each represented by the formula

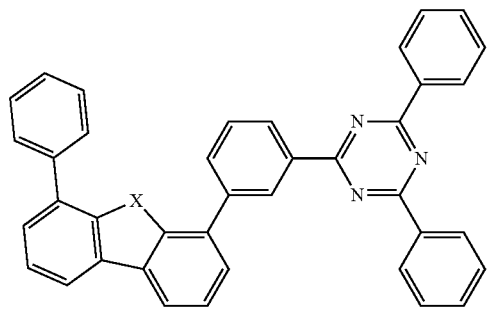

wherein in Compound C19: X = O,
in Compound C20: X = S,
in Compound C21: X = Se

Compound C22 through C24, each represented by the formula

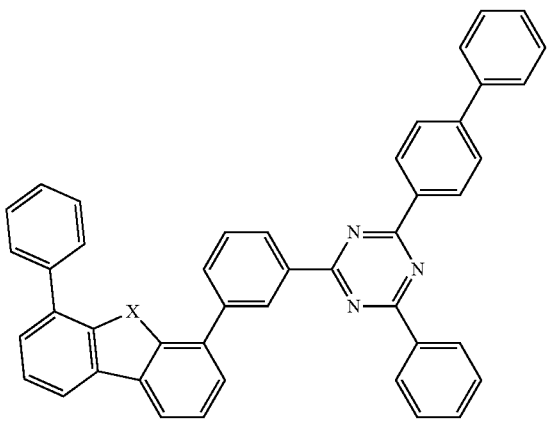

wherein in Compound C22: X = O,
in Compound C23: X = S,
in Compound C24: X = Se

Compound C25 through C27, each represented by the formula

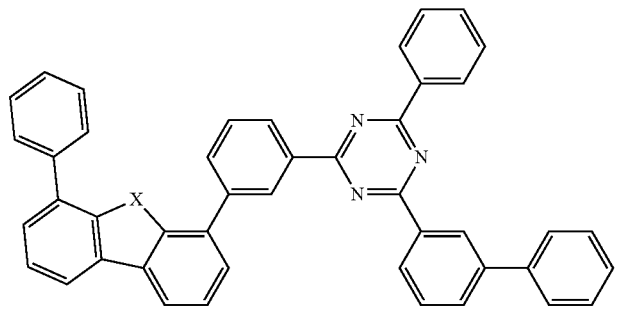

wherein in Compound C25: X = O,
in Compound C26: X = S,
in Compound C27: X = Se

Compound C28 through C30, each represented by the formula

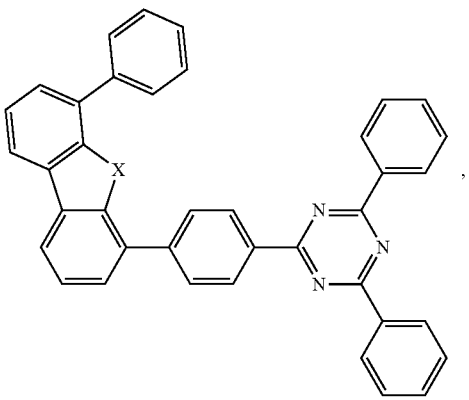

wherein in Compound C28: X = O,
in Compound C29: X = S,
in Compound C30: X = Se

Compound C31 through C33, each represented by the formula

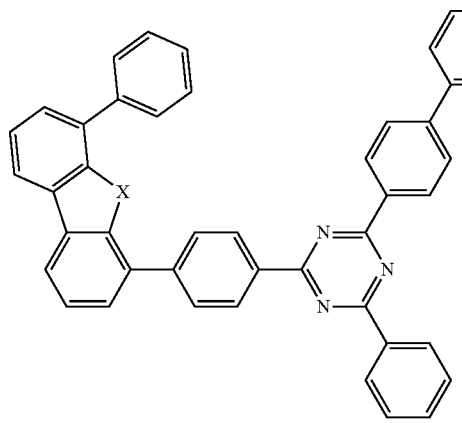

wherein in Compound C31: X = O,
in Compound C32: X = S,
in Compound C33: X = Se

Compound C34 through C36, each represented by the formula

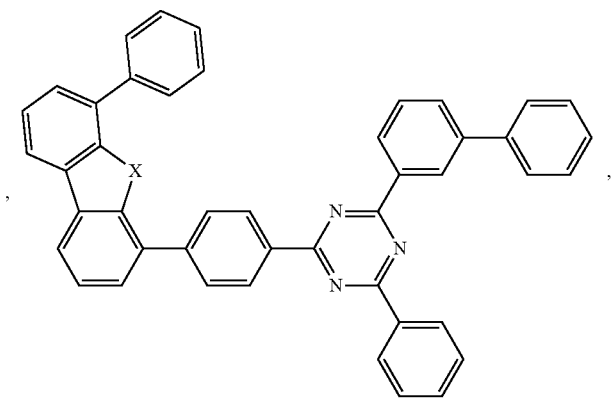

wherein in Compound C34: X = O,
in Compound C35: X = S,
in Compound C36: X = Se

Compound C37 through C39, each represented by the formula

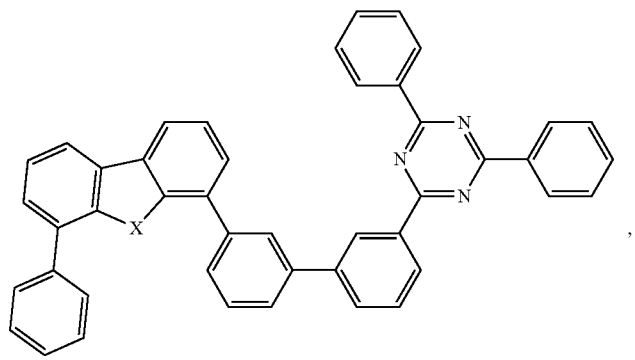

wherein in Compound C37: X = O,
in Compound C38: X = S,
in Compound C39: X = Se

Compound C40 through C42, each represented by the formula

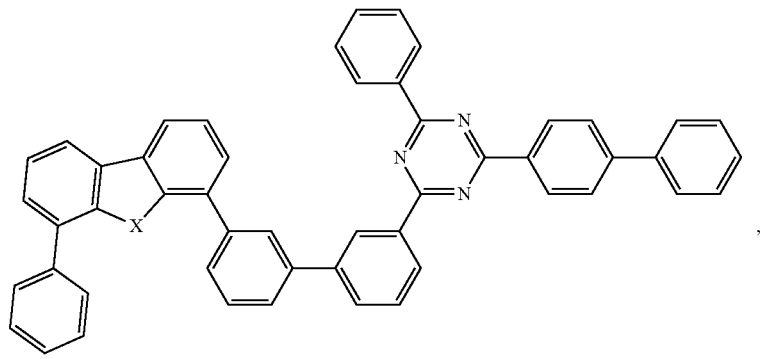

wherein in Compound C40: X = O,
in Compound C41: X = S,
in Compound C42: X = Se

Compound C43 through C45, each represented by the formula
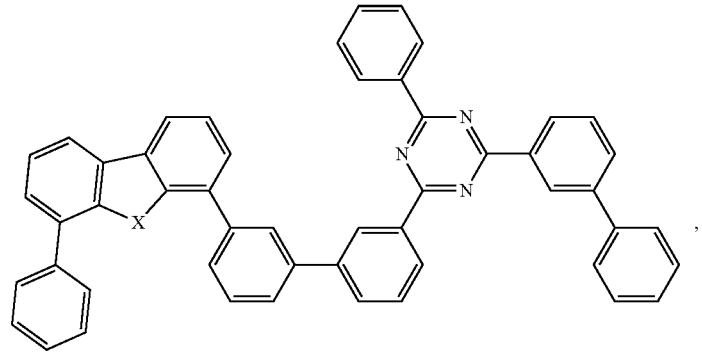
wherein in Compound C43: X = O,
in Compound C44: X = S,
in Compound C45: X = Se
Compound C46 through C48, each represented by the formula
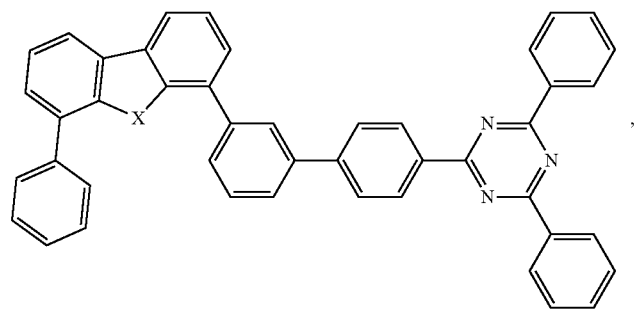
wherein in Compound C46: X = O,
in Compound C47: X = S,
in Compound C48: X = Se
Compound C49 through C51, each represented by the formula
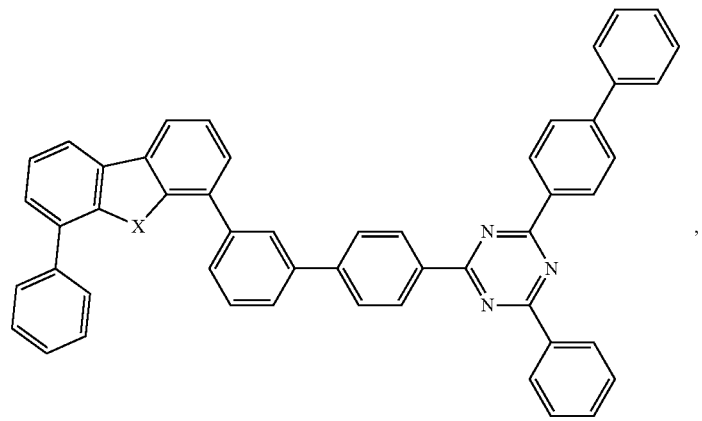
wherein in Compound C49: X = O,
in Compound C50: X = S,
in Compound C51: X = Se Compound C52 through C54, each represented by the formula

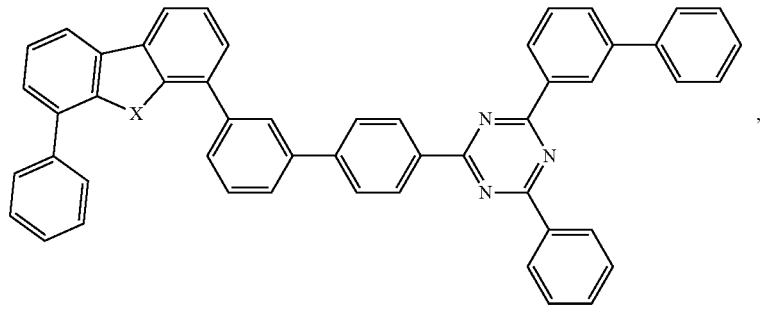

wherein in Compound C52: X = O,
in Compound C53: X = S,
in Compound C54: X = Se

Compound C55 through C57, each represented by the formula

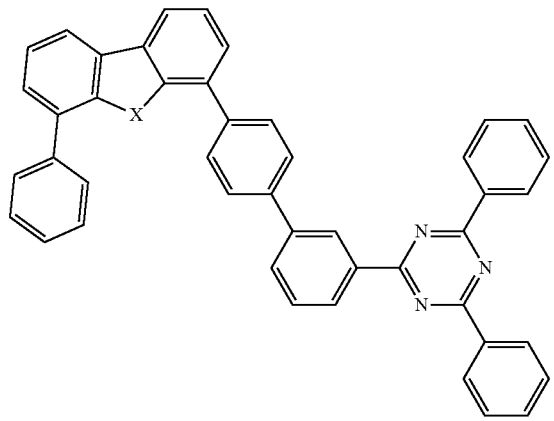

wherein in Compound C55: X = O,
in Compound C56: X = S,
in Compound C57: X = Se

Compound C58 through C60, each represented by the formula

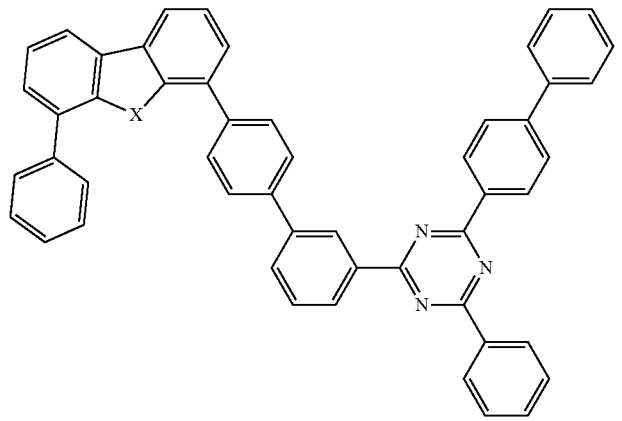

wherein in Compound C58: X = O,
in Compound C59: X = S,
in Compound C60: X = Se

Compound C61 through C63, each represented by the formula

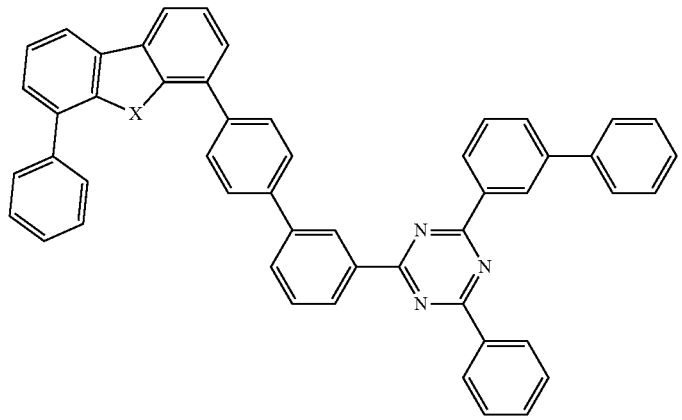

wherein in Compound C61: X = O,
in Compound C62: X = S,
in Compound C63: X = Se

Compound C64 through C66, each represented by the formula

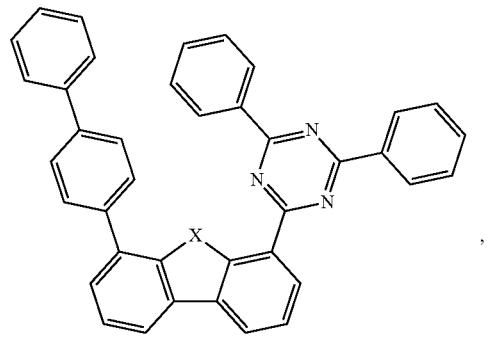

wherein in Compound C64: X = O,
in Compound C65: X = S,
in Compound C66: X = Se

-continued

Compound C67 through C69, each represented by the formula

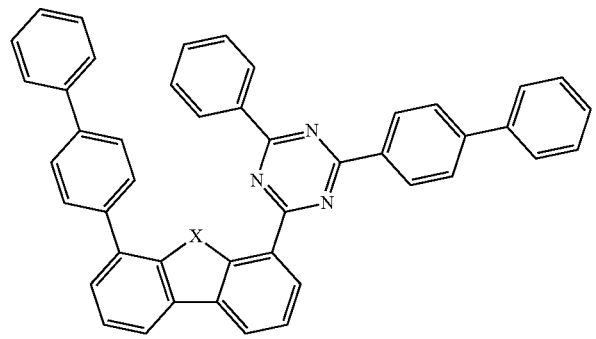

wherein in Compound C67: X = O,
in Compound C68: X = S,
in Compound C69: X = Se

Compound C70 through C72, each represented by the formula

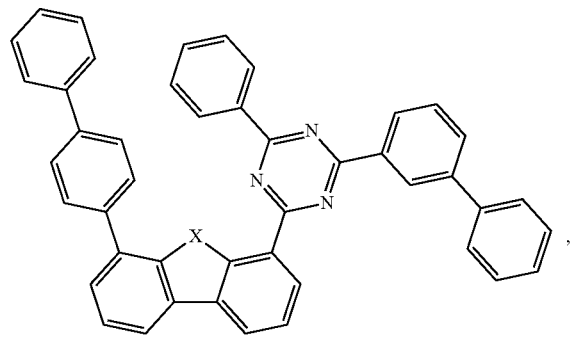

wherein in Compound C70: X = O,
in Compound C71: X = S,
in Compound C72: X = Se

Compound C73 through C75, each represented by the formula

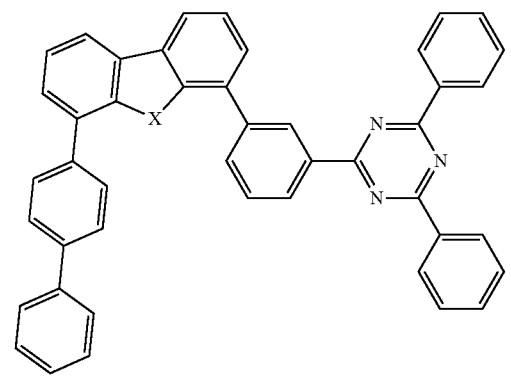

wherein in Compound C73: X = O,
in Compound C74: X = S,
in Compound C75: X = Se

Compound C76 through C78, each represented by the formula

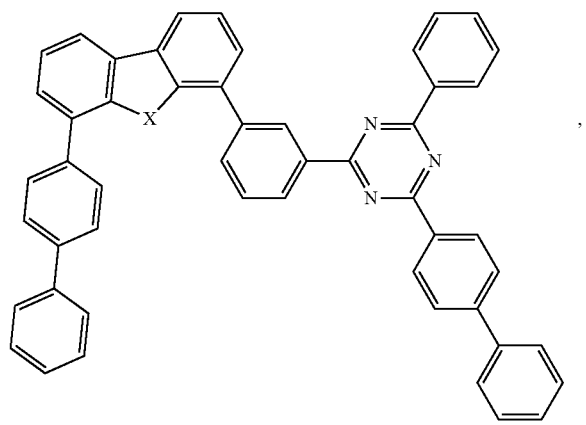

wherein in Compound C76: X = O,
in Compound C77: X = S,
in Compound C78: X = Se

Compound C79 through C81, each represented by the formula

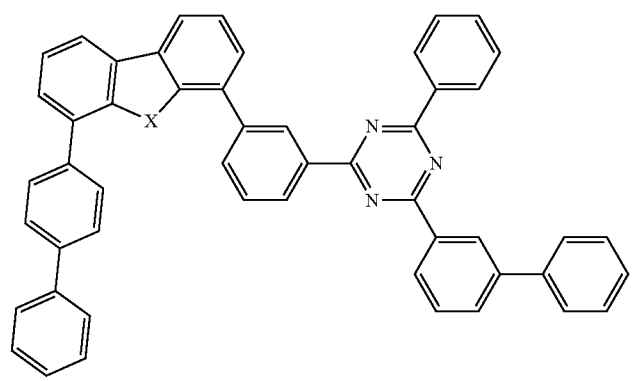

wherein in Compound C79: X = O,
in Compound C80: X = S,
in Compound C81: X = Se

Compound C82 through C84, each represented by the formula

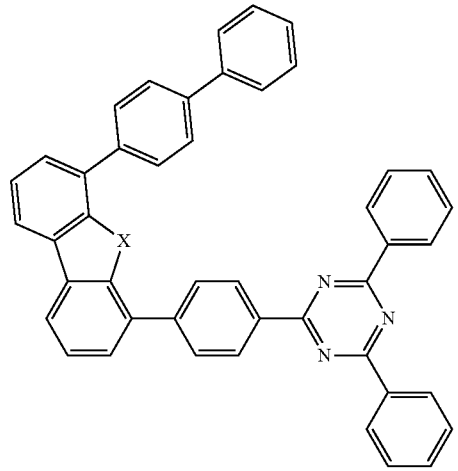

wherein in Compound C82: X = O,
in Compound C83: X = S,
in Compound C84: X = Se

Compound C85 through C87, each represented by the formula

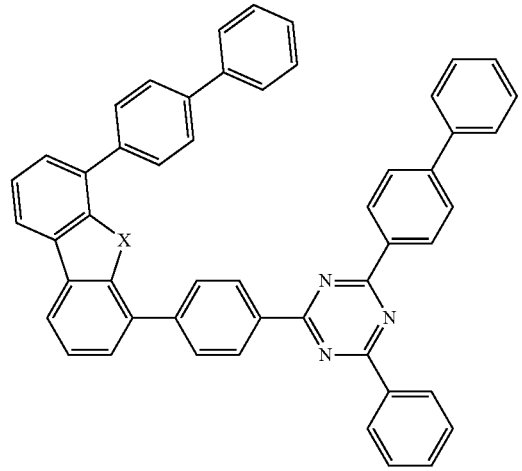

wherein in Compound C85: X = O,
in Compound C86: X = S,
in Compound C87: X = Se

Compound C88 through C90, each represented by the formula

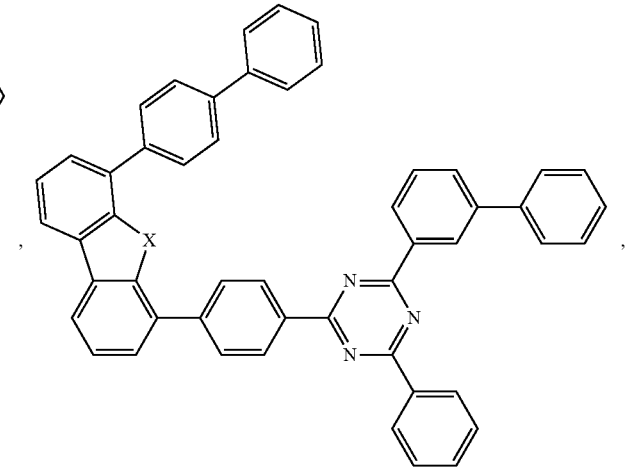

wherein in Compound C88: X = O,
in Compound C89: X = S,
in Compound C90: X = Se

Compound C91 through C93, each represented by the formula

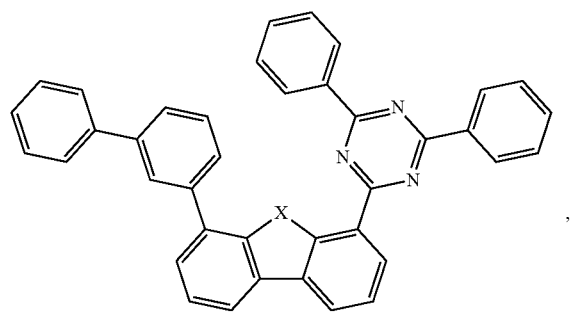

wherein in Compound C91: X = O,
in Compound C92: X = S,
in Compound C93: X = Se

Compound C94 through C96, each represented by the formula

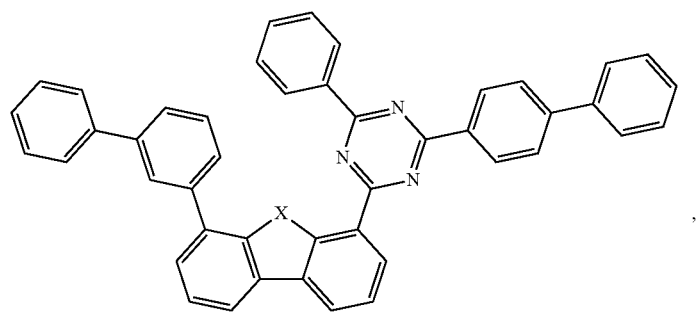

wherein in Compound C94: X = O,
in Compound C95: X = S,
in Compound C96: X = Se

Compound C97 through C99, each represented by the formula
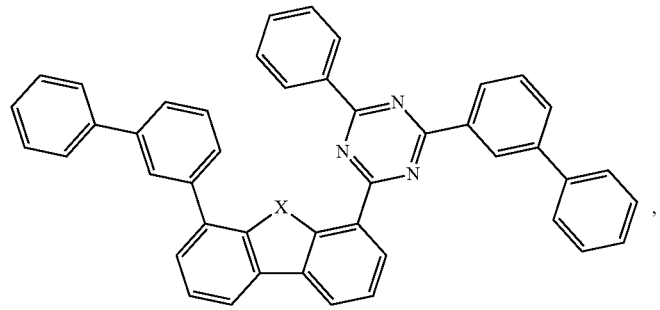
wherein in Compound C97: X = O,
in Compound C98: X = S,
in Compound C99: X = Se
Compound C100 through C102, each represented by the formula
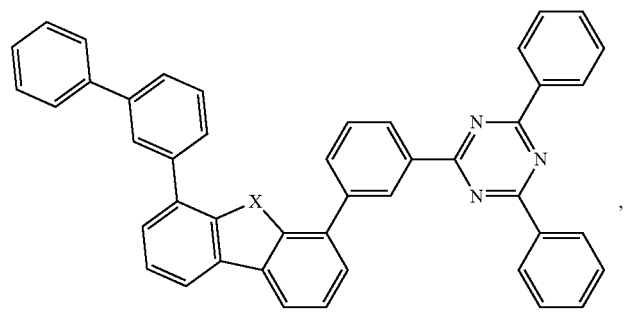
wherein in Compound C100: X = O,
in Compound C101: X = S,
in Compound C102: X = Se
Compound C103 through C105, each represented by the formula
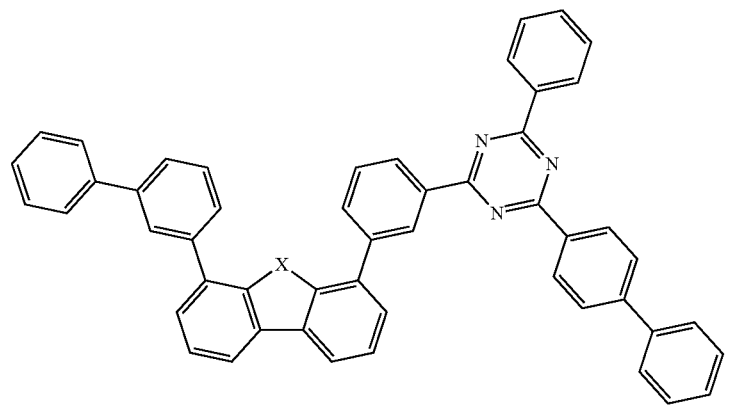
wherein in Compound C103: X = O,
in Compound C104: X = S,
in Compound C105: X = Se Compound C106 through C108, each represented by the formula

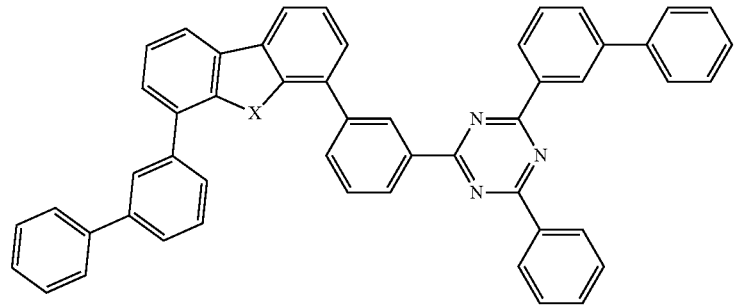

wherein in Compound C106: X = O,
in Compound C107: X = S,
in Compound C108: X = Se Compound C109 through C111, each represented by the formula

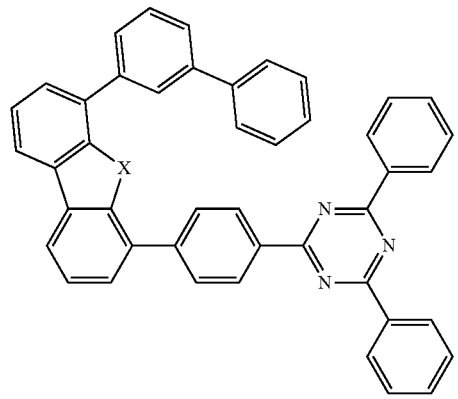

wherein in Compound C109: X = O,
in Compound C110: X = S,
in Compound C111: X = Se Compound C112 through C114, each represented by the formula

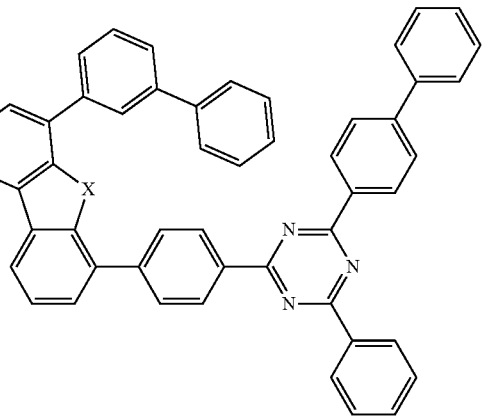

wherein in Compound C112: X = O,
in Compound C113: X = S,
in Compound C114: X = Se Compound C115 through C117, each represented by the formula

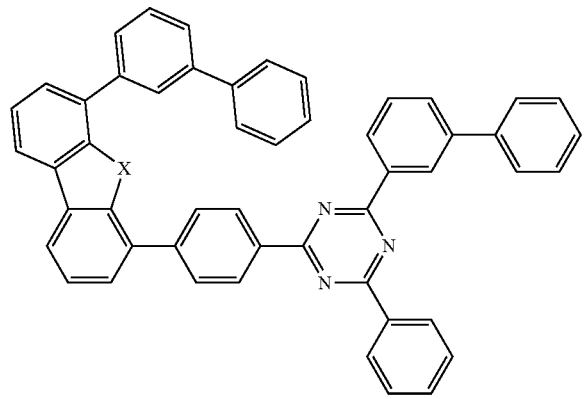

wherein in Compound C115: X = O,
in Compound C116: X = S,
in Compound C117: X = Se Compound C118 through C120, each represented by the formula

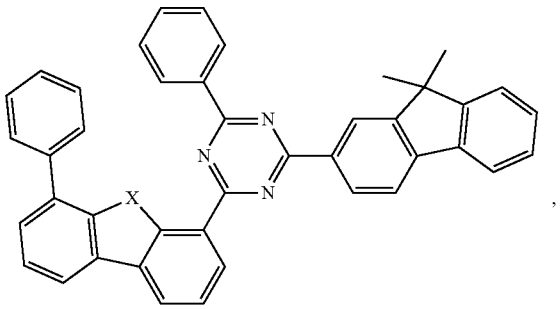

wherein in Compound C118: X = O,
in Compound C119: X = S,
in Compound C120: X = Se Compound C121 through C123, each represented by the formula

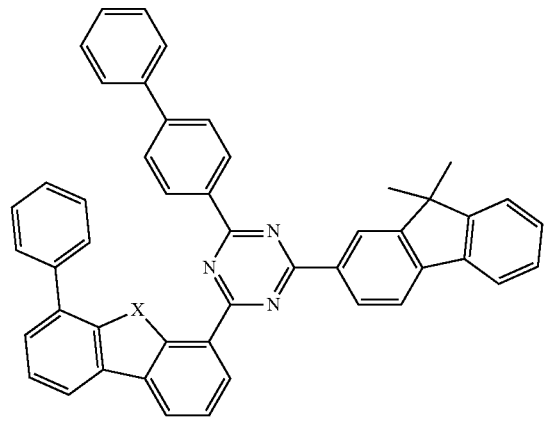

wherein in Compound C121: X = O,
in Compound C122: X = S,
in Compound C123: X = Se Compound C124 through C126, each represented by the formula

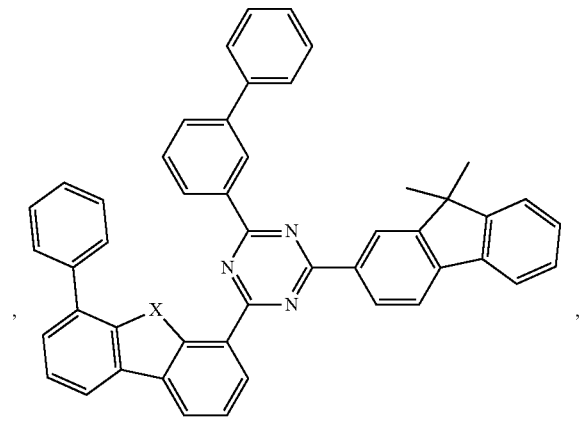

wherein in Compound C124: X = O,
in Compound C125: X = S,
in Compound C126: X = Se Compound C127 through C129, each represented by the formula

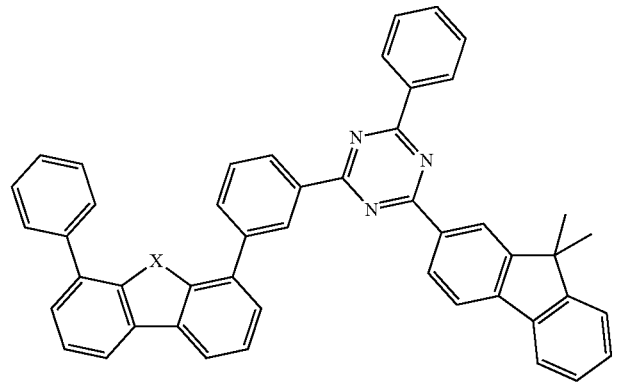

wherein in Compound C127: X = O,
in Compound C128: X = S,
in Compound C129: X = Se Compound C130 through C132, each represented by the formula

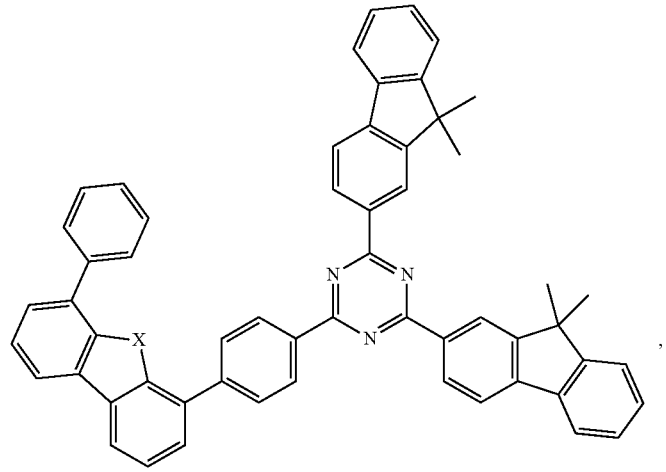

wherein in Compound C130: X = O,
in Compound C131: X = S,
in Compound C132: X = Se Compound C133 through C135, each represented by the formula
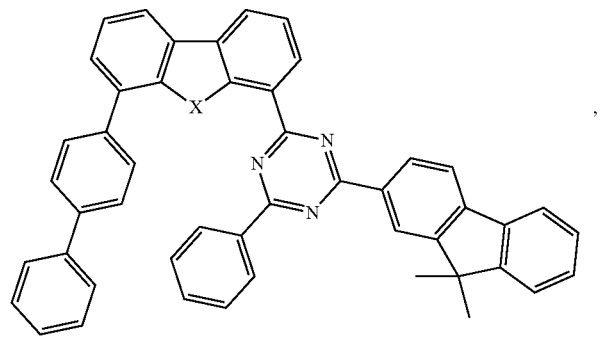
wherein in Compound C133: X = O,
in Compound C134: X = S,
in Compound C135: X = Se
Compound C136 through C138, each represented by the formula
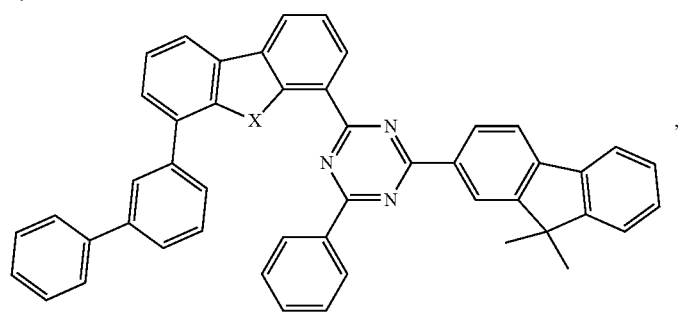
wherein in Compound C136: X = O,
in Compound C137: X = S,
in Compound C138: X = Se
Compound C139 through C141, each represented by the formula
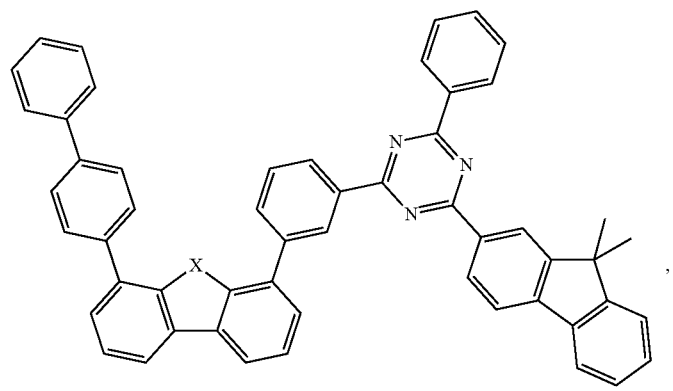
wherein in Compound C139: X = O,
in Compound C140: X = S,
in Compound C141: X = Se Compound C142 through C144, each represented by the formula

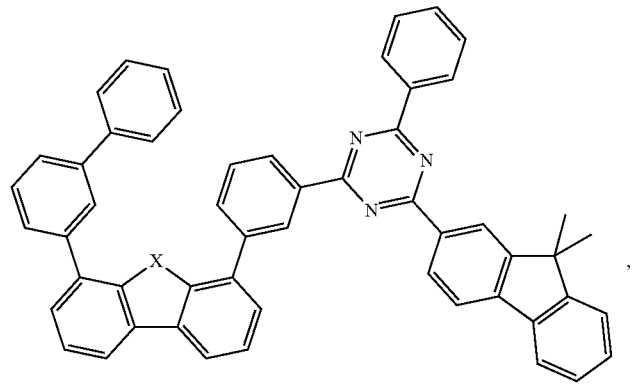

wherein in Compound C142: X = O,
in Compound C143: X = S,
in Compound C144: X = Se Compound C145 through C147, each represented by the formula

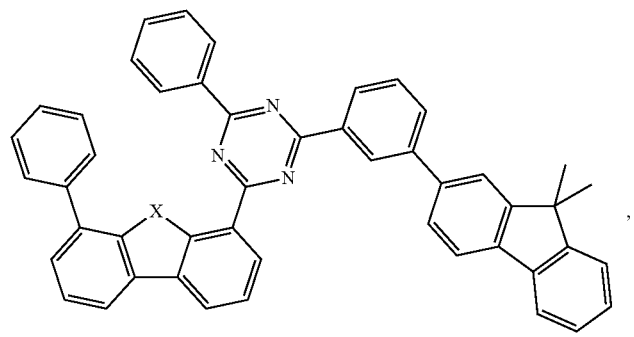

wherein in Compound C145: X = O,
in Compound C146: X = S,
in Compound C147: X = Se Compound C148 through C150, each represented by the formula

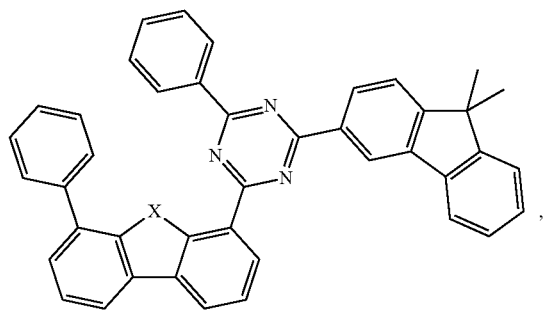

wherein in Compound C148: X = O,
in Compound C149: X = S,
in Compound C150: X = Se Compound C151 through C153, each represented by the formula

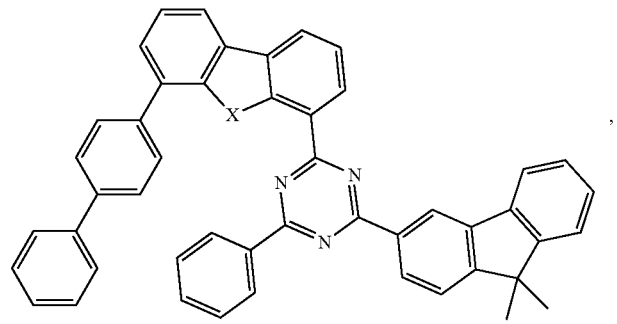

wherein in Compound C151: X = O,
in Compound C152: X = S,
in Compound C152: X = Se Compound C154 through C156, each represented by the formula

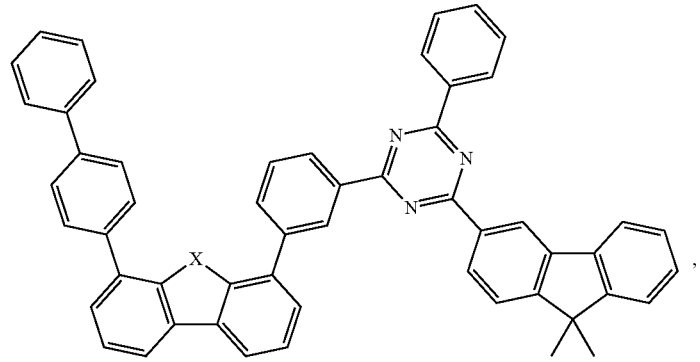

wherein in Compound C154: X = O,
in Compound C155: X = S,
in Compound C156: X = Se Compound C157 through C159, each represented by the formula

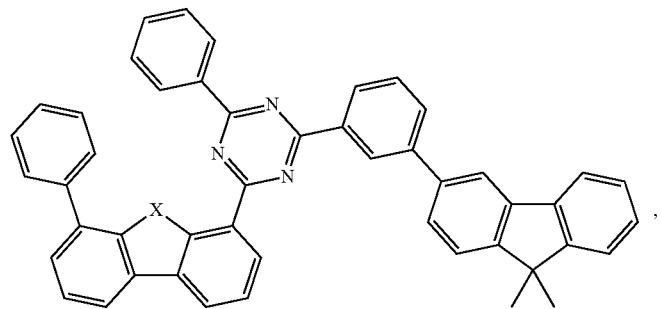

wherein in Compound C157: X = O,
in Compound C158: X = S,
in Compound C159: X = Se Compound C160 through C162, each represented by the formula

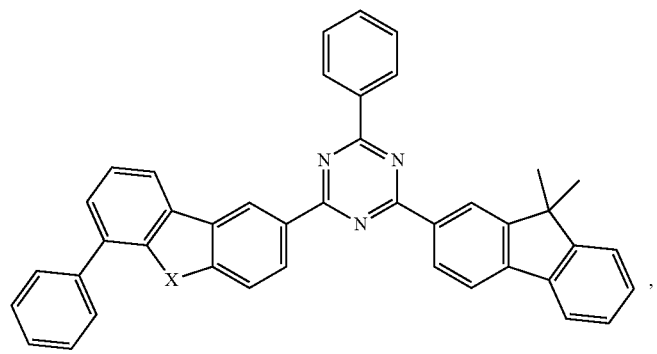

wherein in Compound C160: X = O,
in Compound C161: X = S,
in Compound C162: X = Se Compound C163 through C165, each represented by the formula

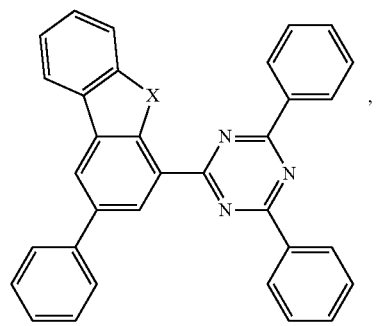

wherein in Compound C163: X = O,
in Compound C164: X = S,
in Compound C165: X = Se Compound C166 through C168, each represented by the formula

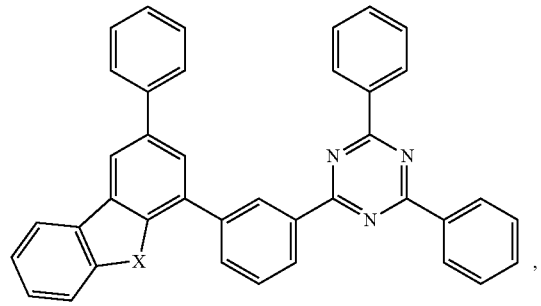

wherein in Compound C166: X = O,
in Compound C167: X = S,
in Compound C168: X = Se Compound C169 through C171, each represented by the formula

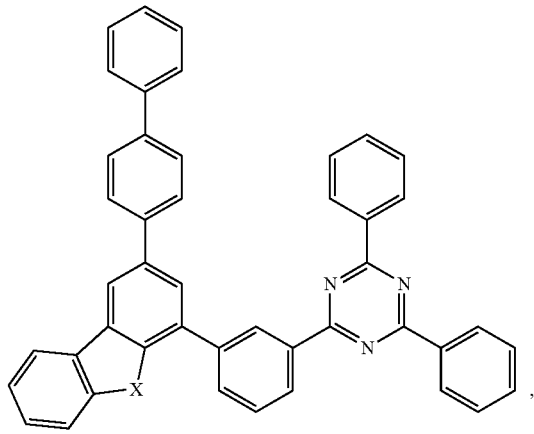

wherein in Compound C169: X = O,
in Compound C170: X = S,
in Compound C171: X = Se Compound C172 through C174, each represented by the formula

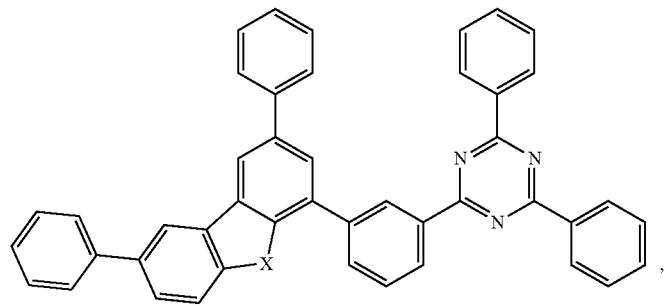

wherein in Compound C172: X = O,
in Compound C173: X = S,
in Compound C174: X = Se Compound C175 through C177, each represented by the formula

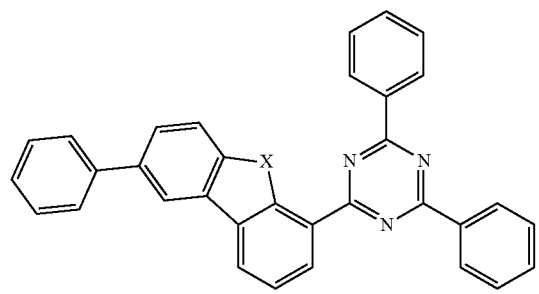

wherein in Compound C175: X = O,
in Compound C176: X = S,
in Compound C177: X = Se Compound C178 through C180, each represented by the formula

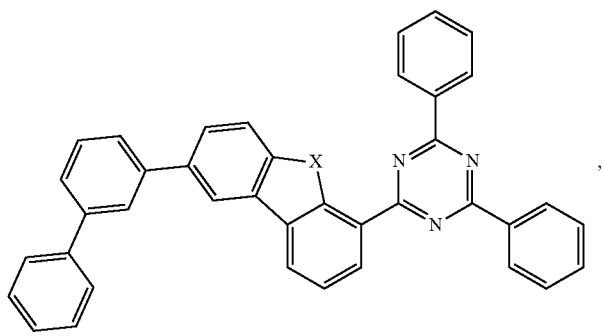

wherein in Compound C178: X = O,
in Compound C179: X = S,
in Compound C180: X = Se Compound C181 through C183, each represented by the formula
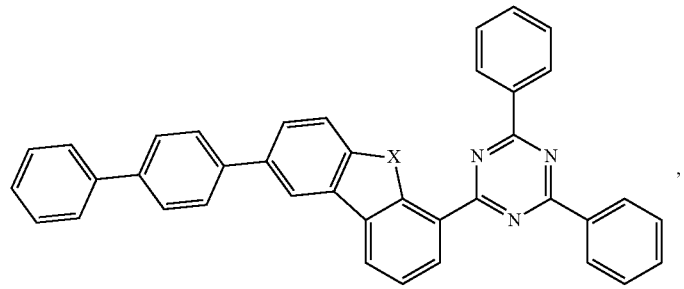
wherein in Compound C181: X = O,
in Compound C182: X = S,
in Compound C183: X = Se
Compound C184 through C186, each represented by the formula
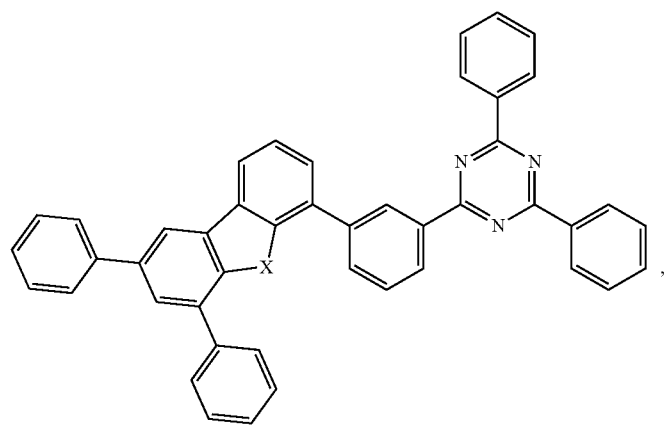
wherein in Compound C184: X = O,
in Compound C185: X = S,
in Compound C186: X = Se
Compound C187 through C189, each represented by the formula
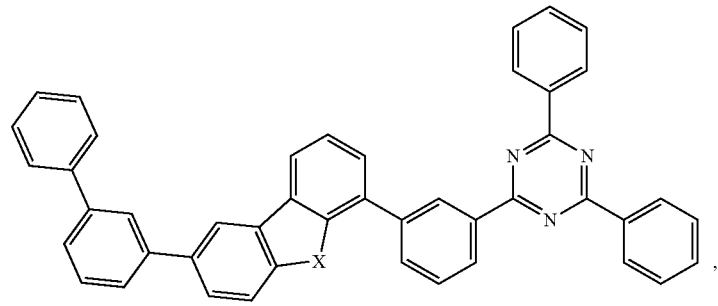
wherein in Compound C187: X = O,
in Compound C188: X = S,
in Compound C189: X = Se Compound C190 through C192, each represented by the formula
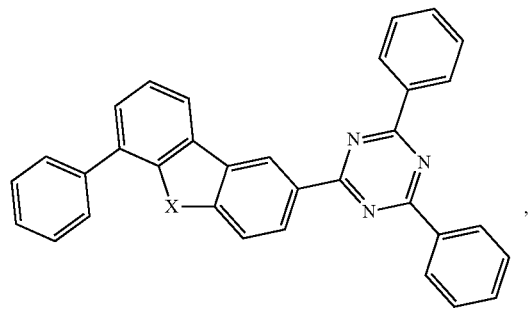
wherein in Compound C190: X = O,
in Compound C191: X = S,
in Compound C192: X = Se
Compound C193 through C195, each represented by the formula
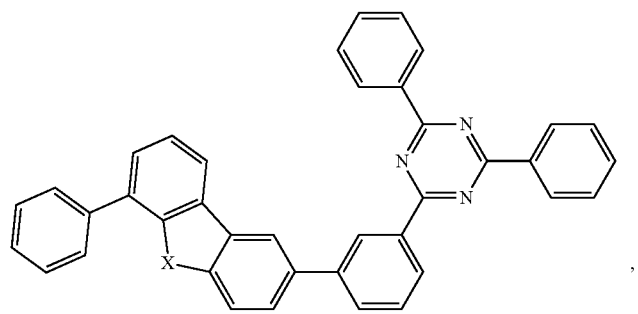
wherein in Compound C193: X = O,
in Compound C194: X = S,
in Compound C195: X = Se
Compound C196 through C198, each represented by the formula
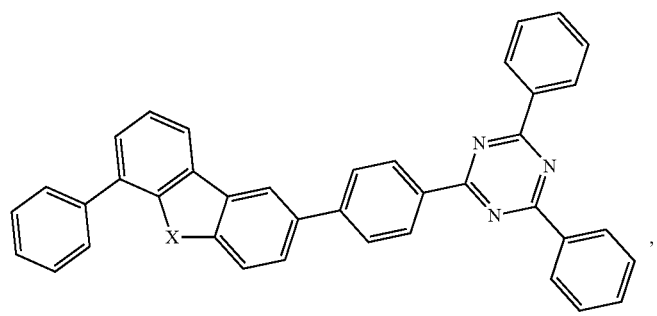
wherein in Compound C196: X = O,
in Compound C197: X = S,
in Compound C198: X = Se Compound C199 through C201, each represented by the formula

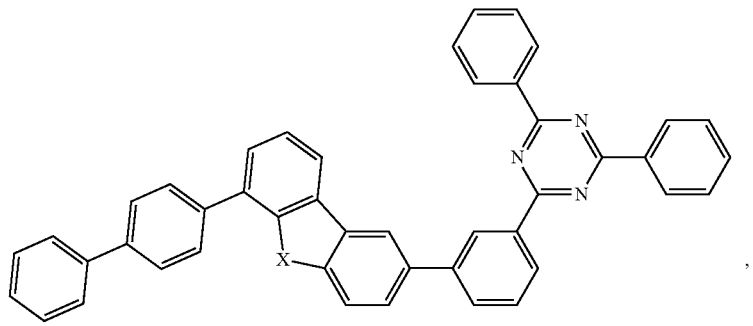

wherein in Compound C199: X = O,
in Compound C200: X = S,
in Compound C201: X = Se Compound C202 through C204, each represented by the formula

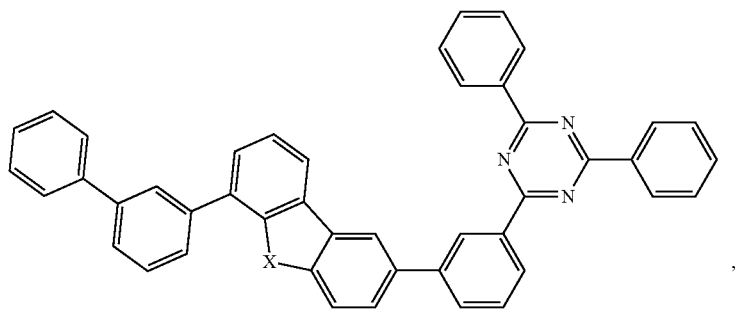

wherein in Compound C202: X = O,
in Compound C203: X = S,
in Compound C204: X = Se Compound C205 through C207, each represented by the formula

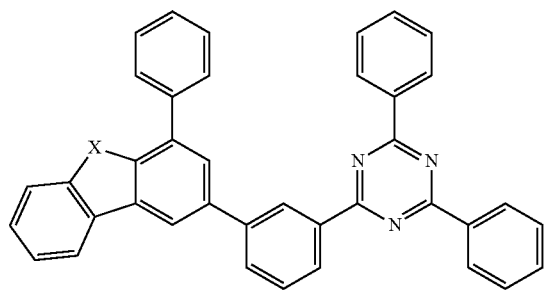

wherein in Compound C205: X = O,
in Compound C206: X = S,
in Compound C207: X = Se Compound C208 through C210, each represented by the formula

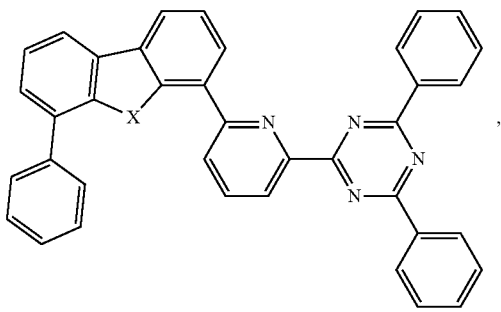

wherein in Compound C208: X = O,
in Compound C209: X = S,
in Compound C210: X = Se Compound C211 through C213, each represented by the formula

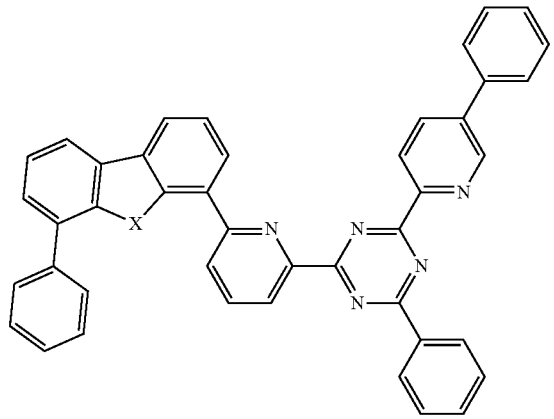

wherein in Compound C211: X = O,
in Compound C212: X = S,
in Compound C213: X = Se Compound C214 through C216, each represented by the formula

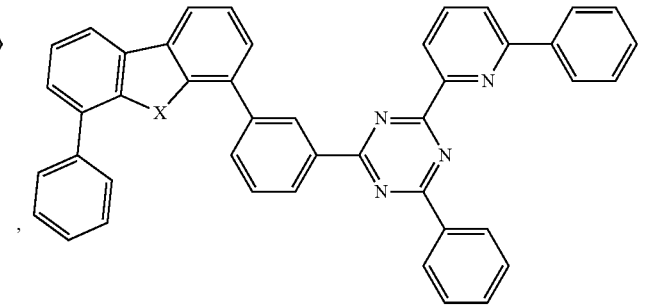

wherein in Compound C214: X = O,
in Compound C215: X = S,
in Compound C216: X = Se Compound C217 through C219, each represented by the formula

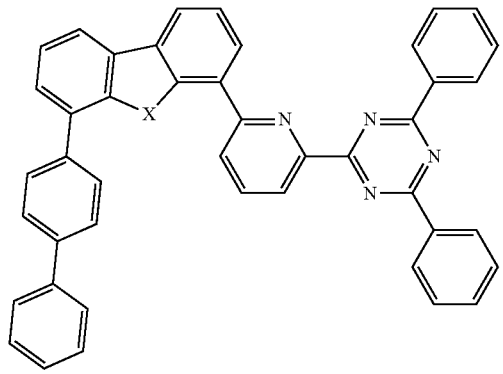

wherein in Compound C217: X = O,
in Compound C218: X = S,
in Compound C219: X = Se Compound C220 through C222, each represented by the formula

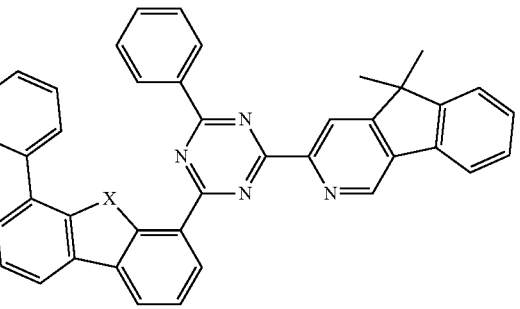

wherein in Compound C220: X = O,
in Compound C221: X = S,
in Compound C222: X = Se Compound C223 through C225, each represented by the formula

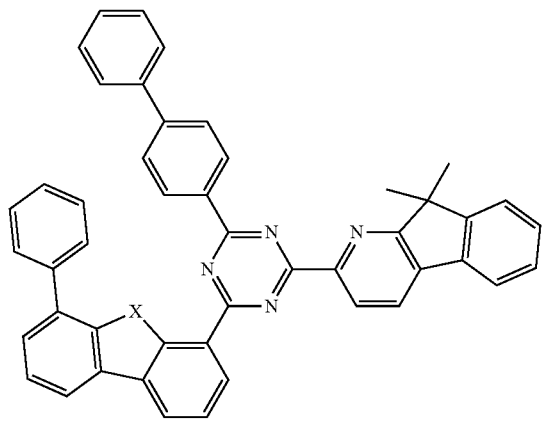

wherein in Compound C223: X = O,
in Compound C224: X = S,
in Compound C225: X = Se Compound C226 through C228, each represented by the formula

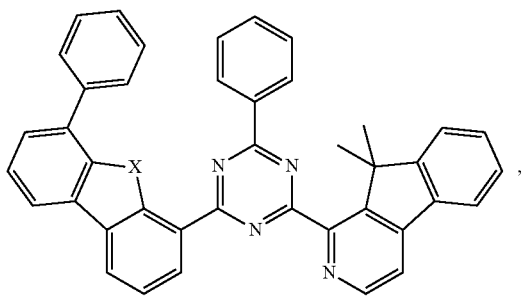

wherein in Compound C226: X = O,
in Compound C227: X = S,
in Compound C228: X = Se Compound C229 through C231, each represented by the formula

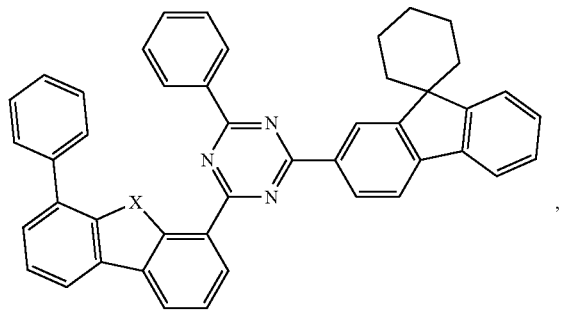

wherein in Compound C229: X = O,
in Compound C230: X = S,
in Compound C231: X = Se Compound C232 through C234, each represented by the formula

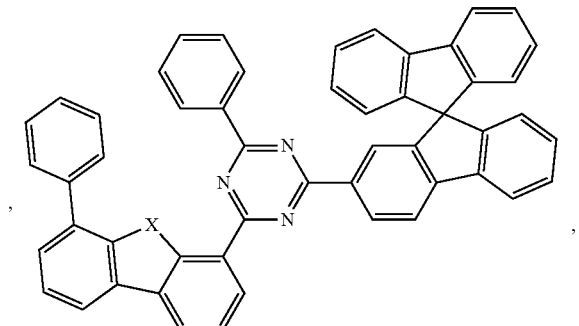

wherein in Compound C232: X = O,
in Compound C233: X = S,
in Compound C234: X = Se Compound C235 through C237, each represented by the formula

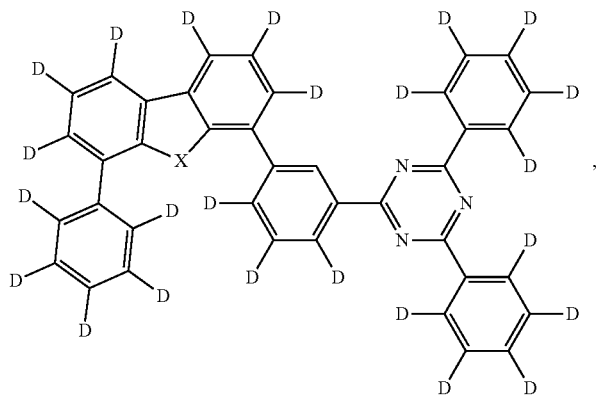

wherein in Compound C235: X = O,
in Compound C236: X = S,
in Compound C237: X = Se Compound C238 through C240, each represented by the formula

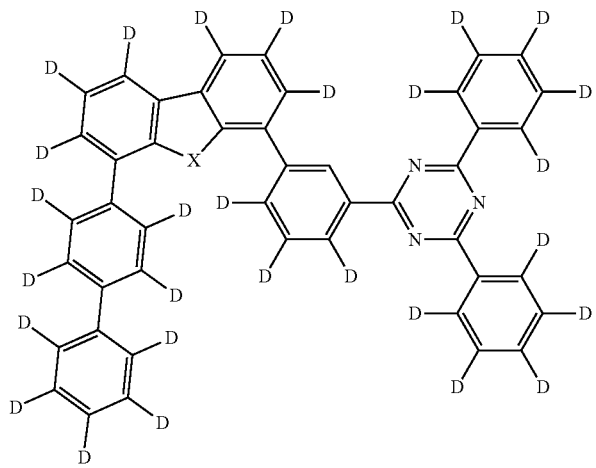

wherein in Compound C238: X = O,
in Compound C239: X = S,
in Compound C240: X = Se Compound C241 through C243, each represented by the formula

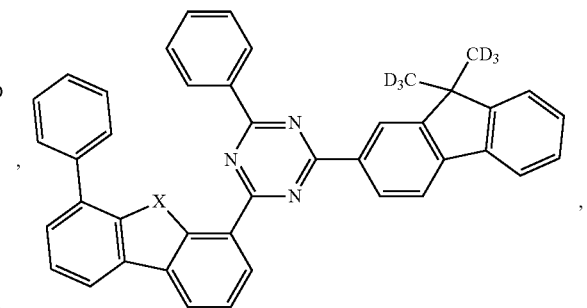

wherein in Compound C241: X = O,
in Compound C242: X = S,
in Compound C243: X = Se -continued Compound C244 through C246, each represented by the formula

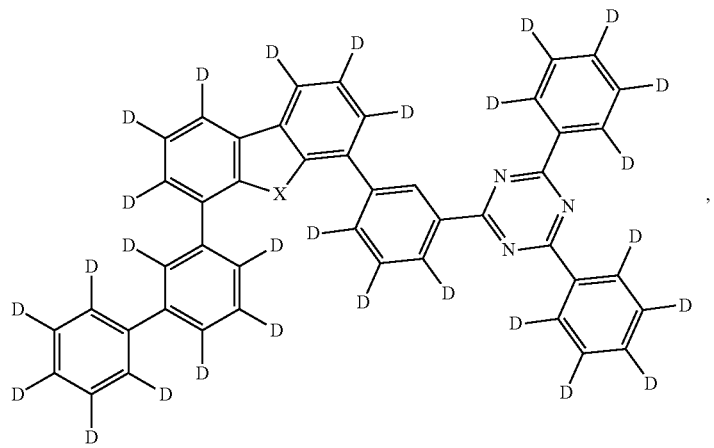

wherein in Compound C244: X = O,
in Compound C245: X = S,
in Compound C246: X = Se Compound C247 through C249, each represented by the formula

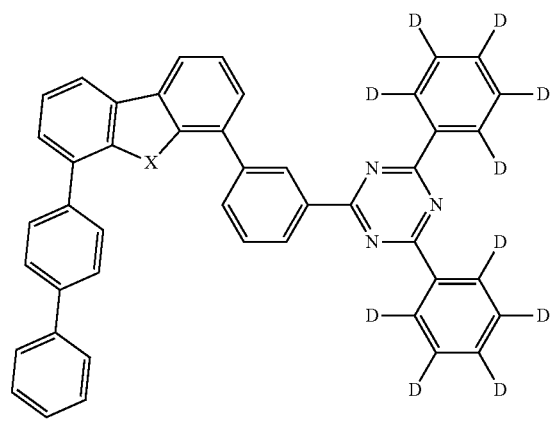

wherein in Compound C247: X = O,
in Compound C248: X = S,
in Compound C249: X = Se Compound C250 through C252, each represented by the formula

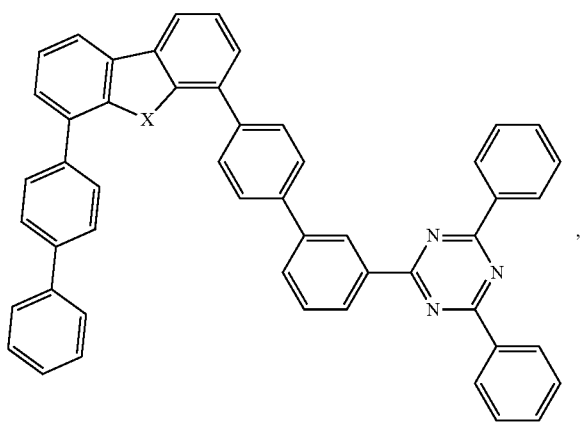

wherein in Compound C250: X = O,
in Compound C251: X = S,
in Compound C252: X = Se Compound C253 through C255, each represented by the formula:

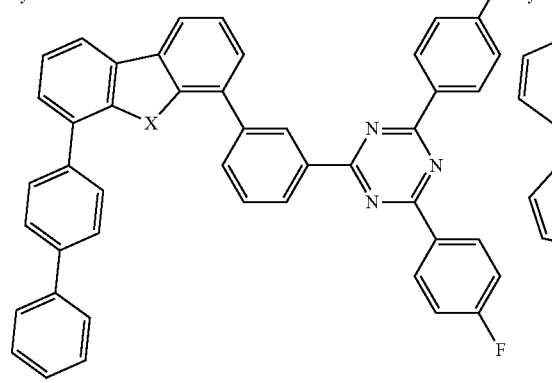

wherein in Compound C253: X = O,
in Compound C254: X = S,
in Compound C255: X = Se Compound D1 through D3, each represented by the formula:

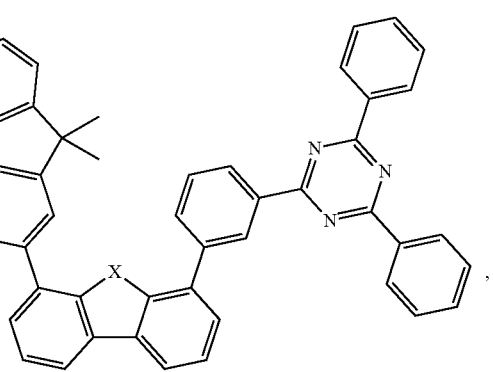

where in Compound D1: X = O,
in Compound D2, X = S, and
in Compound D3, X = Se

Compound D4 through D6, each represented by the formula:
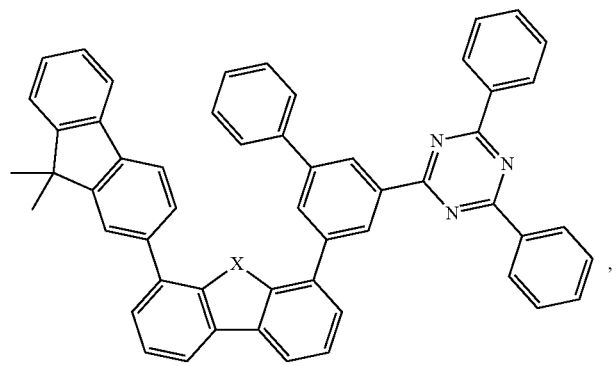
where in Compound D4: X = O,
in Compound D5, X = S, and
in Compound D6, X = Se
Compound D7 through D9, each represented by the formula:
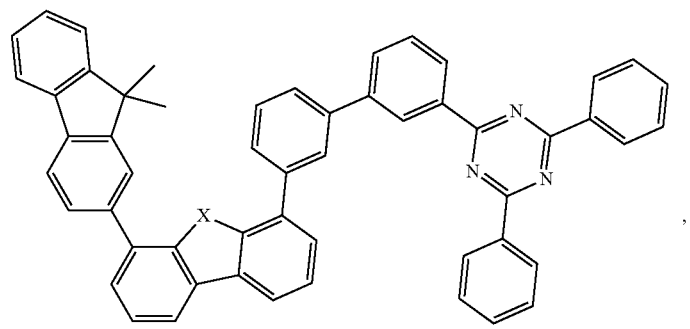
where in Compound D7: X = O,
in Compound D8, X = S, and
in Compound D9, X = Se
Compound D10 through D12, each represented by the formula:
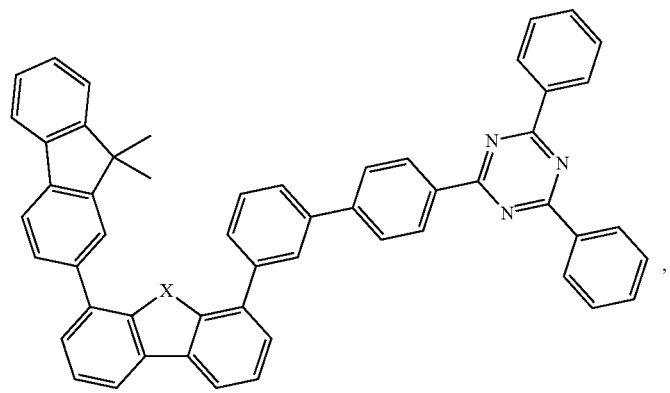
where in Compound D10: X = O,
in Compound D11, X = S, and
in Compound D12, X = Se Compound D13 through D15, each represented by the formula:

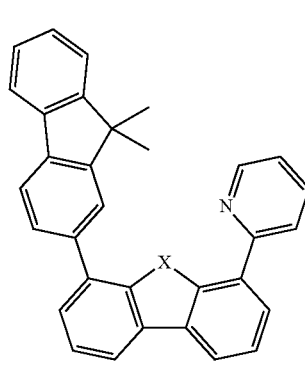

where in Compound D13: X = O,
in Compound D14, X = S, and
in Compound D15, X = Se Compound D16 through D18, each represented by the formula:

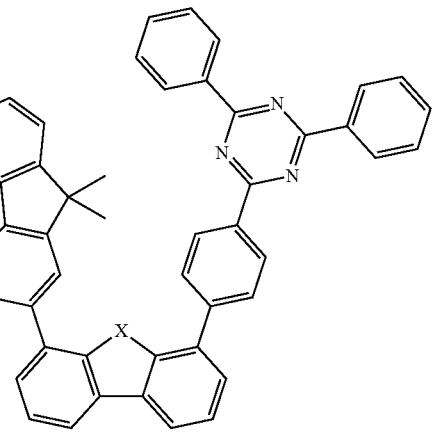

where in Compound D16: X = O,
in Compound D17, X = S, and
in Compound D18, X = Se Compound D19 through D21, each represented by the formula:

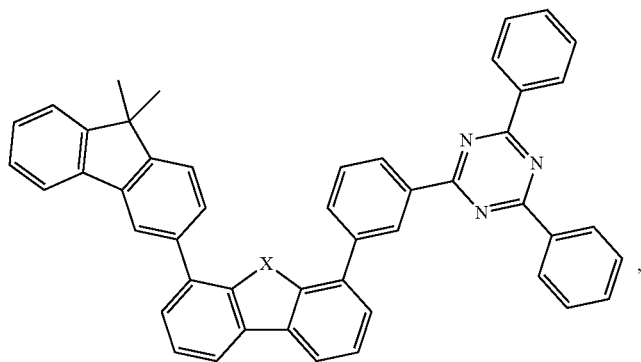

where in Compound D19: X = O,
in Compound D20, X = S, and
in Compound D21, X = Se Compound D22 through D24, each represented by the formula:

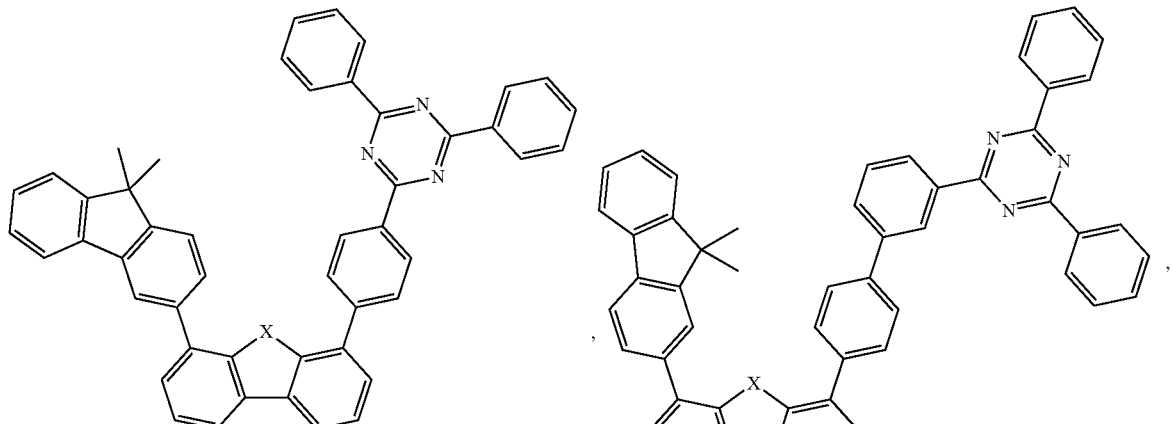

where in Compound D22: X = O,
in Compound D23, X = S, and
in Compound D24, X = Se Compound D25 through D27, each represented by the formula:

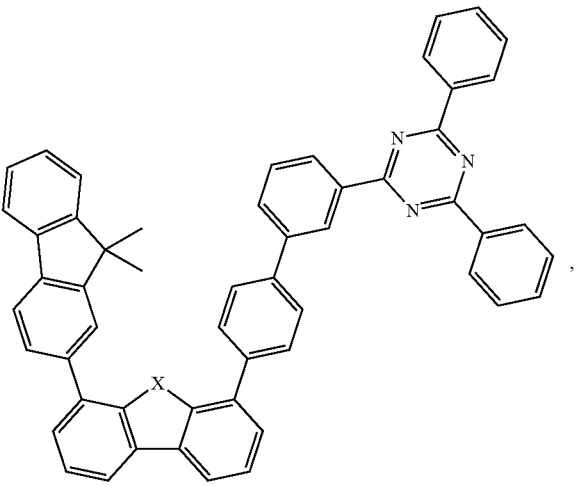

where in Compound D25: X = O,
in Compound D26, X = S, and
in Compound D27, X = Se Compound D28 through D30, each represented by the formula:
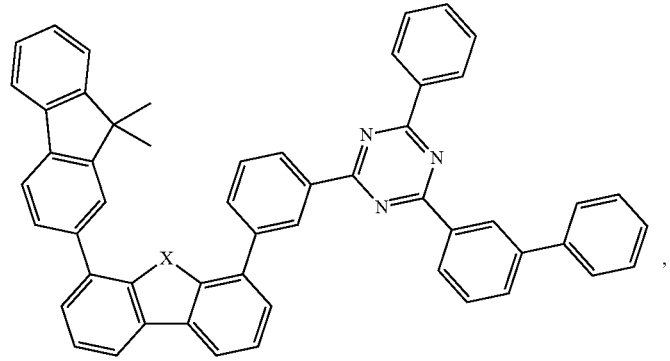
where in Compound D28: X = O,
in Compound D29, X = S, and
in Compound D30, X = Se
Compound D31 through D33, each represented by the formula:
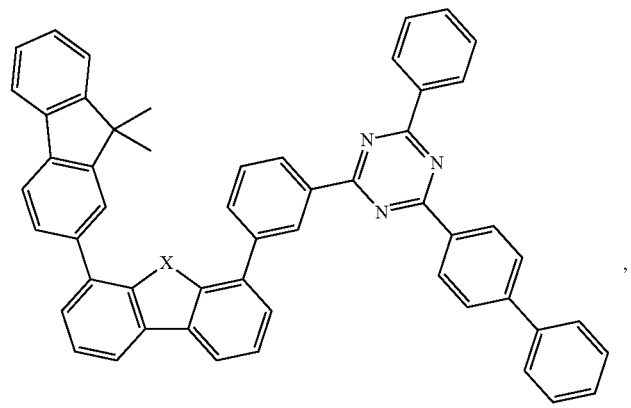
where in Compound D31: X = O,
in Compound D32, X = S, and
in Compound D33, X = Se
Compound D34 through D36, each represented by the formula:
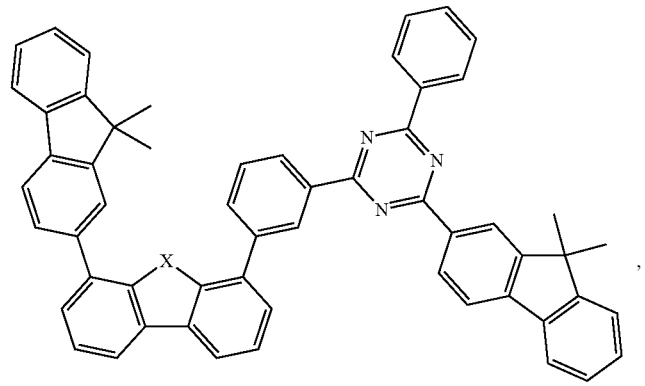
where in Compound D34: X = O,
in Compound D35, X = S, and
in Compound D36, X = Se Compounds D37 through D39, each represented by the formula:
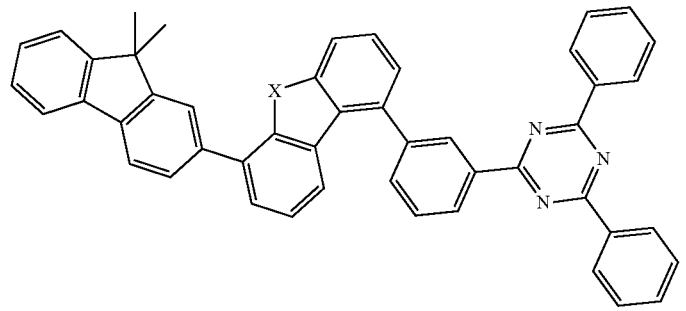
where in Compound D37: X = O,
in Compound D38, X = S, and
in Compound D39, X = Se
Compound D40 through D42, each represented by the formula:
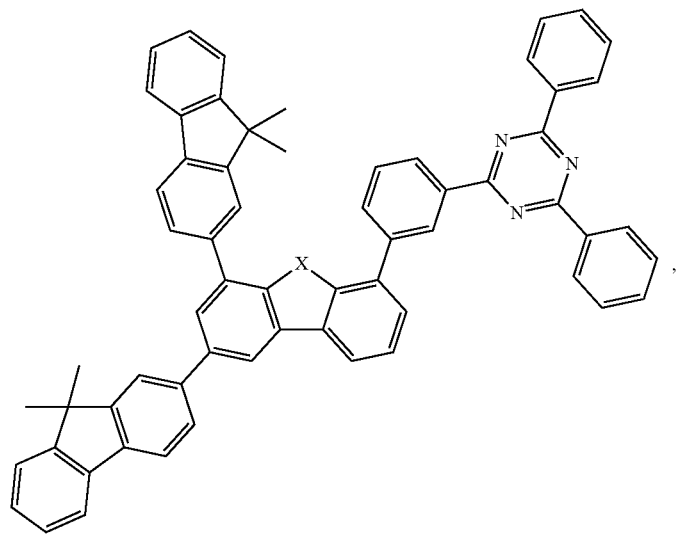
where in Compound D40: X = O,
in Compound D41, X = S, and
in Compound D42, X = Se
Compound D43 through D45, each represented by the formula:
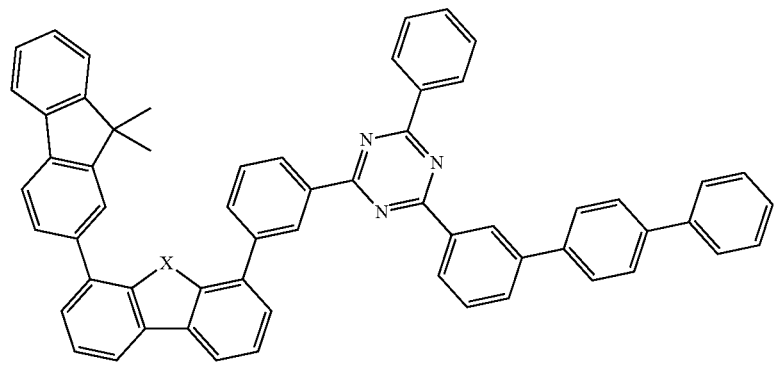
where in Compound D43: X = O,
in Compound D44, X = S, and
in Compound D45, X = Se -continued Compound D46 through D48, each represented by the formula:

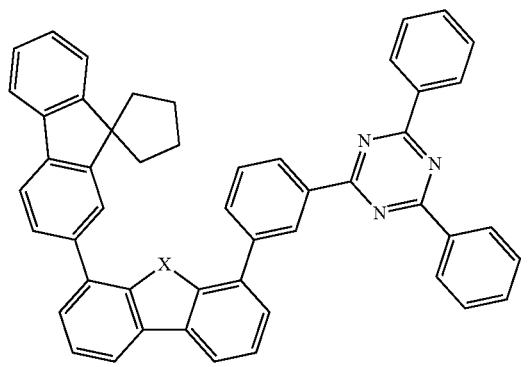

where in Compound D46: X = O,
in Compound D47, X = S, and
in Compound D48, X = Se Compound D49 through D51, each represented by the formula:

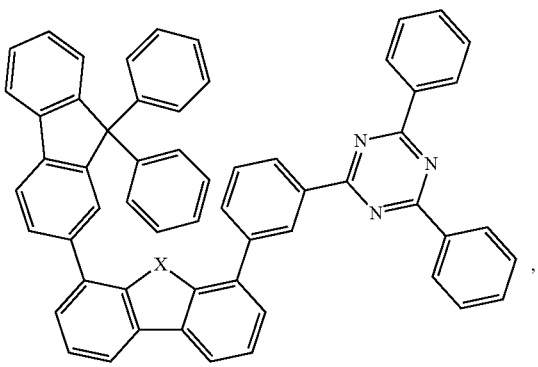

where in Compound D49: X = O,
in Compound D50, X = S, and
in Compound D51, X = Se Compound D49 through D51, each represented by the formula:

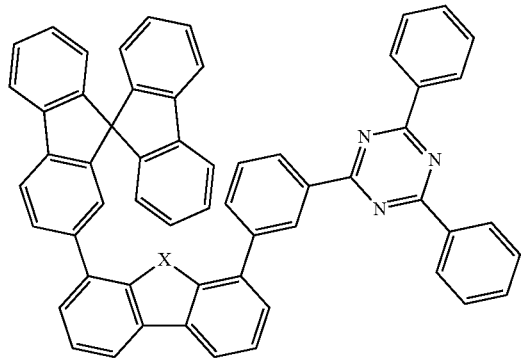

where in Compound D52: X = O,
in Compound D53, X = S, and
in Compound D54, X = Se Compound D55 through D57, each represented by the formula:

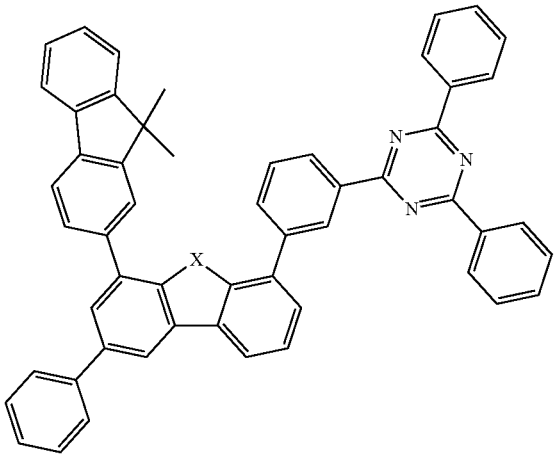

where in Compound D55: X = O,
in Compound D56, X = S, and
in Compound D57, X = Se Compound D58 through D60, each represented by the formula:

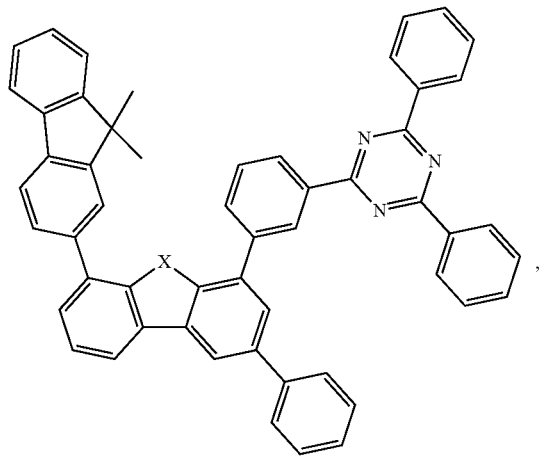

where in Compound D58: X = O,
in Compound D59, X = S, and
in Compound D60, X = Se Compound D61 through D63, each represented by the formula:

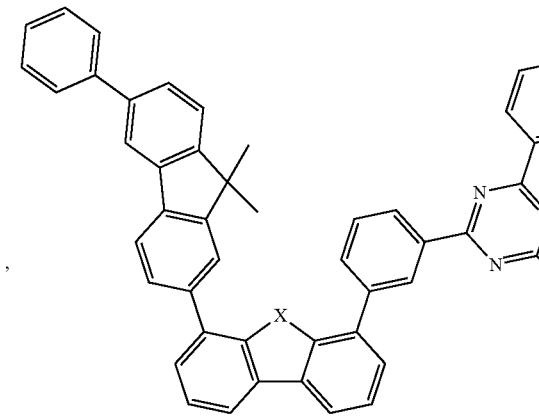

where in Compound D61: X = O,
in Compound D62, X = S, and
in Compound D63, X = Se Compound D64 through D66, each represented by the formula:
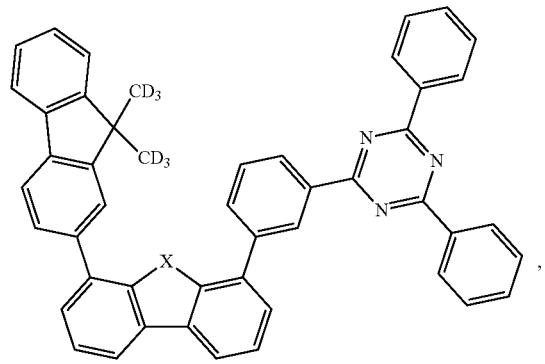
where in Compound D64: X = O,
in Compound D65, X = S, and
in Compound D66, X = Se
Compound D67 through D69, each represented by the formula:
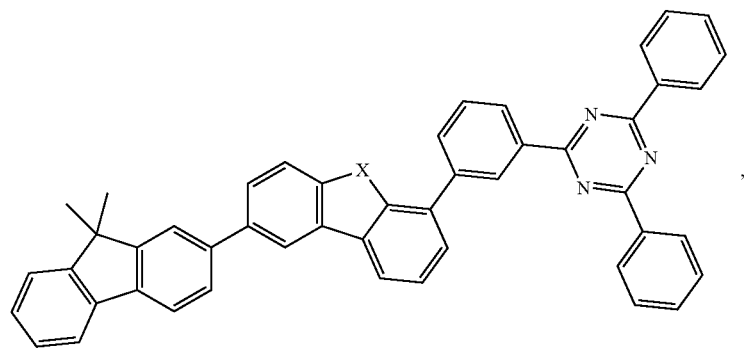
where in Compound D67: X = O,
in Compound D68, X = S, and
in Compound D69, X = O
Compounds D70 through D72, each represented by the formula:
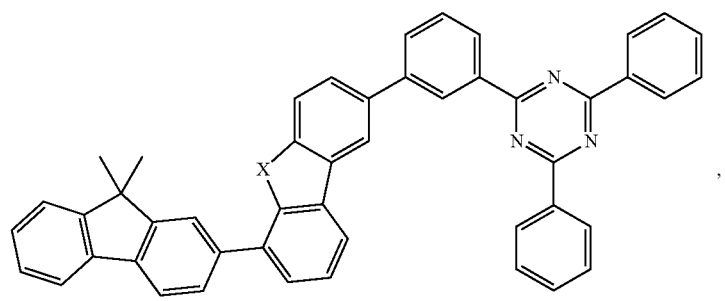
where in Compound D70: X = O,
in Compound D71, X = S, and
in Compound D72, X = Se -continued
Compounds D73 through D75, each represented by the formula:
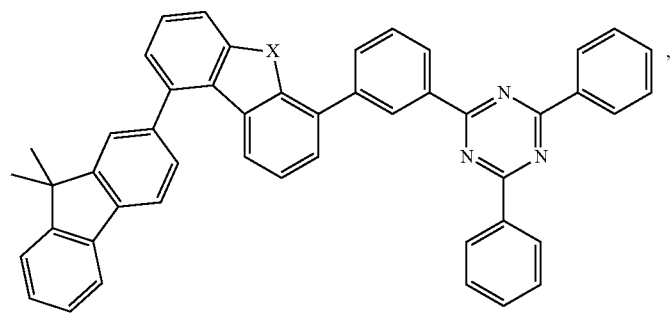
where in Compound D73: X = O,
in Compound D74, X = S, and
in Compound D75, X = Se
Compounds D76 through D78, each represented by the formula:
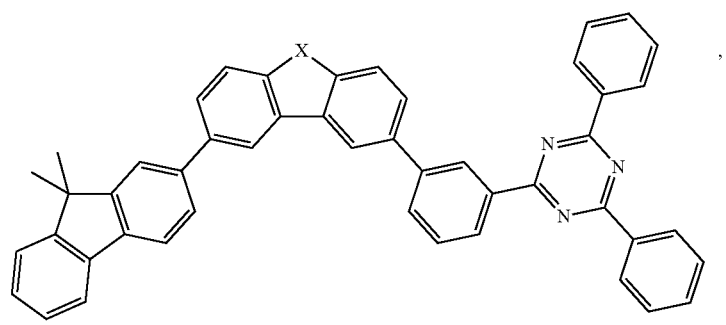
where in Compound D76: X = O,
in Compound D77, X = S, and
in Compound D78, X = Se
Compounds D79 through D81, each represented by the formula:
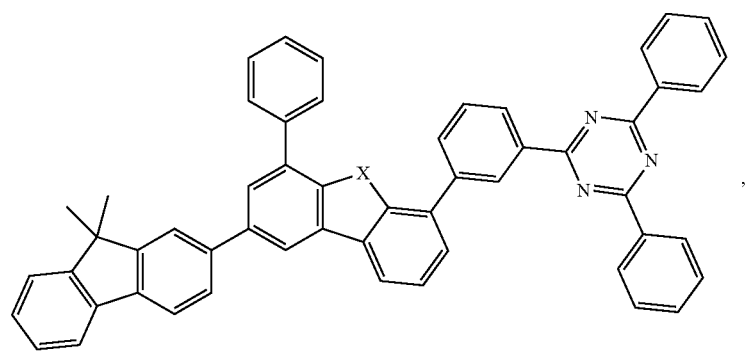
where in Compound D79: X = O,
in Compound D80, X = S, and
in Compound D81, X = Se -continued
Compounds D82 through D84, each represented by the formula:
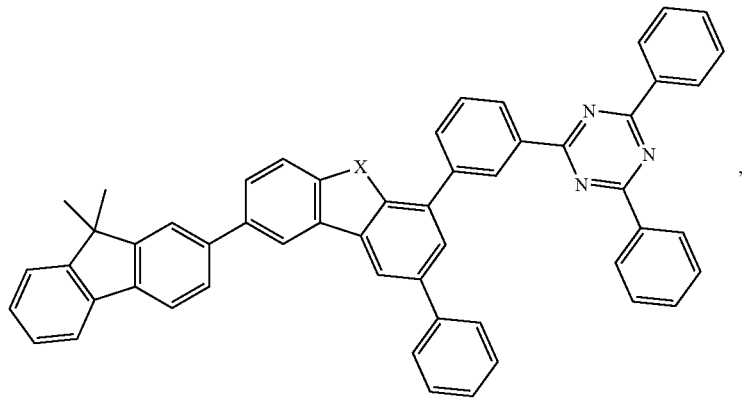
where in Compound D82: X = O,
in Compound D83, X = S, and
in Compound D84, X = Se
Compounds D85 through D87, each represented by the formula:
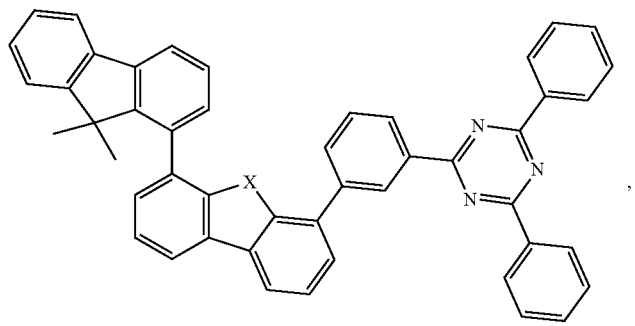
where in Compound D85: X = O,
in Compound D86, X = S, and
in Compound D87, X = Se
Compounds D88 through D90, each represented by the formula:
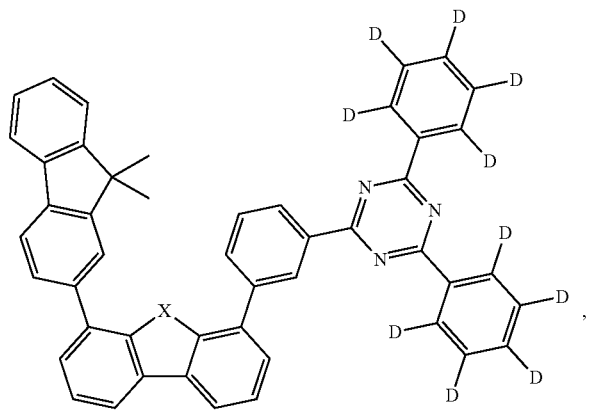
where in Compound D88: X = O,
in Compound D89, X = S, and
in Compound D90, X = Se Compounds D91 through D93, each represented by the formula:
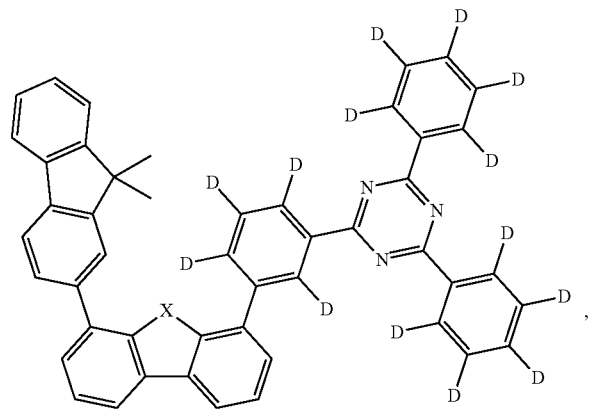
where in Compound D91: X = O,
in Compound D92, X = S, and
in Compound D93, X = Se
Compounds D94 through D96, each represented by the formula:
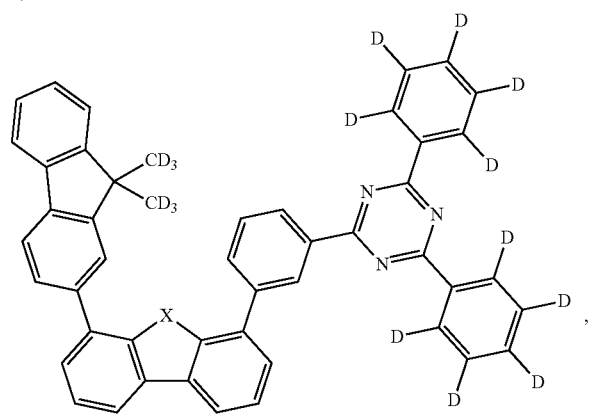
where in Compound D94: X = O,
in Compound D95, X = S, and
in Compound D96, X = Se
Compounds D97 through D99, each represented by the formula:
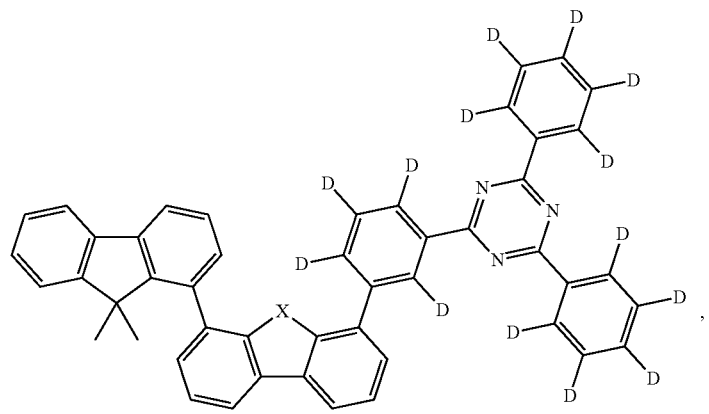
where in Compound D97: X = O,
in Compound D98, X = S, and
in Compound D99, X = Se -continued Compounds E1 through E3, each represented by the formula:

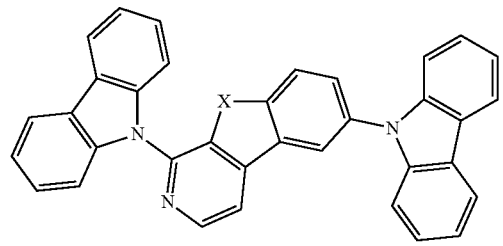

where in Compound E1: X = O,
in Compound E2, X = S, and
in Compound E3, X = Se

Compounds E4 through E6, each represented by the formula:

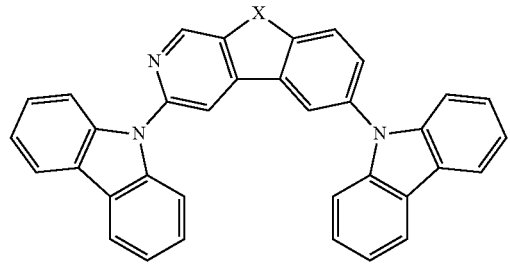

where in Compound E4: X = O,
in Compound E5, X = S, and
in Compound E6, X = Se

Compounds E7 through E9, each represented by the formula:

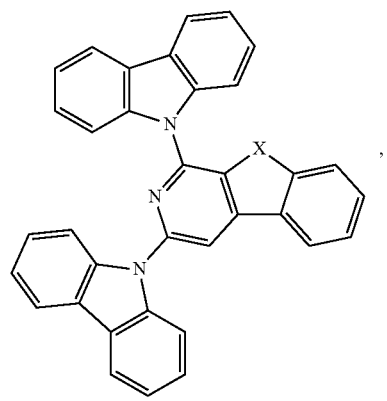

where in Compound E7: X = O,
in Compound E8, X = S, and
in Compound E9, X = Se

Compounds E10 through E12, each represented by the formula:

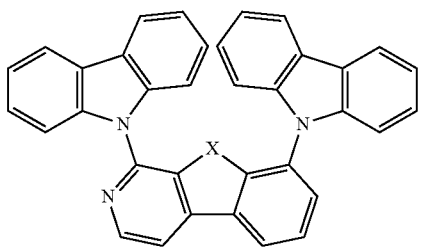

where in Compound E10: X = O,
in Compound E11, X = S, and
in Compound E10, X = Se Compounds E13 through E15, each represented by the formula:

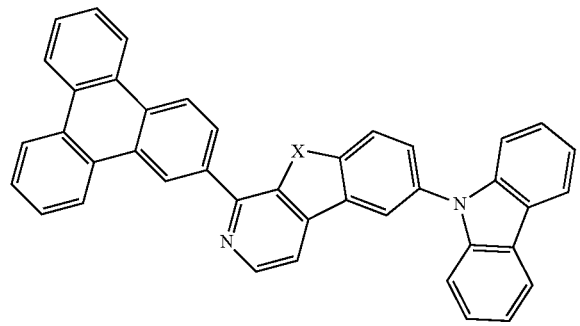

where in Compound E13: X = O,
in Compound E14, X = S, and
in Compound E15, X = Se Compounds E16 through E18, each represented by the formula:

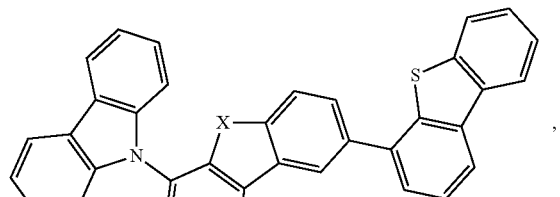

where in Compound E16: X = O,
in Compound E17, X = S, and
in Compound E18, X = Se Compounds E19 through E21, each represented by the formula:

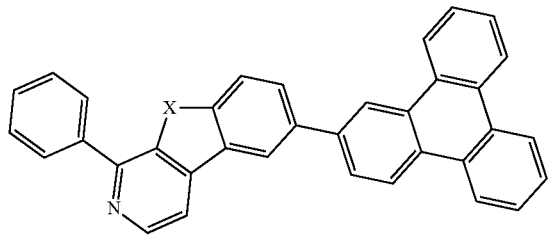

where in Compound E19: X = O,
in Compound E20, X = S, and
in Compound E21, X = Se Compounds E22 through E24, each represented by the formula:

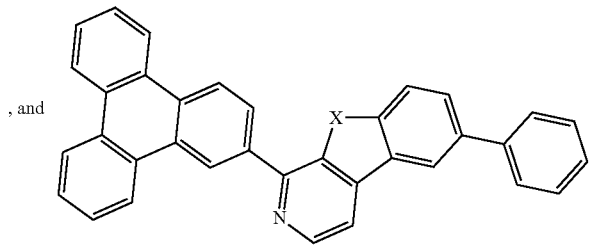

, and where in Compound E22: X = O,
in Compound E23, X = S, and
in Compound E24, X = Se In some embodiments, the h-host material can be selected from the group consisting of a compound having a structure of

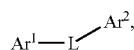

Formula III and a compound having a structure of

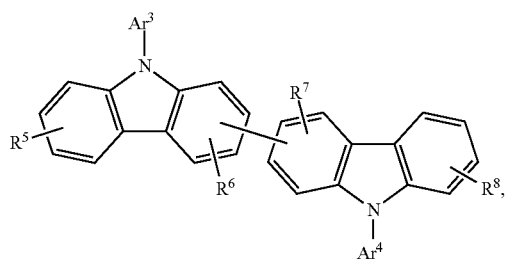

Formula IV wherein $Ar^1$ is selected from the group consisting of triphenylene, tetraphenylene, pyrene, naphthalene, fluoranthene, chrysene, phenanthrene, and combinations thereof;

wherein L is selected from the group consisting of a direct bond, phenyl, biphenyl, terphenyl, naphthalene, pyridine, dibenzofuran, dibenzothiophene, dibenzoselenophene, and combinations thereof;

wherein $Ar^2$ is selected from the group consisting of benzene, biphenyl, terphenyl, naphthalene, pyridine, dibenzofuran, dibenzothiophene, dibenzoselenophene, fluorene, carbazole, and combinations thereof;

wherein $Ar^1$, $Ar^2$ and L are each independently and optionally further substituted with one or more substitutions selected from the group consisting of deuterium, halogen, alkyl, aryl, non-aza-heteroaryl, and combinations thereof;

wherein $R^5$ and $R^8$ each independently represent mono, di, tri, or tetra substitution, or no substitution;

wherein $R^6$ and $R^7$ each independently represent mono, di, or tri substitution, or no substitution;

wherein $R^5$, $R^6$, $R^7$, $R^8$, $Ar^3$ and $Ar^4$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, benzene, furan, thiophene, selenophene, pyrole, biphenyl, terphenyl, naphthalene, triphenylene, anthracene, phenanthracene, tetraphenylene, pyrene, fluoranthene, chrysene, fluorene, carbazole, benzofuran, benzothiophene, benzoselenophene, dibenzofuran, dibenzothiophene, dibenzoselenophene, indole, carbazole, and combinations thereof; and wherein any two adjacent substituents are optionally joined or fused into a ring.

The h-host material can be selected from the group consisting of:

Compound F1

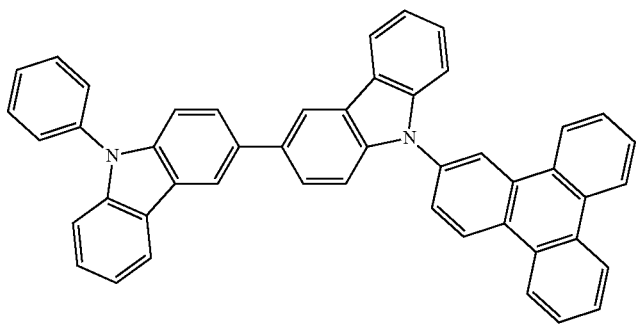

-continued
Compound F2
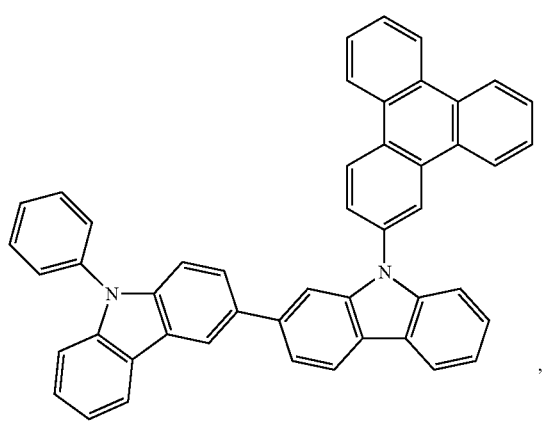
Compound F3
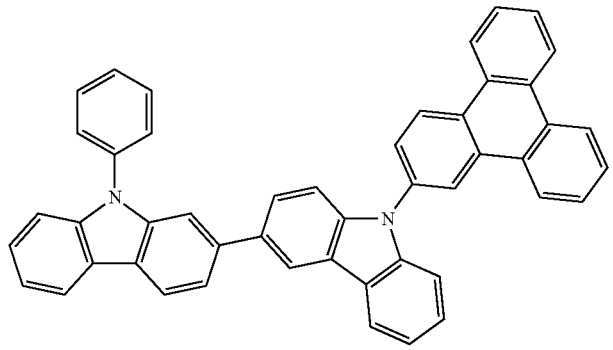
Compound F4
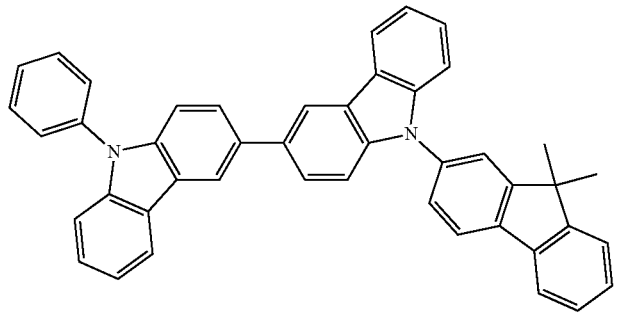
Compound F5
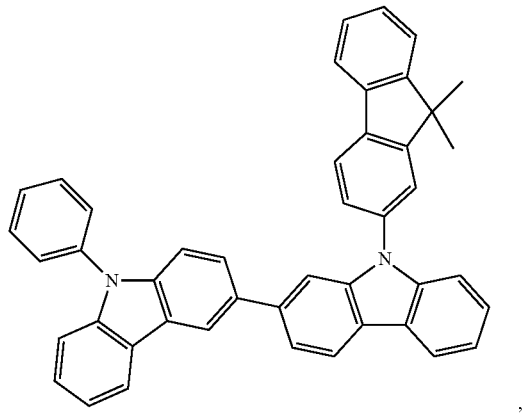

Compound F6
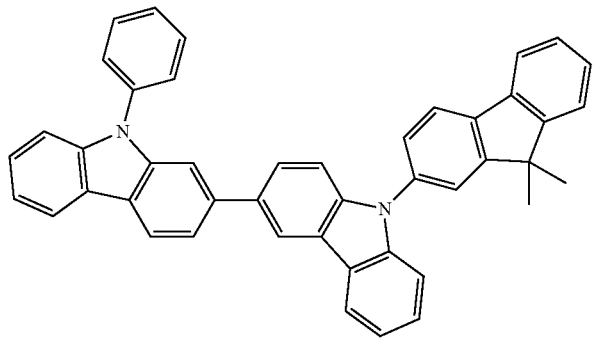
Compound F7
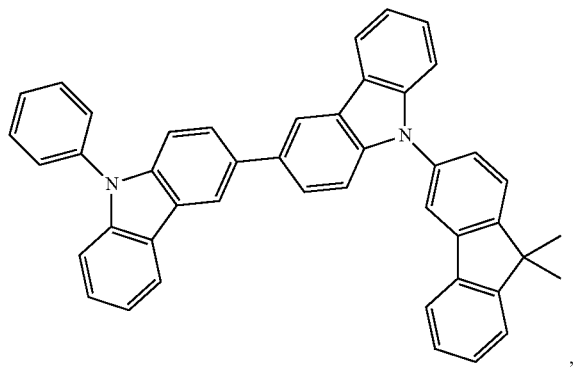
Compound F8
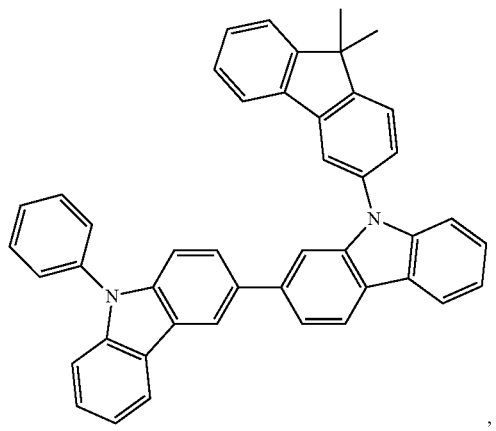
Compound F9
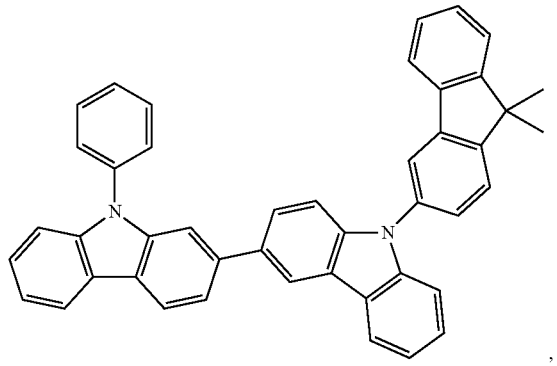

Compound F10
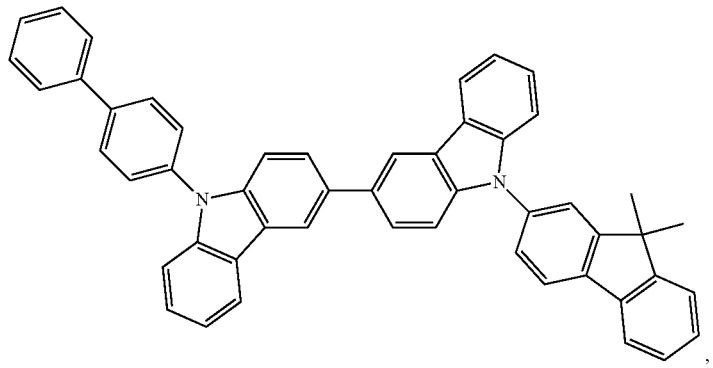
Compound F11
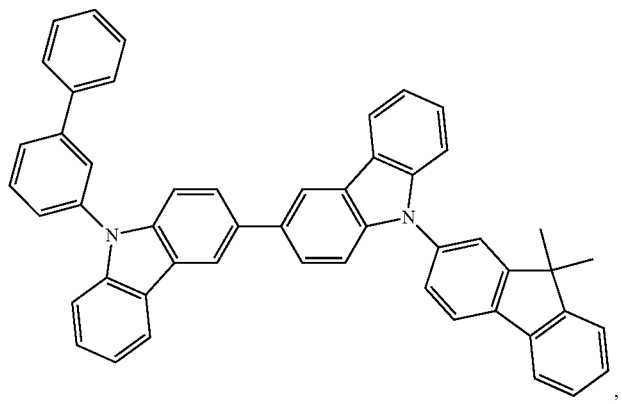
Compound F12
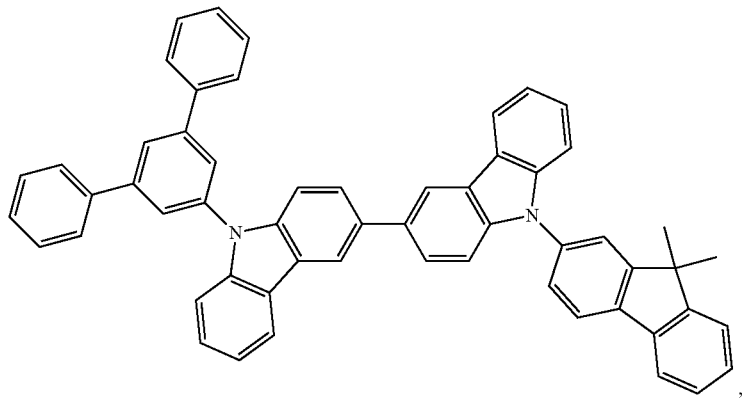
Compound F13
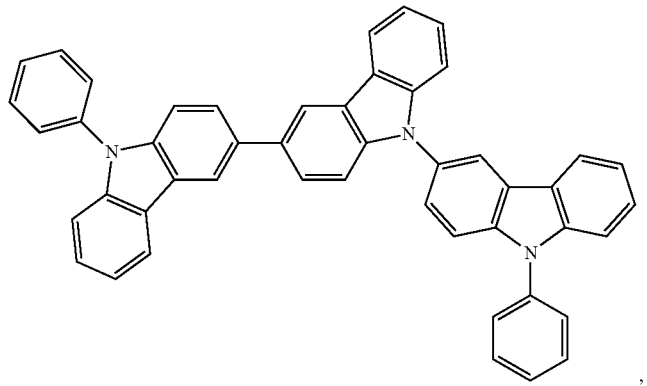

Compound F14
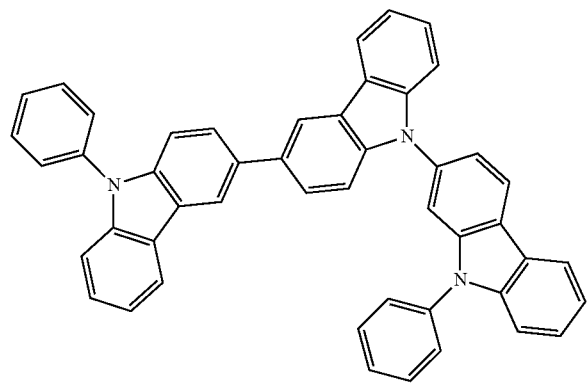
Compound F15
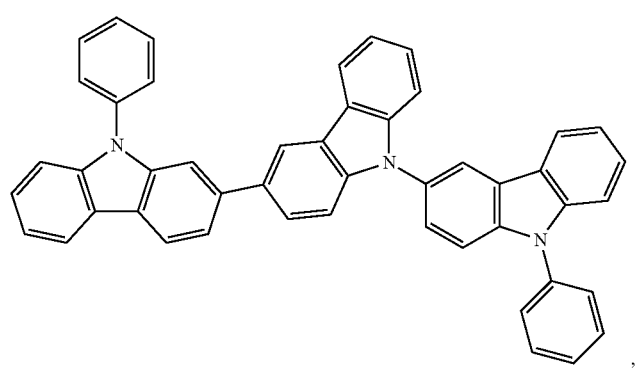
Compound F16
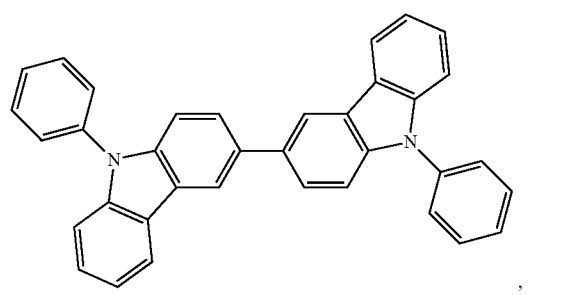
Compound F17
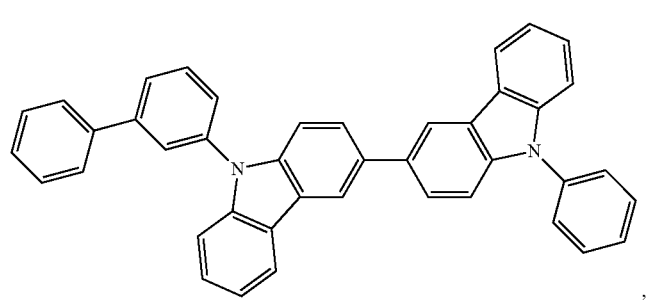

-continued
Compound F18
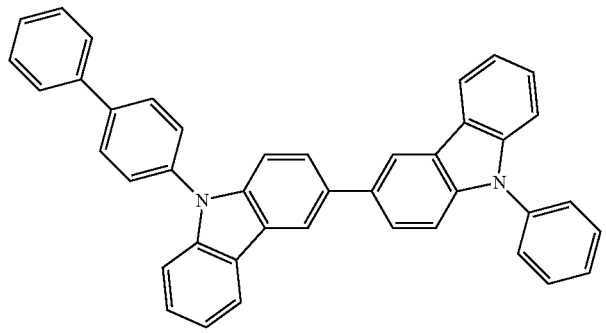
Compound F19
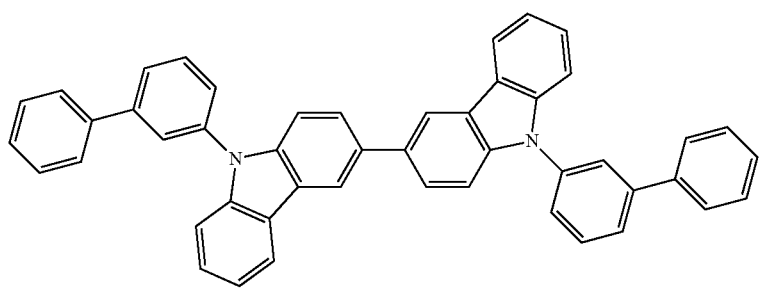
Compound F20
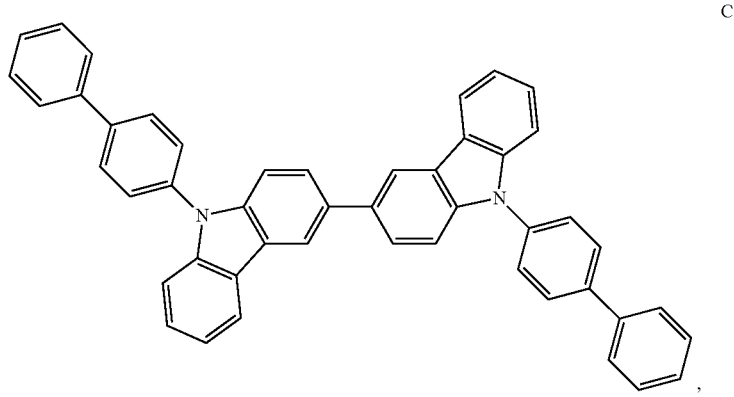
Compound F21
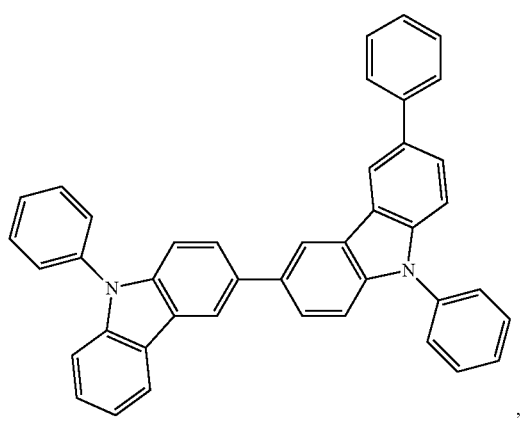

-continued
Compound F22
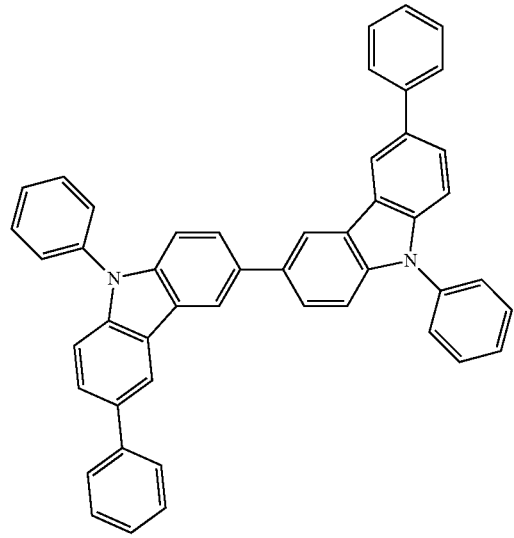
Compound F23
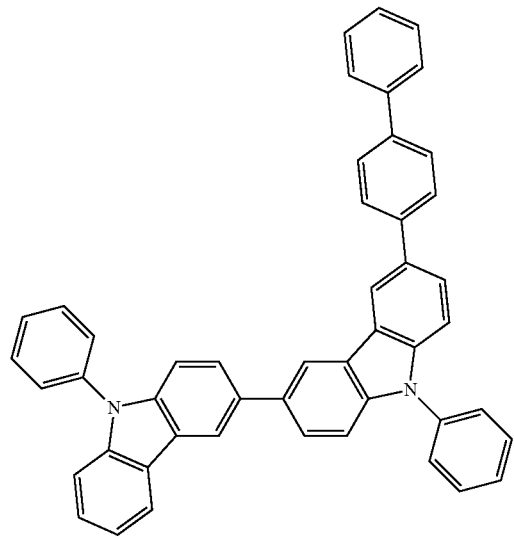
Compound F24
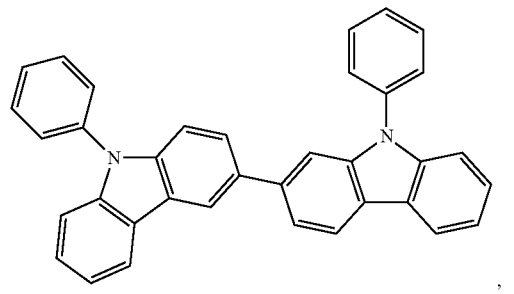

Compound F25
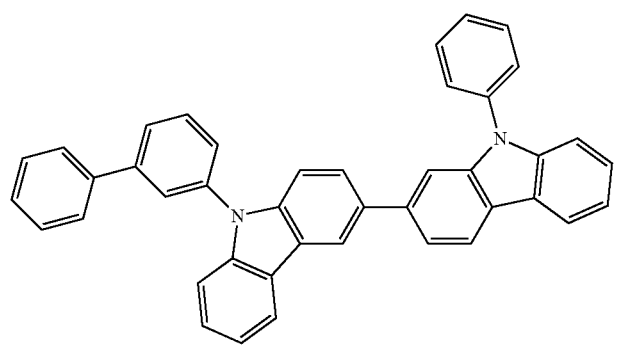
Compound F26
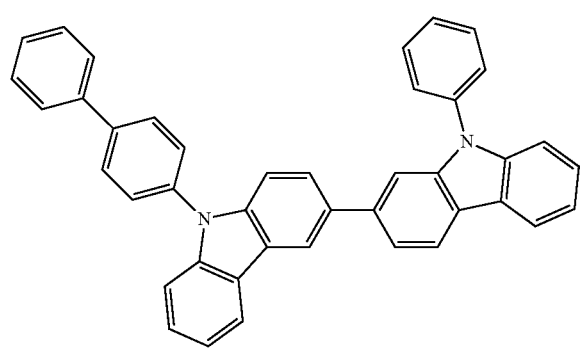
Compound F27
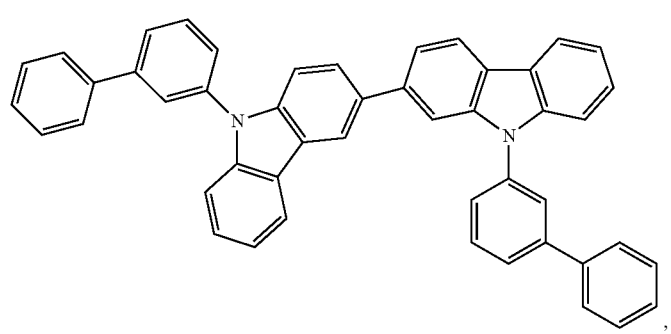
Compound F28
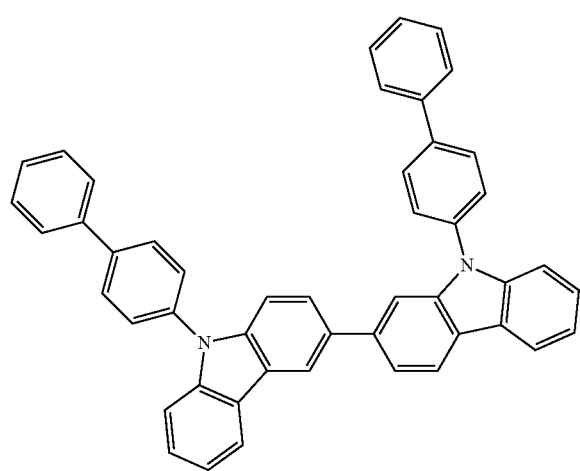

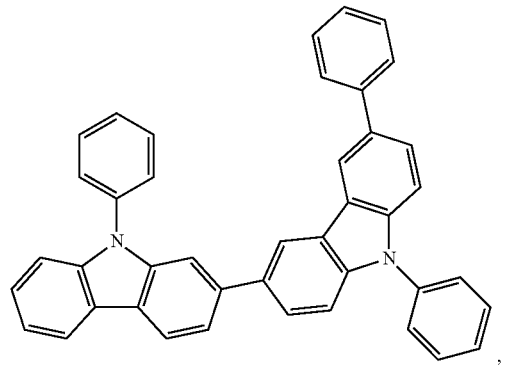
Compound F29
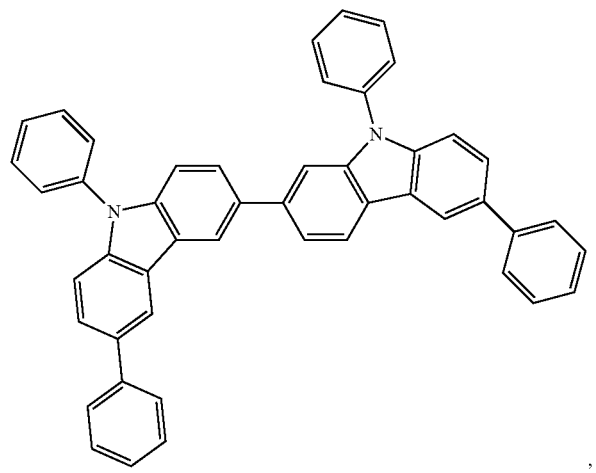
Compound F30
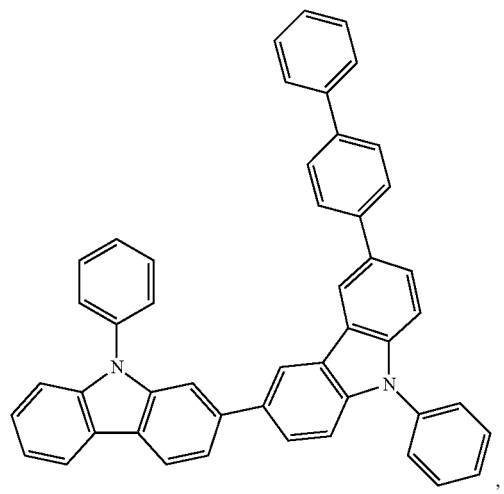
Compound F31

-continued
Compound F32
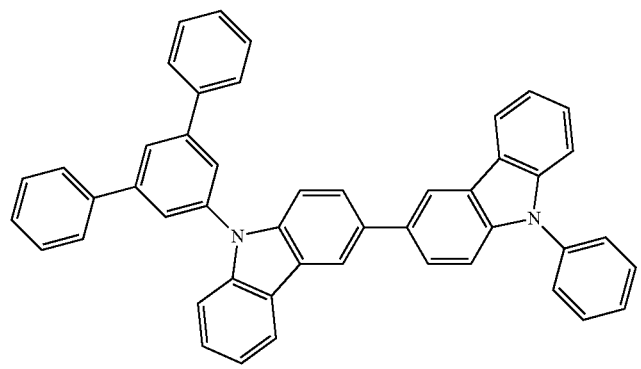
Compound F33
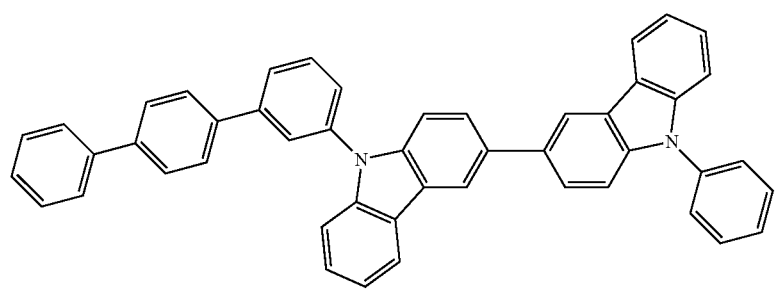
Compound F34
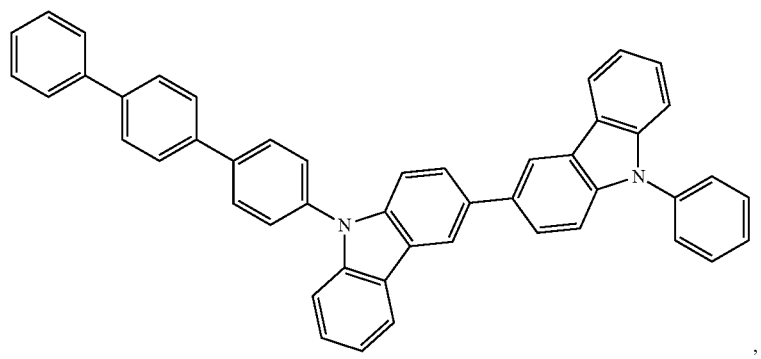
Compound F35
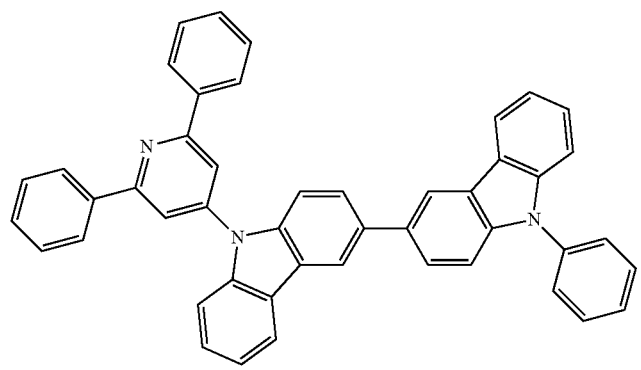

-continued

Compounds G1 through G3, each represented by the formula:

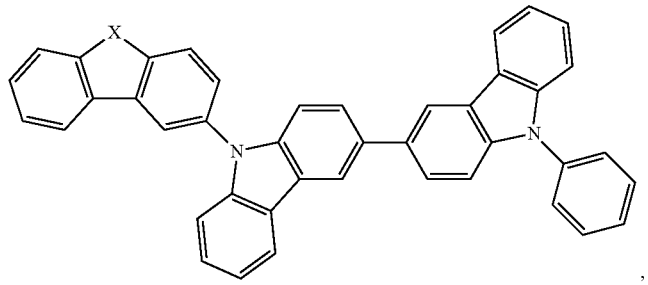

wherein in Compound G1: X = O,
In Compound G2, X = S, and
In Compound G3, X = Se Compounds G4 through G6, each represented by the formula:

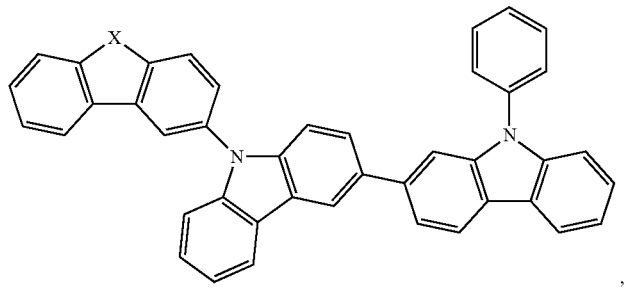

wherein in Compound G4: X = O,
In Compound G5, X = S, and
In Compound G6, X = Se Compounds G7 through G9, each represented by the formula:

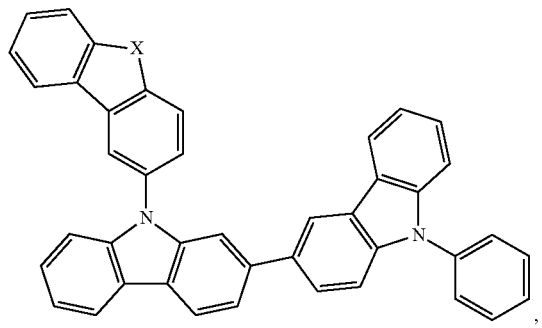

wherein in Compound G7: X = O,
In Compound G8, X = S, and
In Compound G9, X = Se Compounds G10 through G12, each represented by the formula:

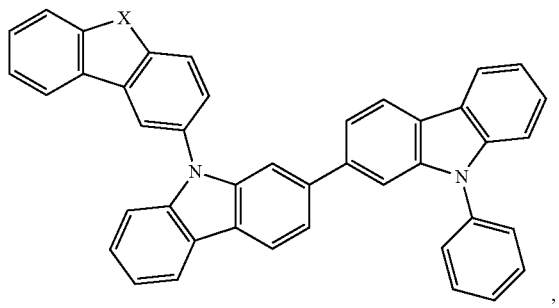

wherein in Compound G10: X = O,
In Compound G11, X = S, and
In Compound G12, X = Se Compounds G13 through G15, each represented by the formula:

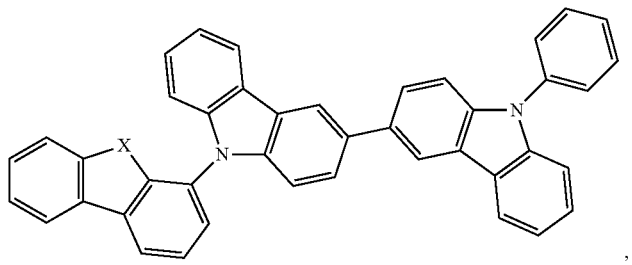

wherein in Compound G13: X = O,
In Compound G14, X = S, and
In Compound G15, X = Se Compounds G16 through G18, each represented by the formula:

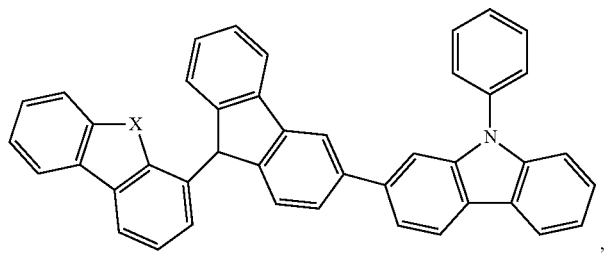

wherein in Compound G16: X = O,
In Compound G17, X = S, and
In Compound G18, X = Se Compounds G19 through G21, each represented by the formula:

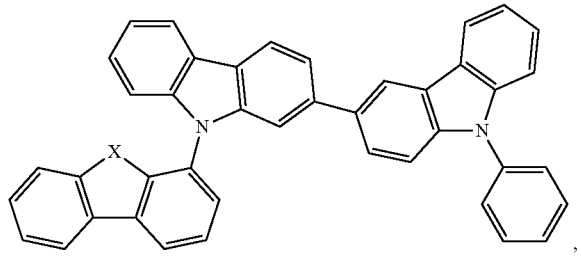

wherein in Compound G19: X = O,
In Compound G20, X = S, and
In Compound G21, X = Se Compounds G22 through G24, each represented by the formula:

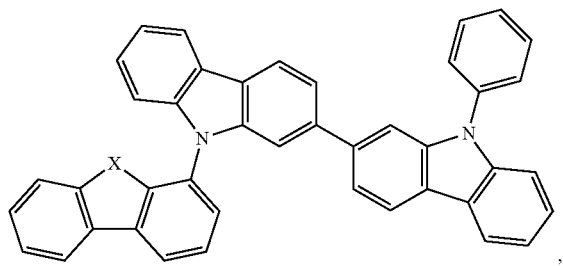

wherein in Compound G22: X = O,
In Compound G23, X = S, and
In Compound G24, X = Se -continued Compounds G25 through G27, each represented by the formula:

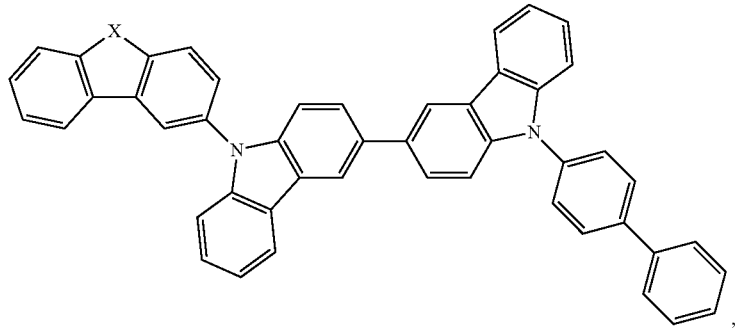

wherein in Compound G25: X = O,
In Compound G26, X = S, and
In Compound G27, X = Se Compounds G28 through G30, each represented by the formula:

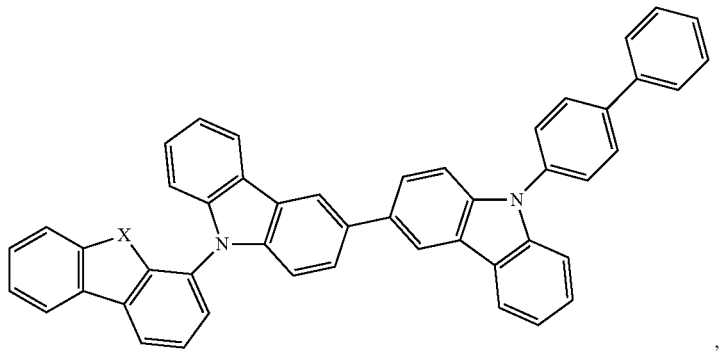

wherein in Compound G28: X = O,
In Compound G29, X = S, and
In Compound G30, X = Se Compounds G31 through G33, each represented by the formula:

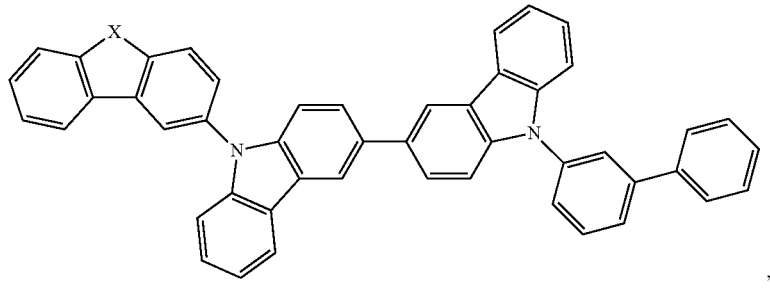

wherein in Compound G31: X = O,
In Compound G32, X = S, and
In Compound G33, X = Se Compounds G34 through G36, each represented by the formula:

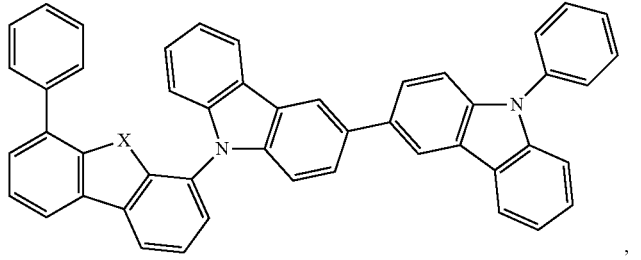

wherein in Compound G34: X = O,
In Compound G35, X = S, and
In Compound G36, X = Se -continued Compounds G37 through G39, each represented by the formula:

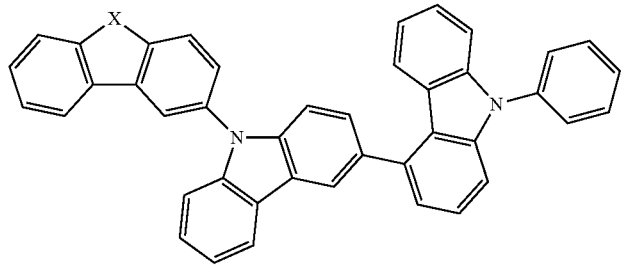

wherein in Compound G37: X = O,
In Compound G38, X = S, and
In Compound G39, X = Se Compounds G40 through G42, each represented by the formula:

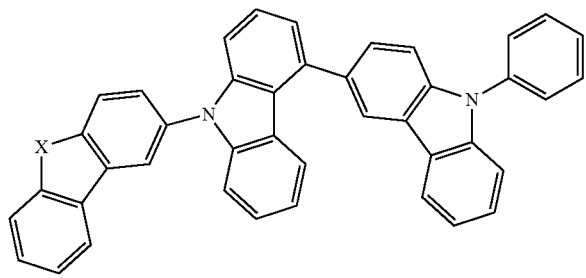

wherein in Compound G40: X = O,
In Compound G41, X = S, and
In Compound G42, X = Se Compounds G43 through G45, each represented by the formula:

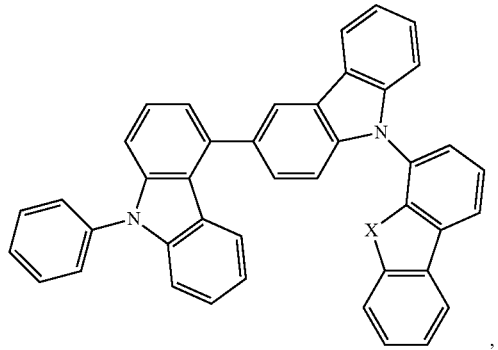

wherein in Compound G43: X = O,
In Compound G44, X = S, and
In Compound G45, X = Se Compounds G46 through G48, each represented by the formula:

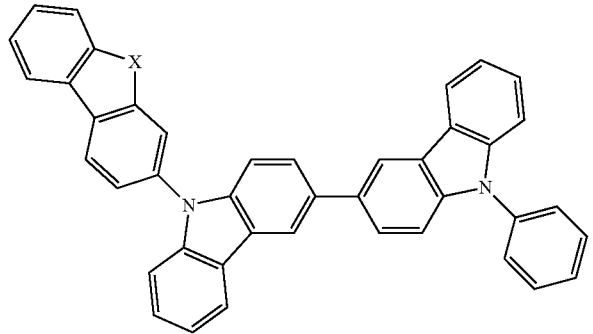

wherein in Compound G46: X = O,
In Compound G47, X = S, and
In Compound G48, X = Se -continued Compounds G49 through G51, each represented by the formula:

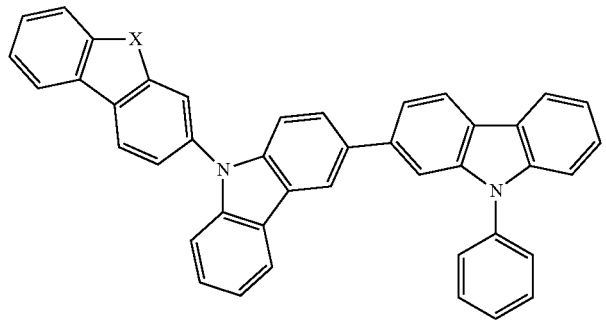

wherein in Compound G49: X = O,
In Compound G50, X = S, and
In Compound G51, X = Se Compounds G52 through G54, each represented by the formula:

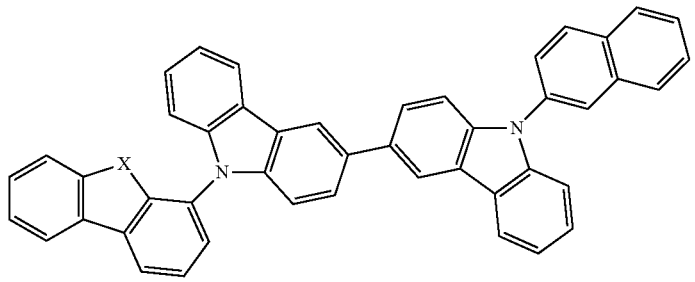

wherein in Compound G49: X = O,
In Compound G50, X = S, and
In Compound G51, X = Se Compounds G55 through G56, each represented by the formula:

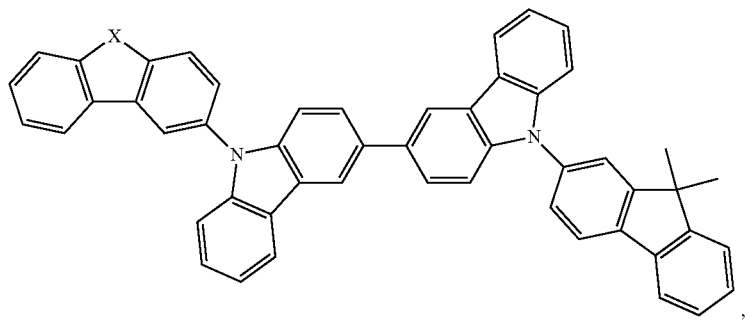

wherein in Compound G55: X = O,
In Compound G56, X = S, and
In Compound G57, X = Se -continued Compounds G58 through G60, each represented by the formula:

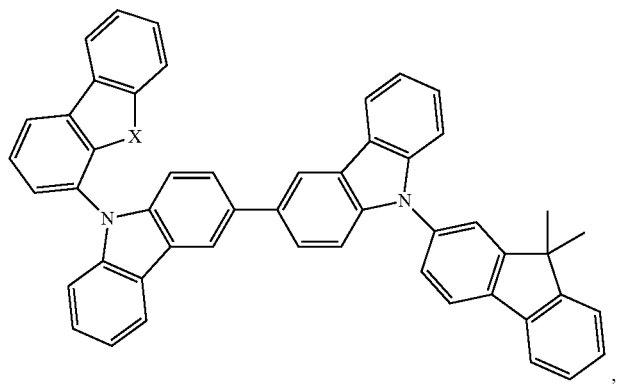

wherein in Compound G58: X = O,
In Compound G59, X = S, and
In Compound G60, X = Se Compound H1 through H3, each represented by the formula

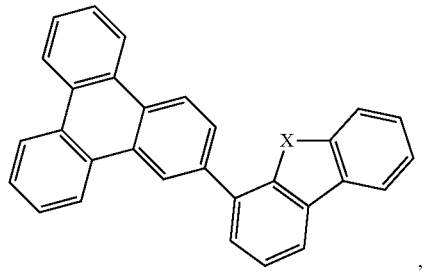

wherein in Compound H1: X = O,
In Compound H2: X = S,
In Compound H3: X = Se

Compound H4 through H6, each represented by the formula

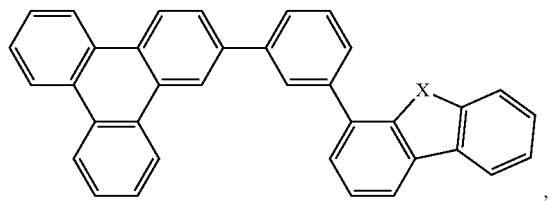

wherein in Compound H4: X = O,
In Compound H5: X = S,
In Compound H6: X = Se

Compound H7 through H9, each represented by the formula

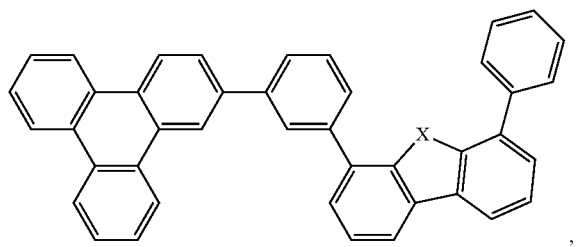

wherein in Compound H7: X = O,
In Compound H8: X = S,
In Compound H9: X = Se

-continued
Compound H10 through H12, each represented by the formula
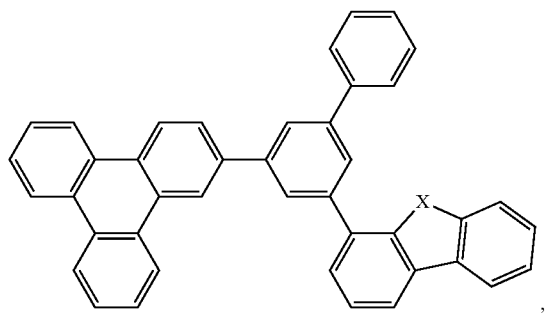
wherein in Compound H10: X = O,
In Compound H11: X = S,
In Compound H12: X = Se
Compound H13 through H15, each represented by the formula
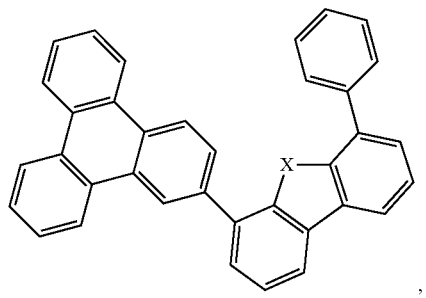
wherein in Compound H13: X = O,
In Compound H14: X = S,
In Compound H15: X = Se
Compound H16 through H18, each represented by the formula
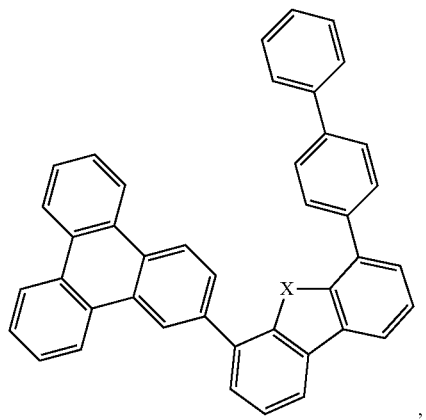
wherein in Compound H16: X = O,
In Compound H17: X = S,
In Compound H18: X = Se -continued
Compound H19 through H21, each represented by the formula
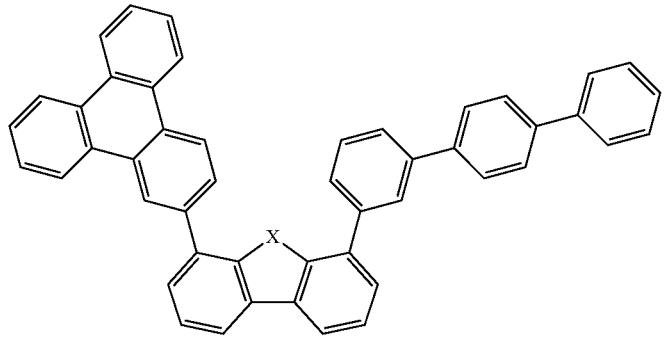
wherein in Compound H19: X = O,
In Compound H20: X = S,
In Compound H21: X = Se
Compound H22 through H24, each represented by the formula
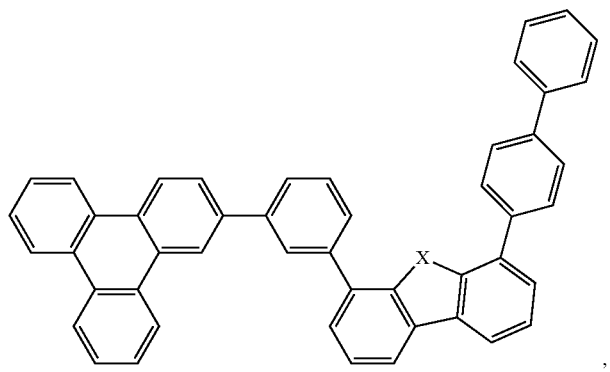
wherein in Compound H22: X = O,
In Compound H23: X = S,
In Compound H24: X = Se
Compound H25 through H27, each represented by the formula
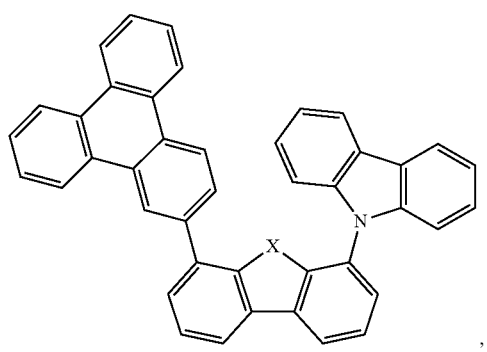
wherein in Compound H25: X = O,
In Compound H26: X = S,
In Compound H27: X = Se -continued
Compound H28
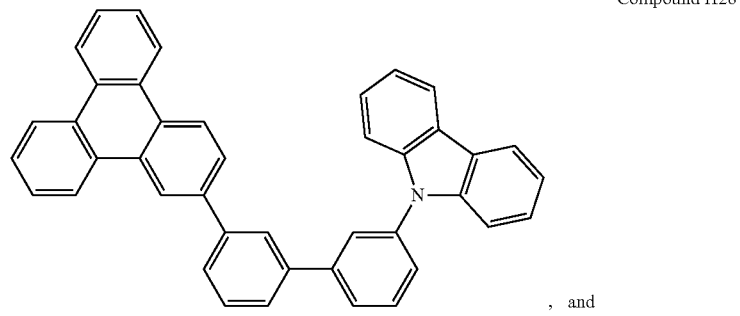
, and
Compound H29
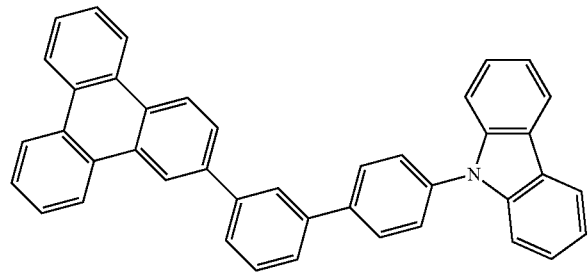
.
The emitter material can be a transition metal complex having at east one ligand selected from the group consisting of:
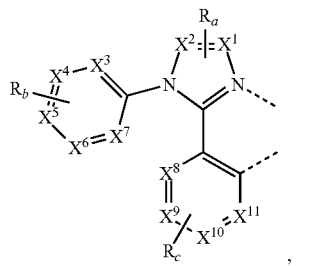
,
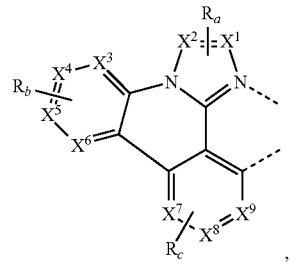
,
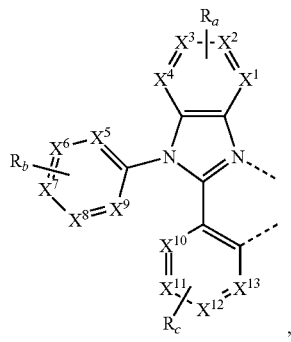
,
-continued
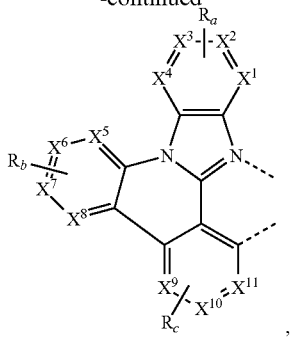
,
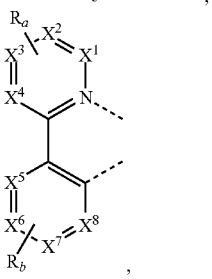
,
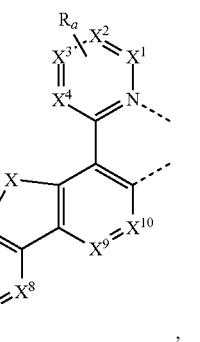
, -continued

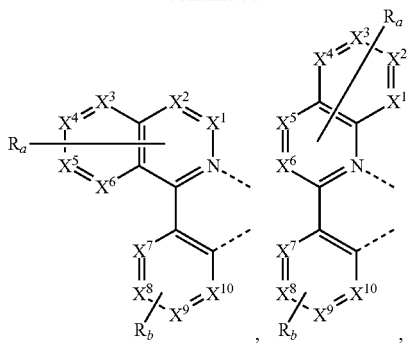

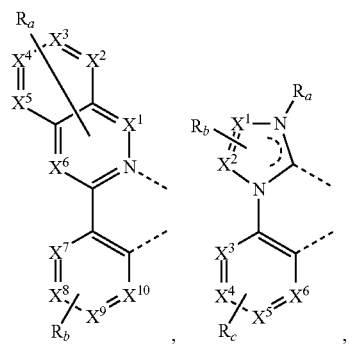

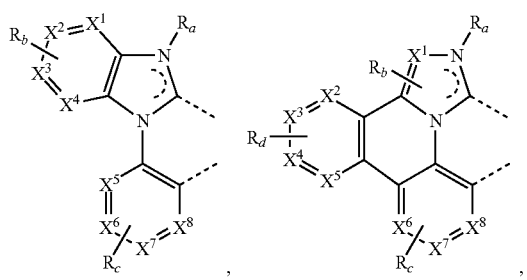

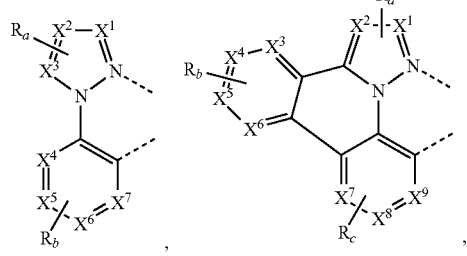

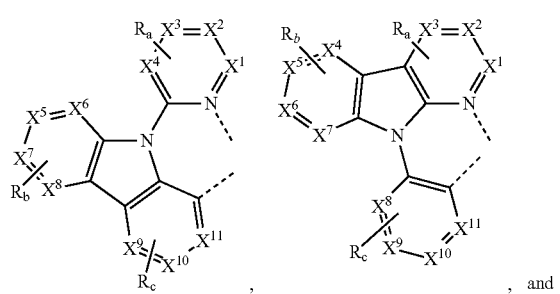

-continued

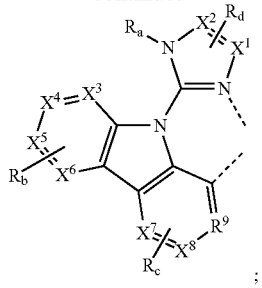

wherein each $X^1$ to $X^{13}$ are independently selected from the group consisting of carbon and nitrogen;

wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrite, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

In other embodiments, the emitter is a transition metal complex having at least one ligand selected from the group consisting of:

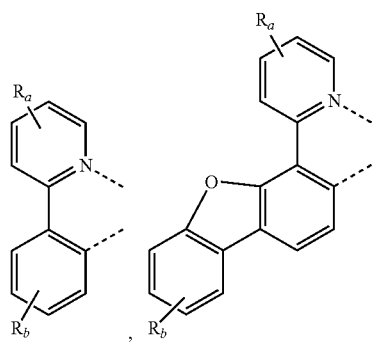

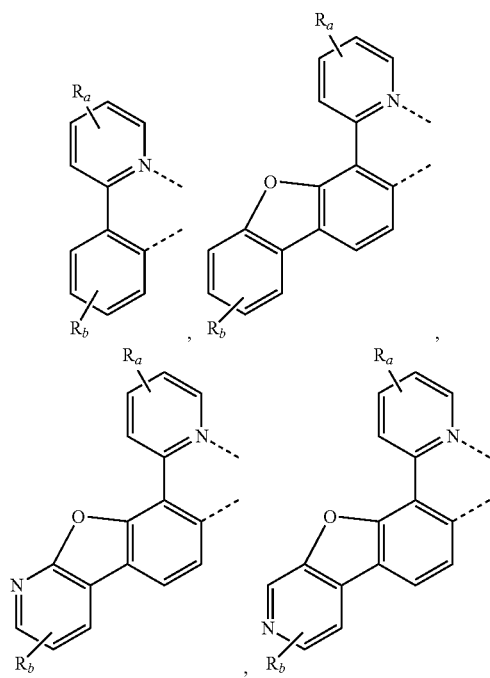

-continued
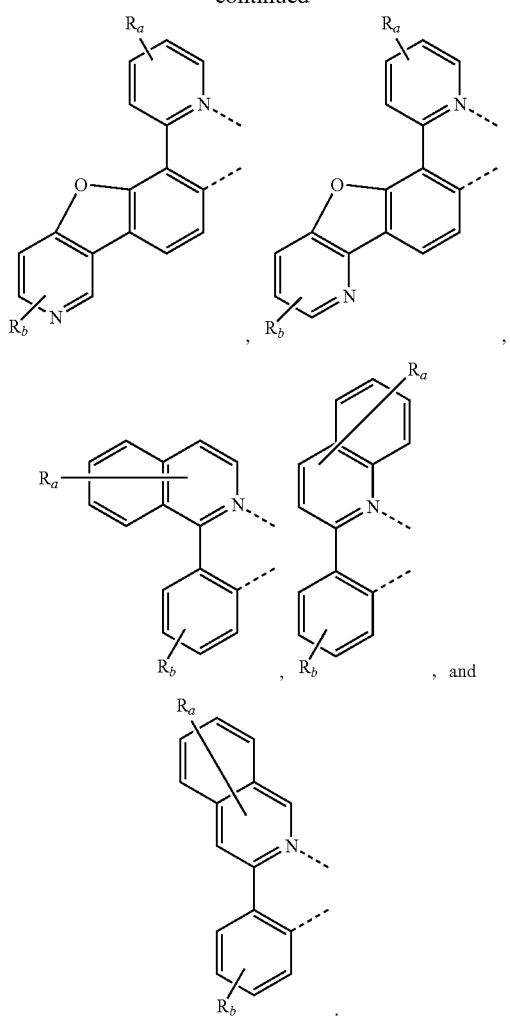
, and
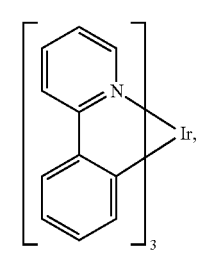
.
In other embodiments, the emitter is selected from the group consisting of:
Emitter 1
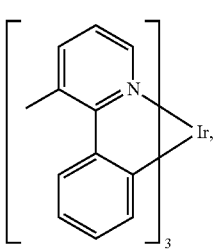
Emitter 2
-continued
Emitter 3
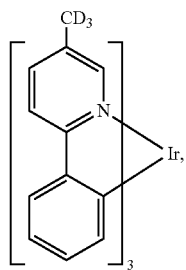
Emitter 4
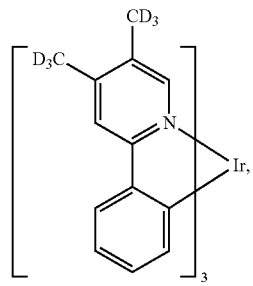
Emitter 5
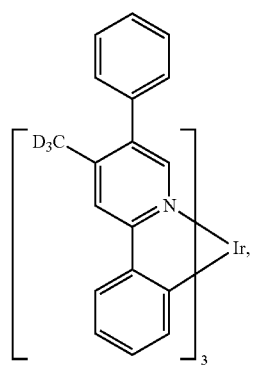
Emitter 6
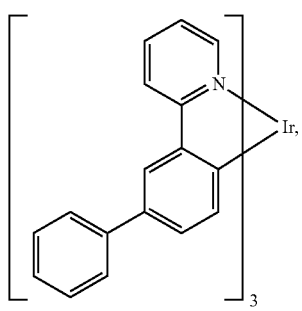
Emitter 7
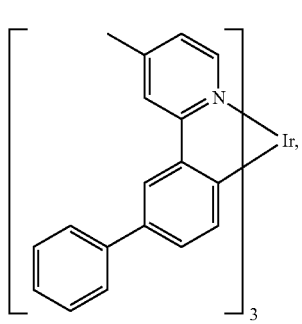

-continued
Emitter 8
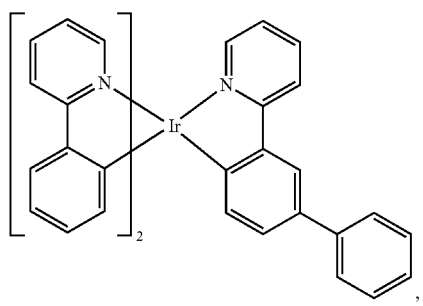
Emitter 9
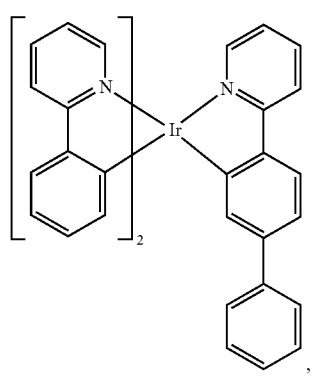
Emitter 10
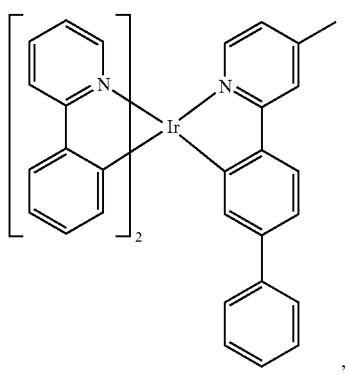
Emitter 11
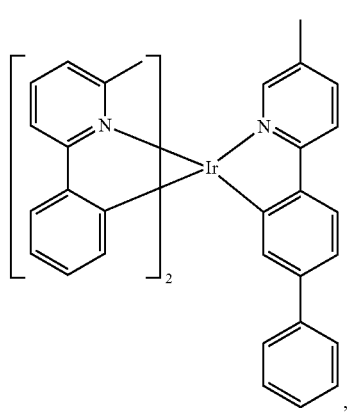
-continued
Emitter 12
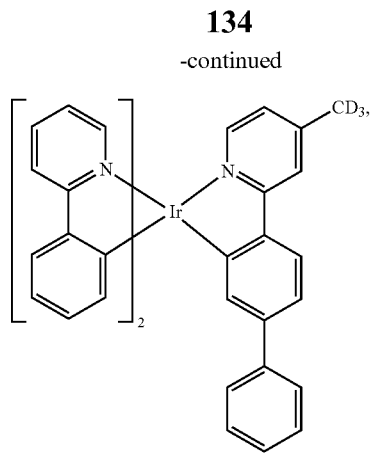
Emitter 13
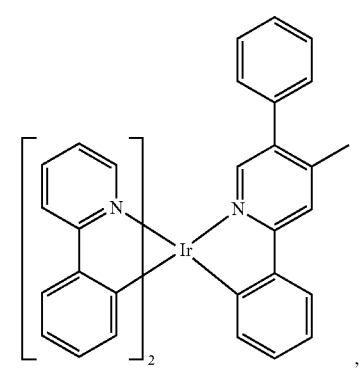
Emitter 14
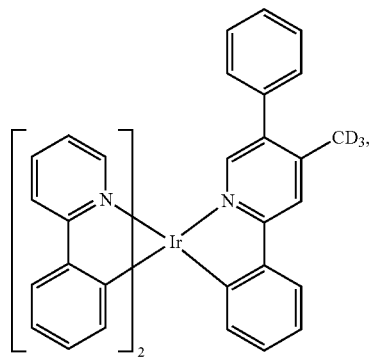
Emitter 15
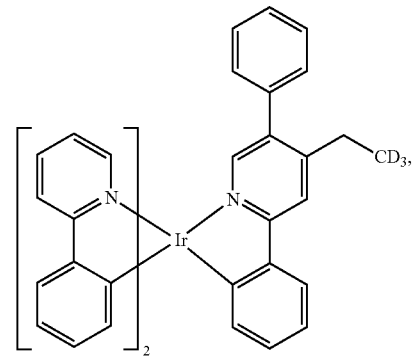

Emitter 16
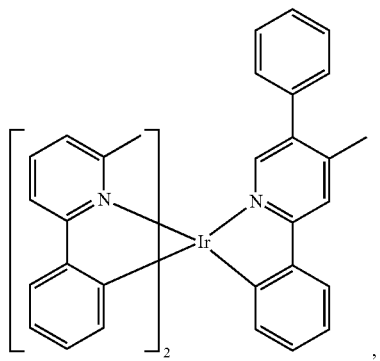
Emitter 17
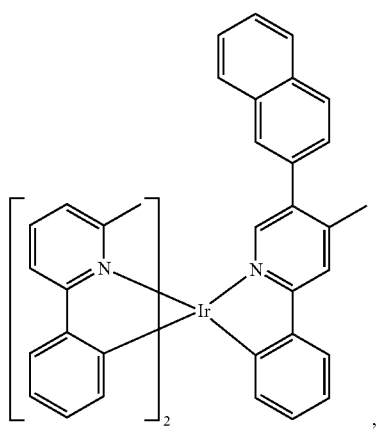
Emitter 18
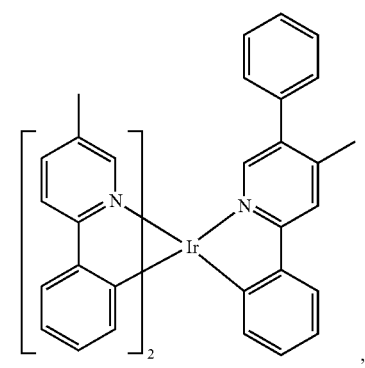
Emitter 19
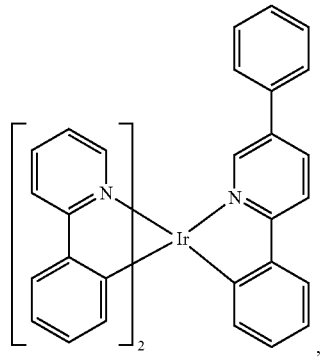
Emitter 20
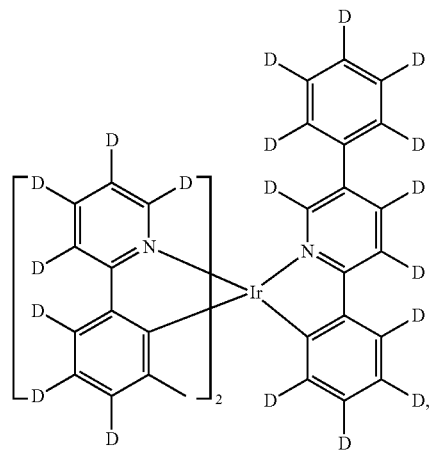
Emitter 21
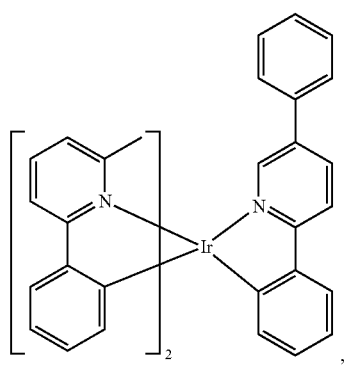
Emitter 22
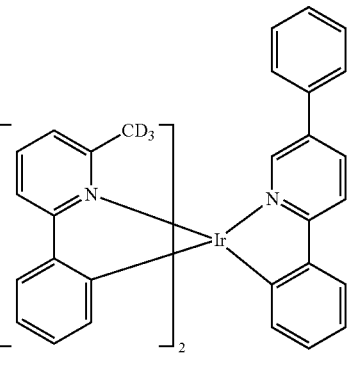
Emitter 23
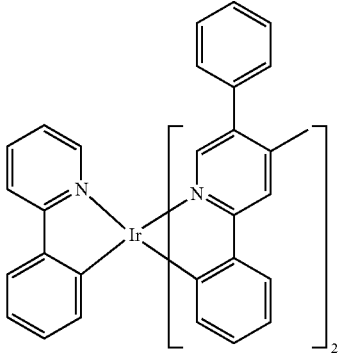

Emitter 24
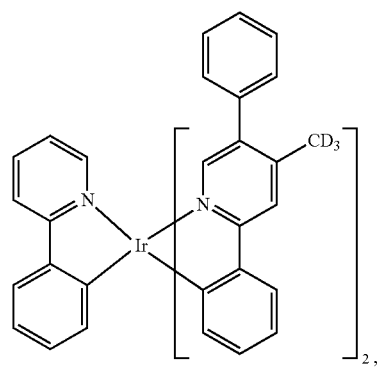
Emitter 25
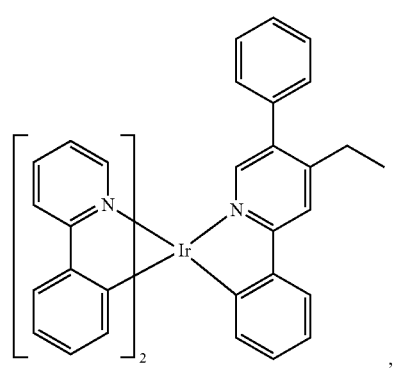
Emitter 26
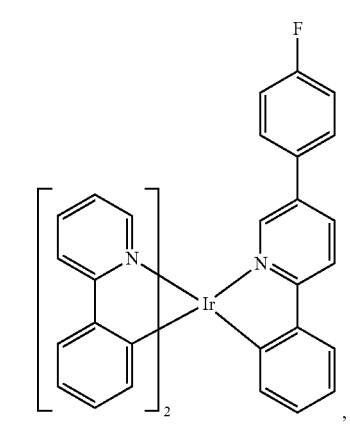
Emitter 27
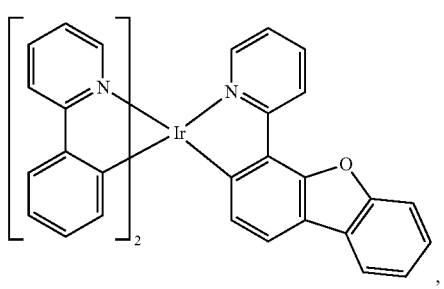
Emitter 28
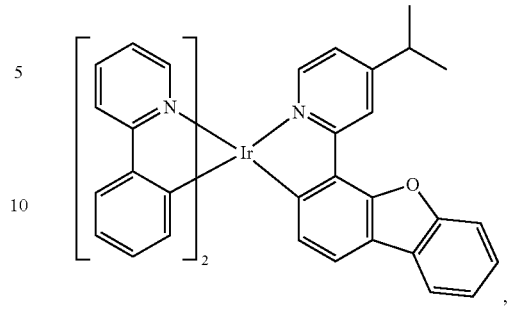
Emitter 29
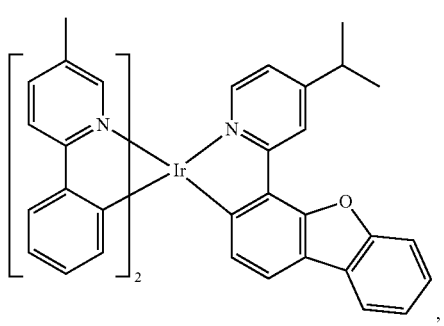
Emitter 30
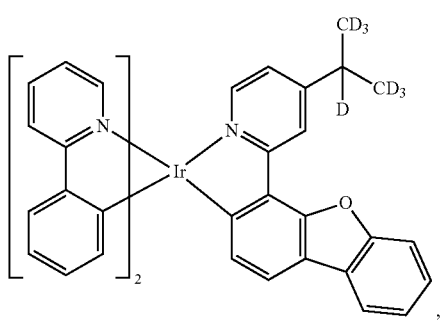
Emitter 31
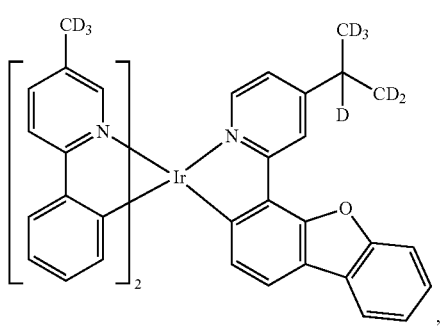
Emitter 32
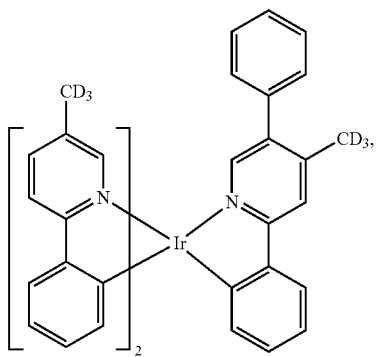

Emitter 33
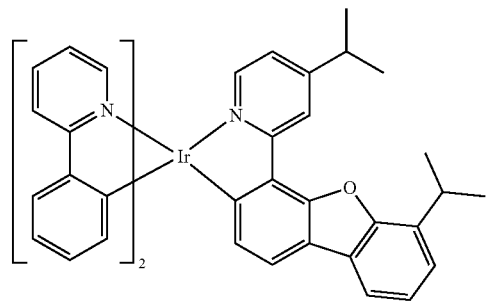
Emitter 34
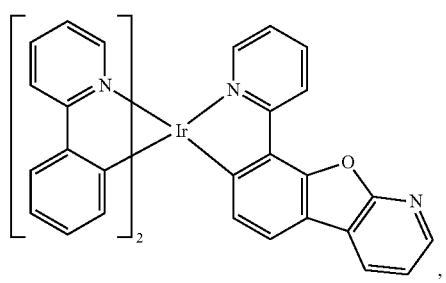
Emitter 35
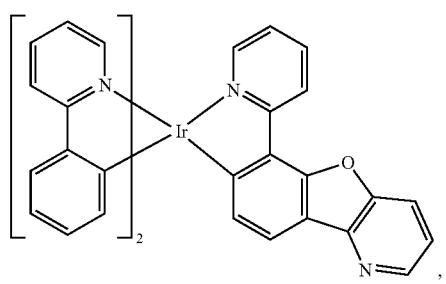
Emitter 36
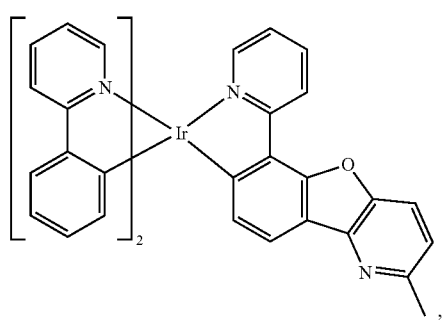
Emitter 37
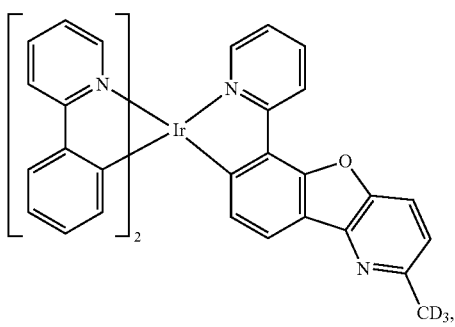
Emitter 38
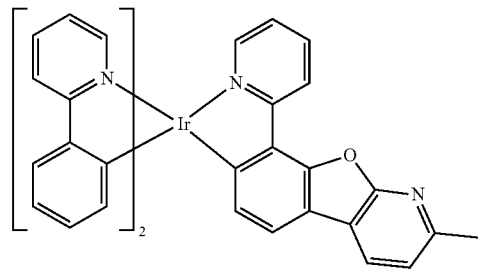
Emitter 39
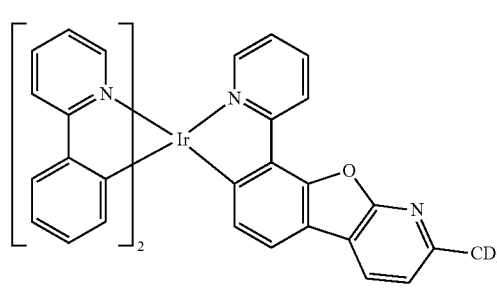
Emitter 40
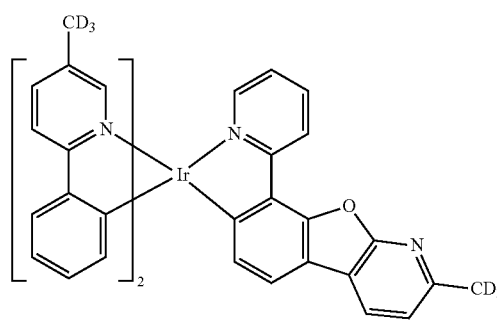
Emitter 41
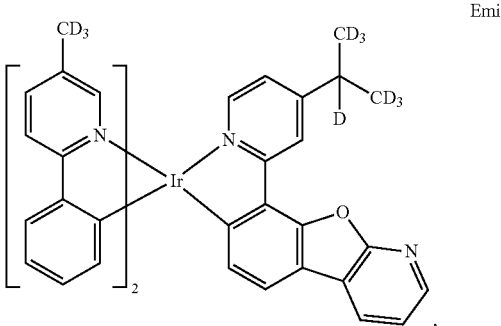
Emitter 42
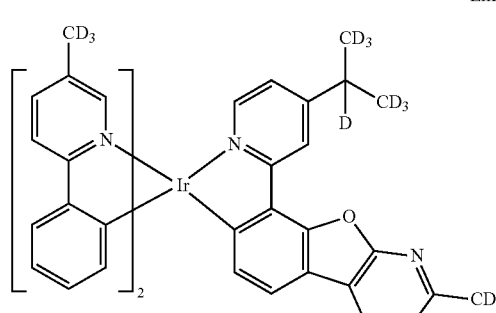

Emitter 43
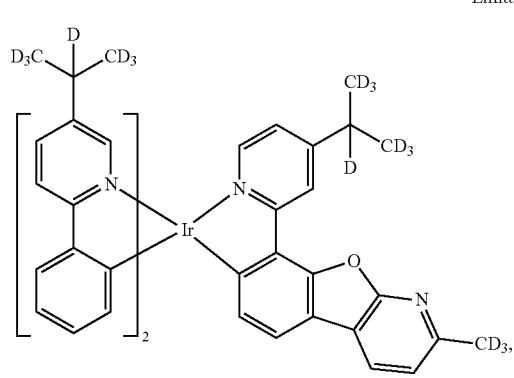
Emitter 44
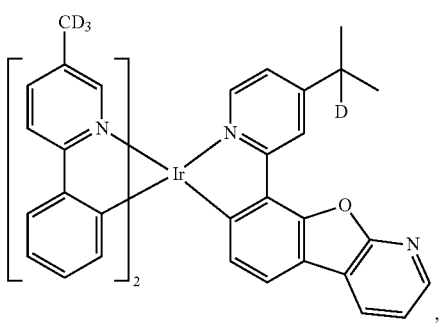
Emitter 45
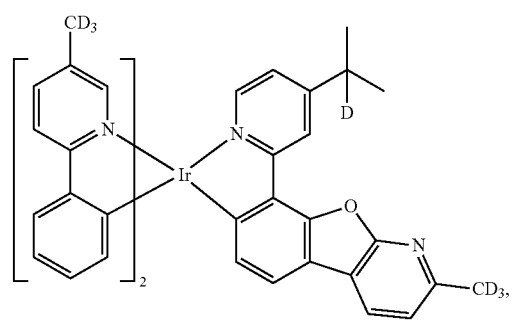
Emitter 46
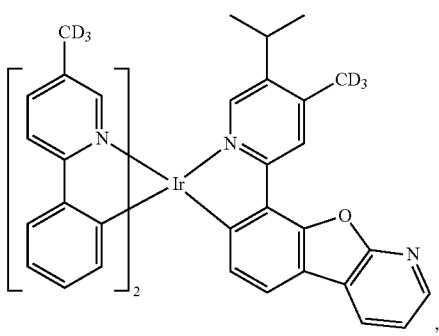
Emitter 47
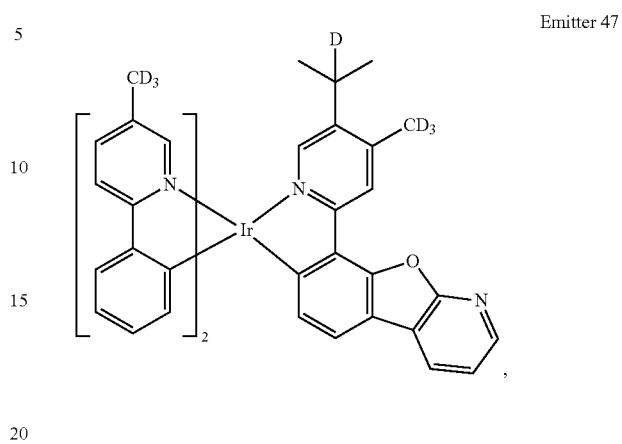
Emitter 48
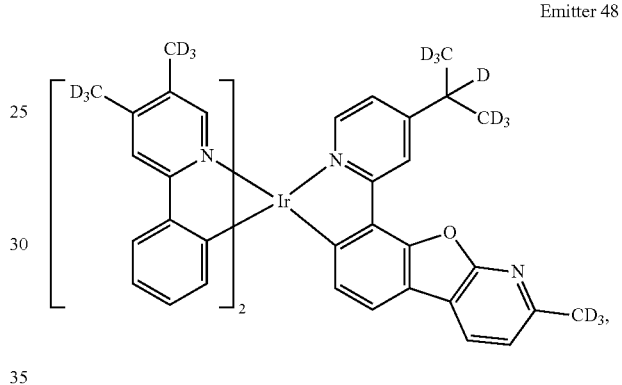
Emitter 49
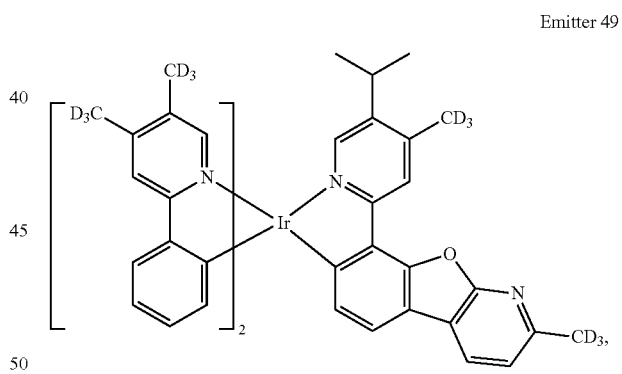
Emitter 50
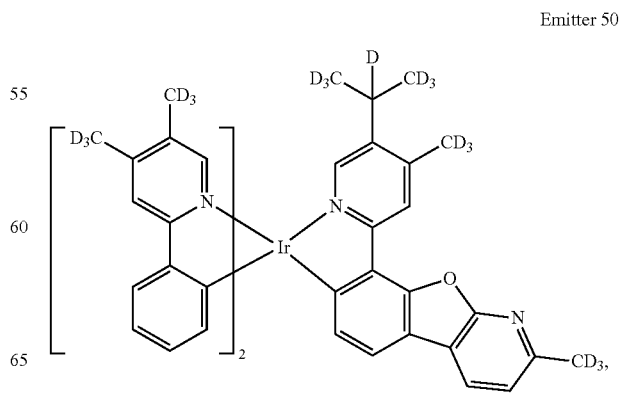

Emitter 51
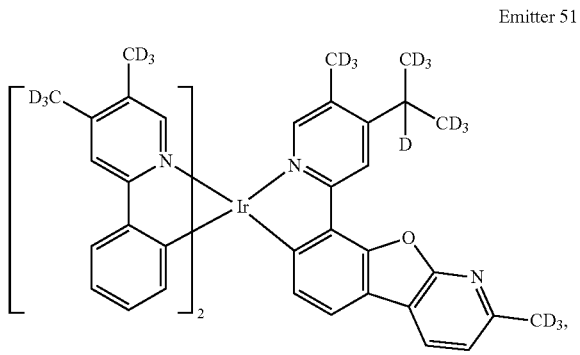
Emitter 52
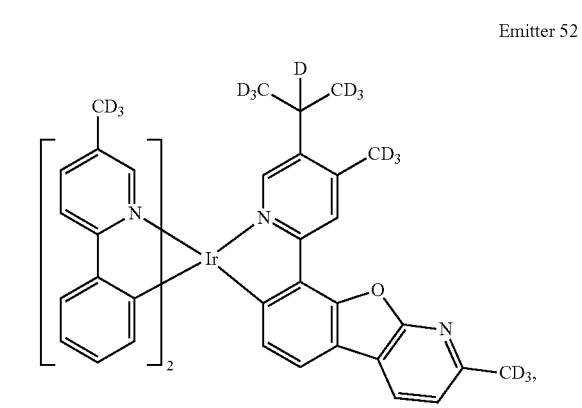
Emitter 53
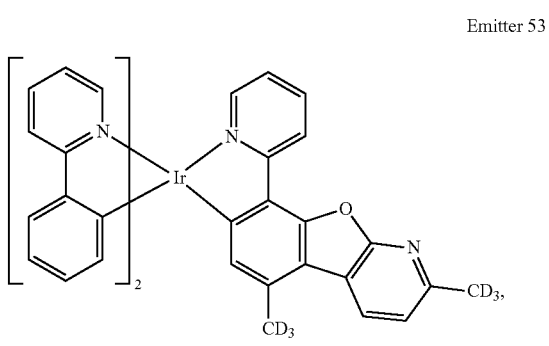
Emitter 54
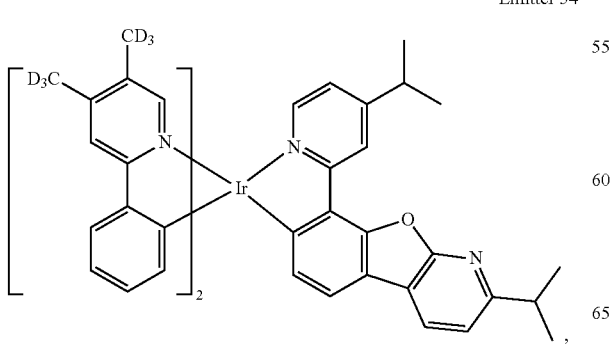
Emitter 55
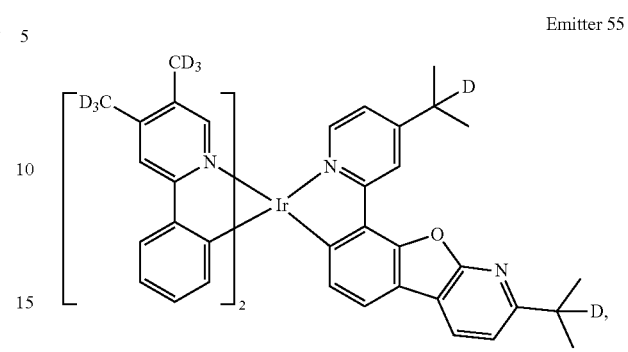
Emitter 56
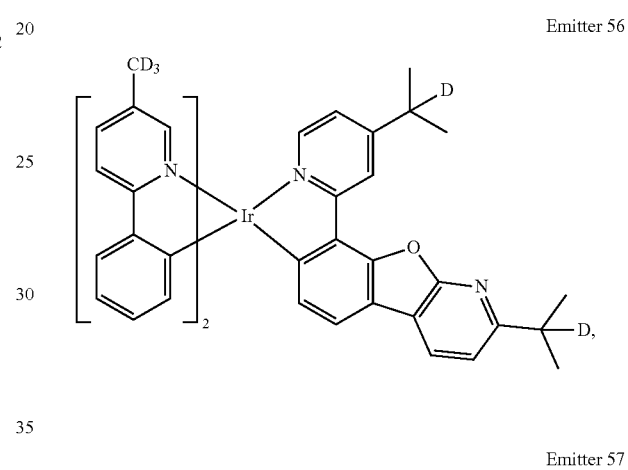
Emitter 57
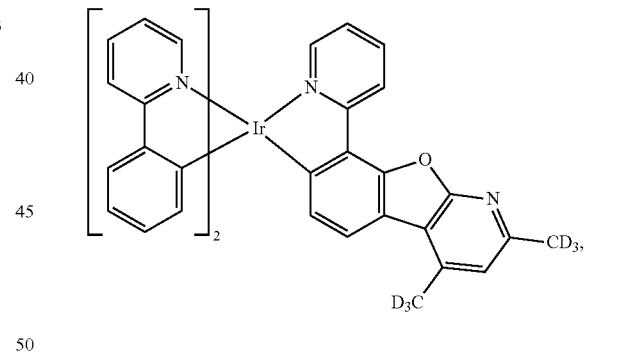
Emitter 58
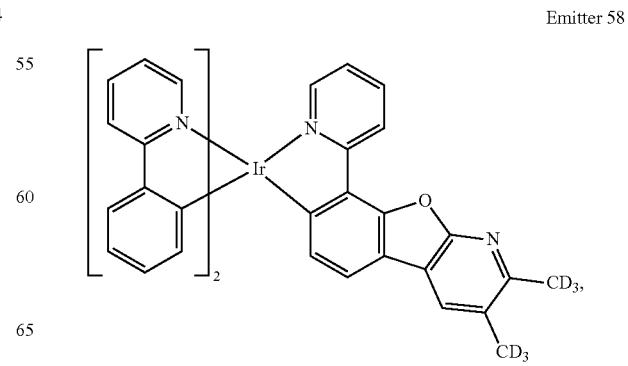

Emitter 59
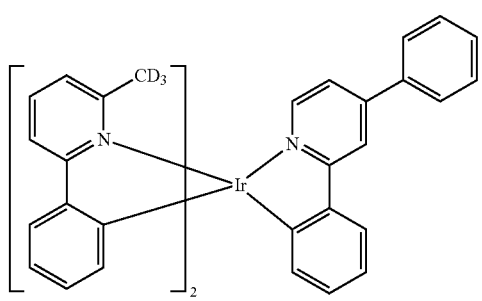
Emitter 60
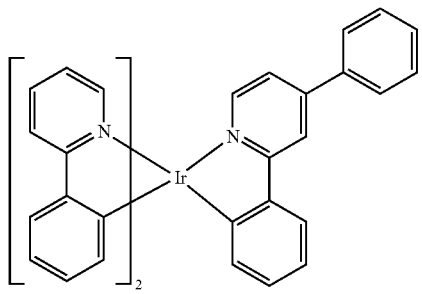
Emitter 61
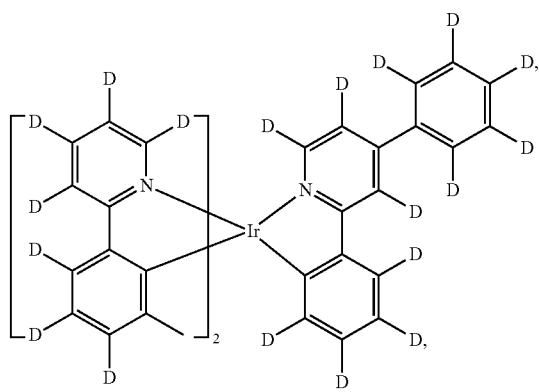
Emitter 62
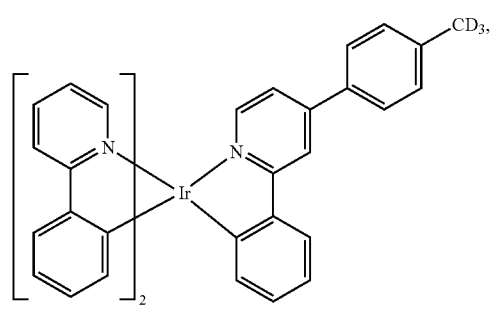
Emitter 63
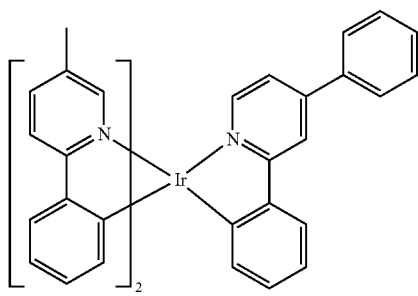
Emitter 64
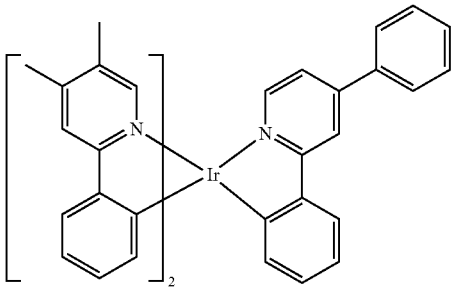
Emitter 65
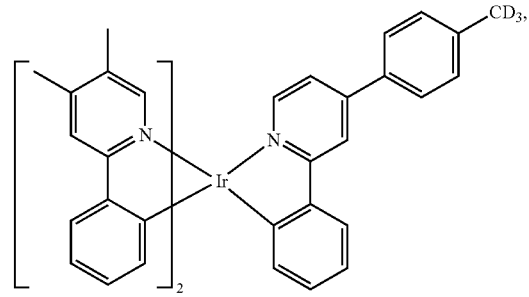
Emitter 66
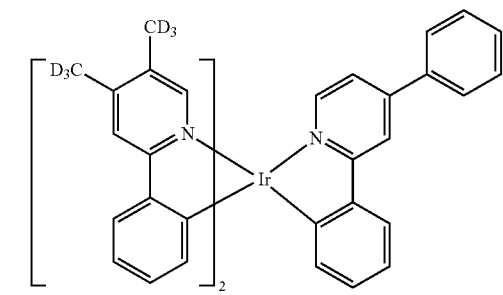
Emitter 67
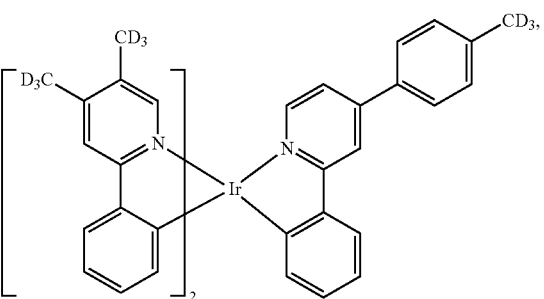
Emitter 68
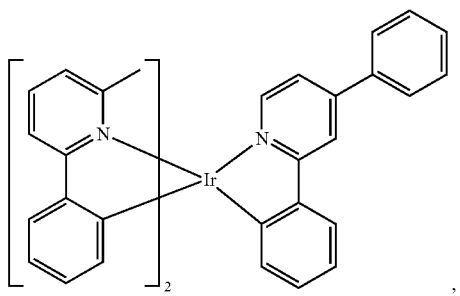

Emitter 69
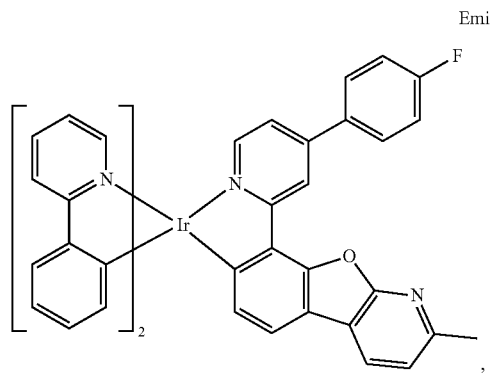
Emitter 70
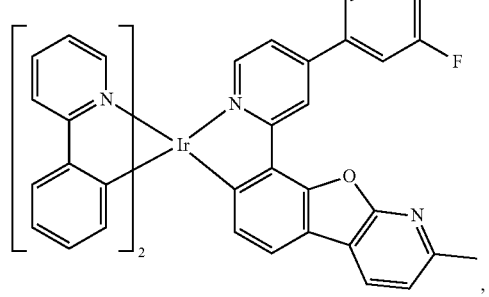
Emitter 71
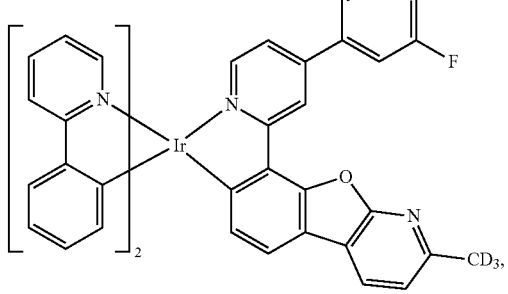
Emitter 72
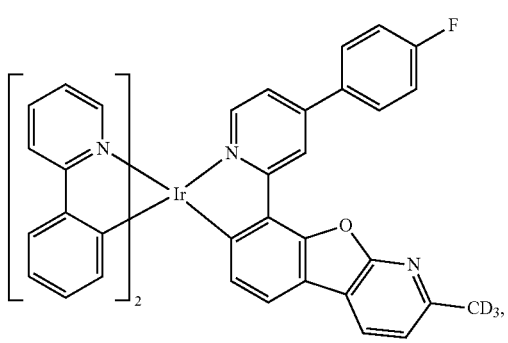
Emitter 73
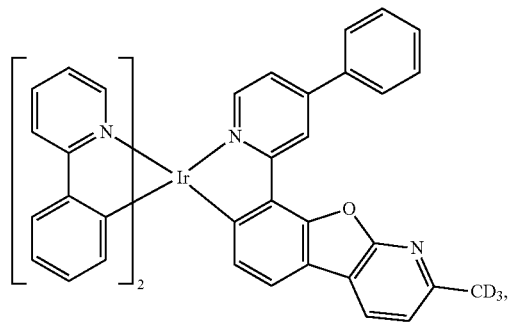
Emitter 74
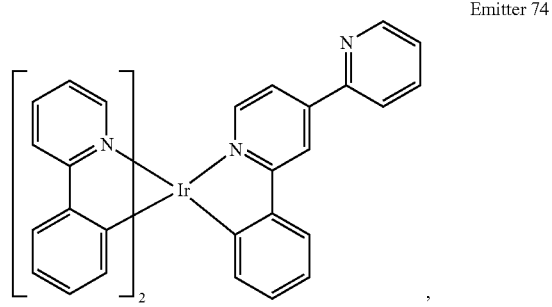
Emitter 75
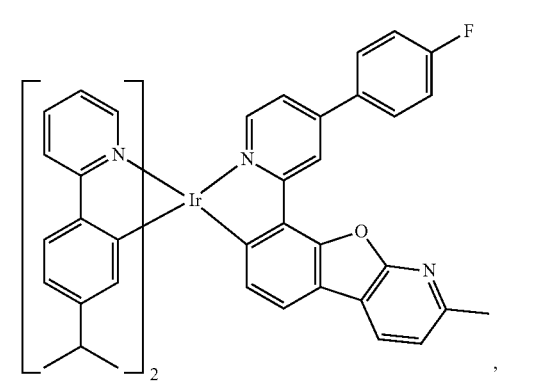
Emitter 76
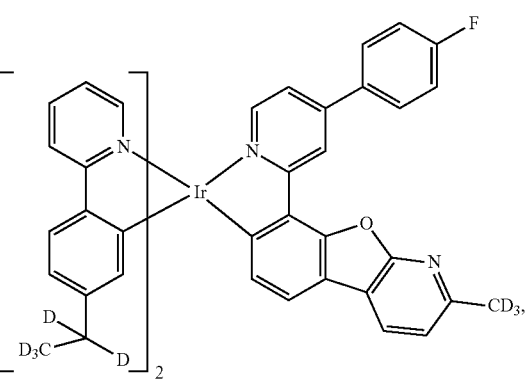

Emitter 77
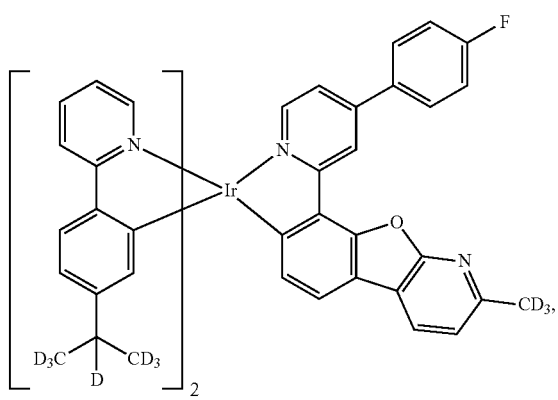
Emitter 78
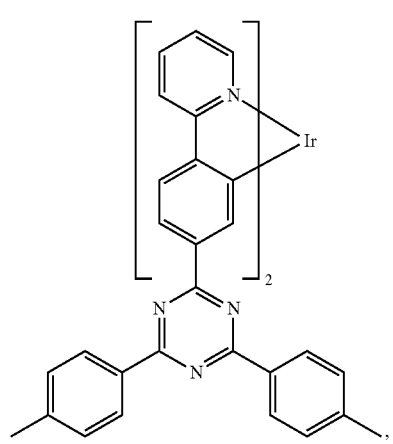
Emitter 79
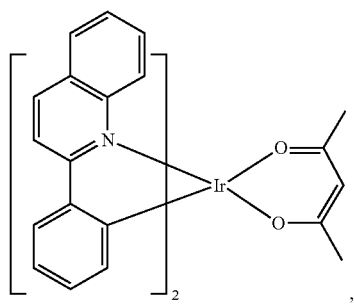
Emitter 80
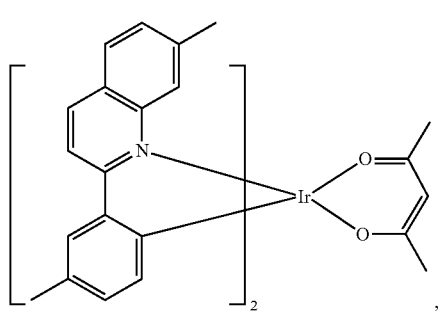
Emitter 81
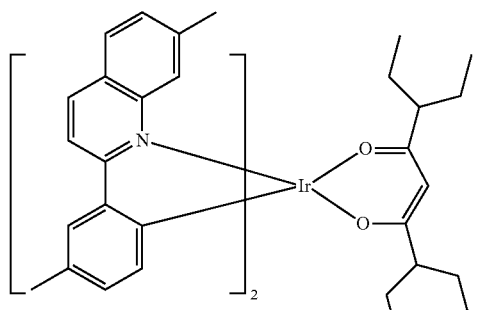
Emitter 82
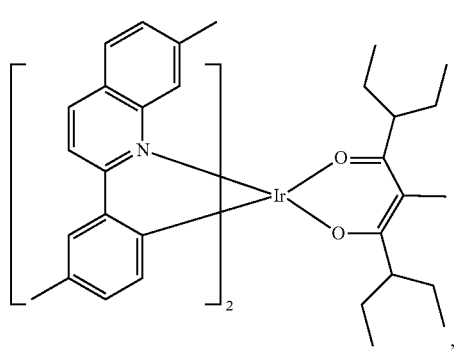
Emitter 83
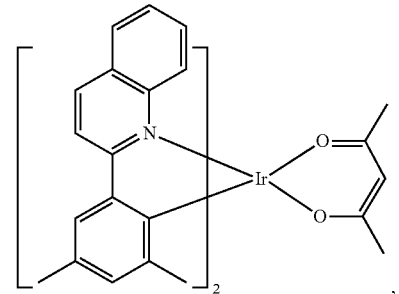
Emitter 84
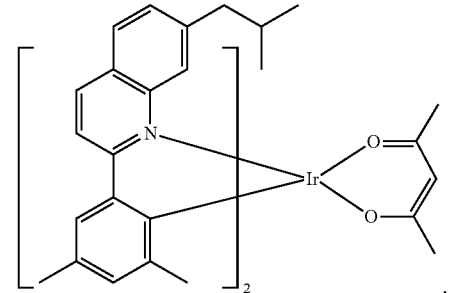
Emitter 85
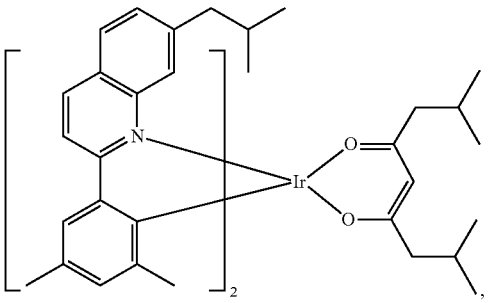

Emitter 86
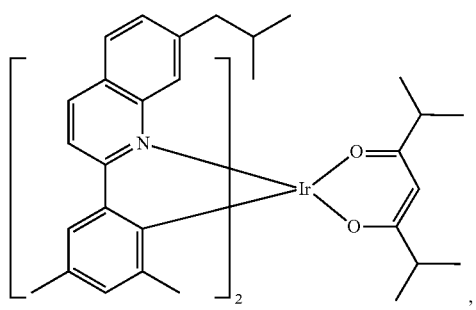
Emitter 87
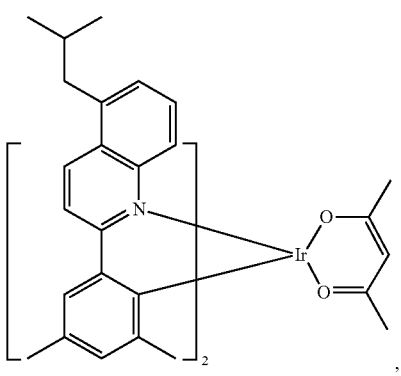
Emitter 88
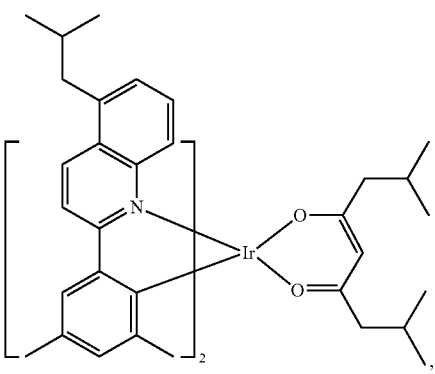
Emitter 89
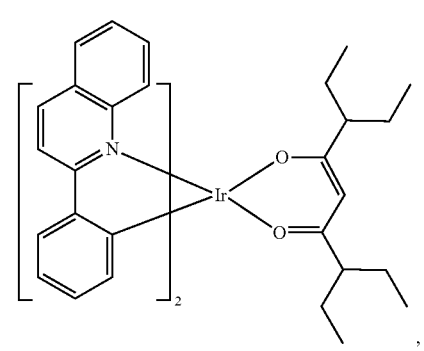
Emitter 90
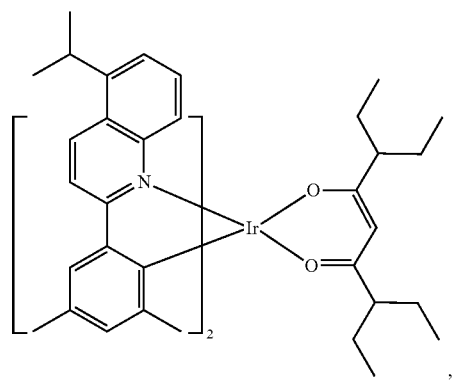
Emitter 91
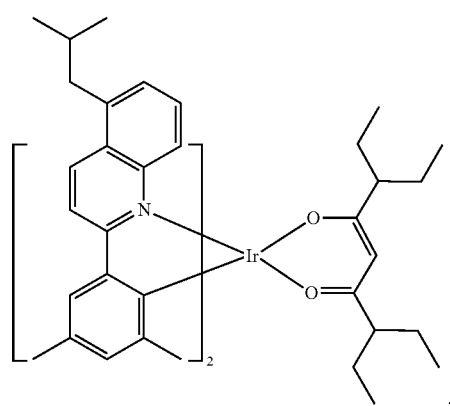
Emitter 92
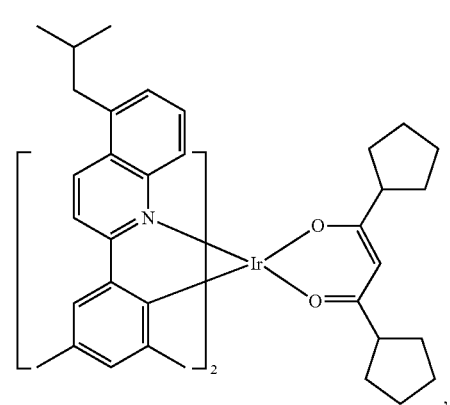
Emitter 93
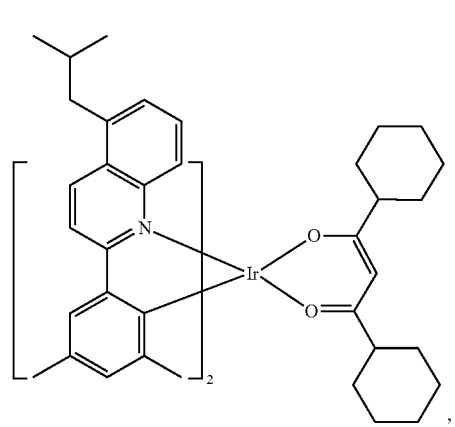

Emitter 94
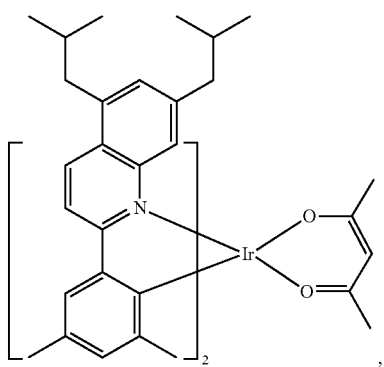
Emitter 95
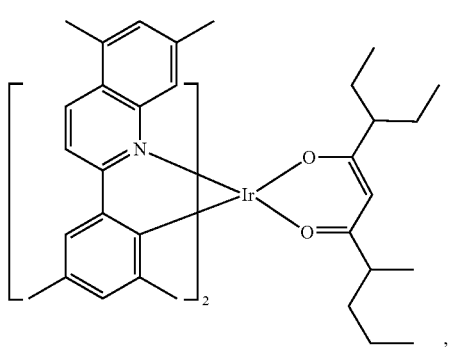
Emitter 96
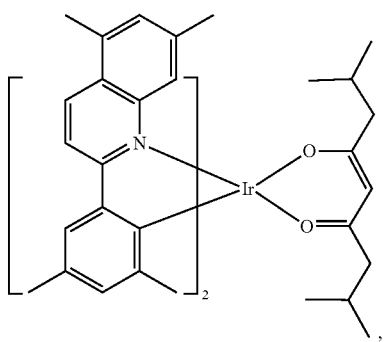
Emitter 97
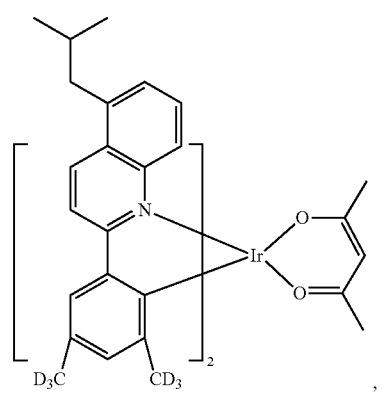
Emitter 98
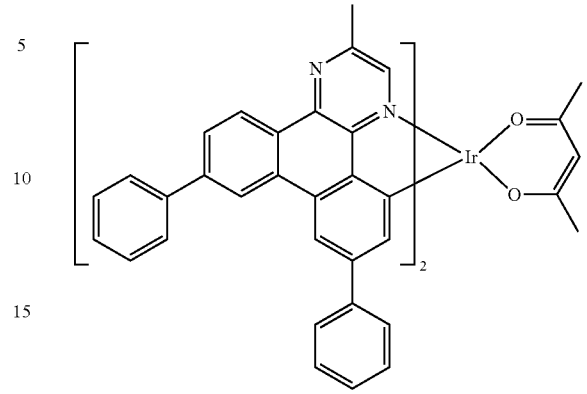
Emitter 99
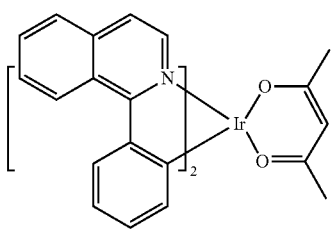
Emitter 100
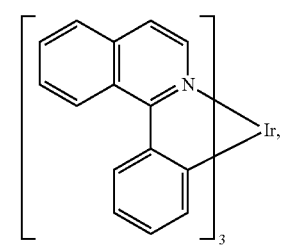
Emitter 101
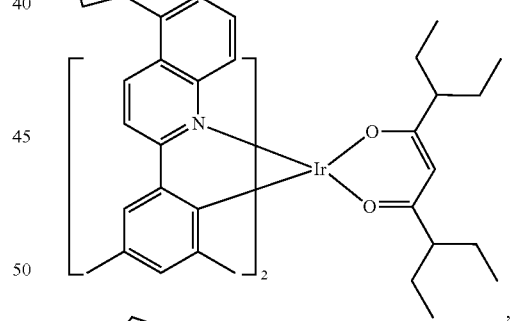
Emitter 102
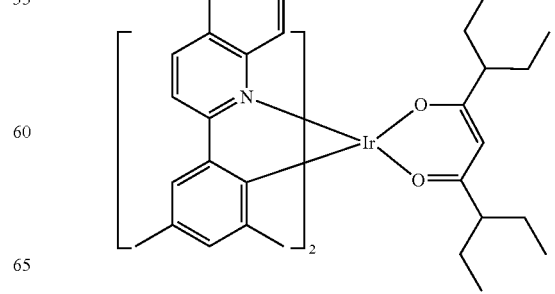

Emitter 103
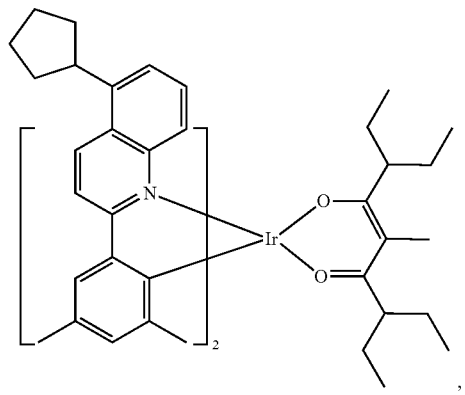
Emitter 104
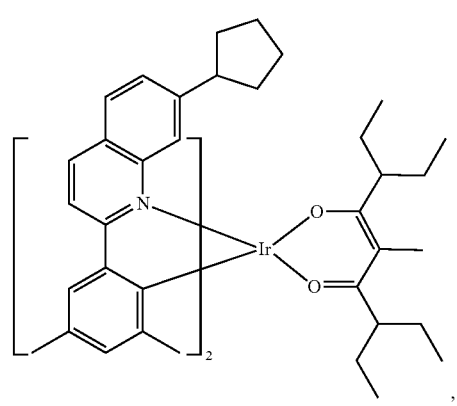
Emitter 105
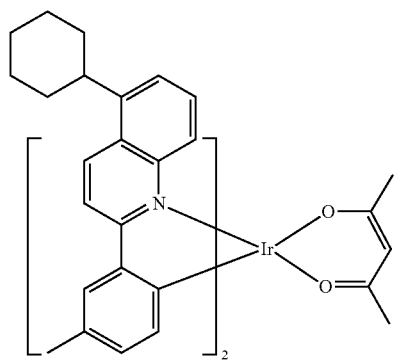
Emitter 106
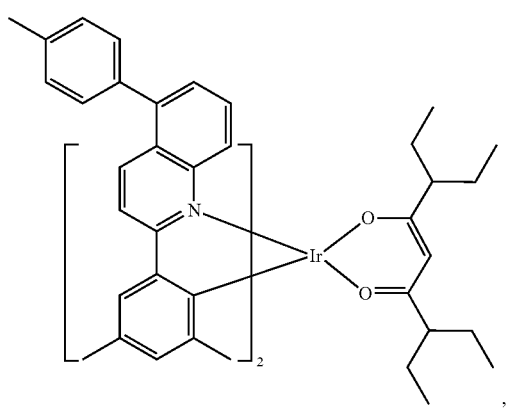
Emitter 107
Emitter 108
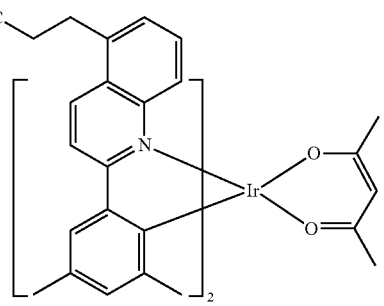
Emitter 109
Emitter 110
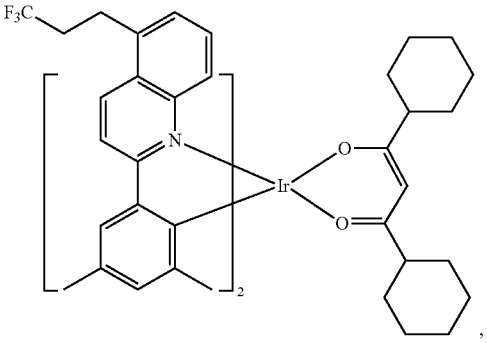

Emitter 111
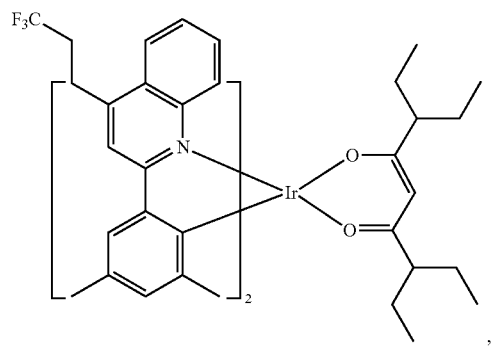
Emitter 115
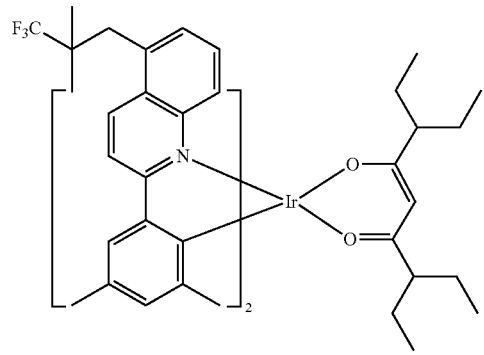
Emitter 112
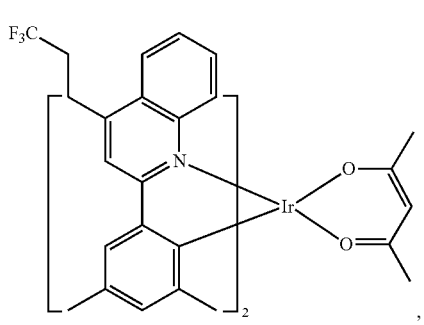
Emitter 116
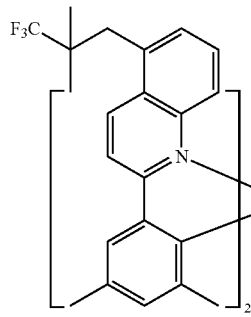
Emitter 113
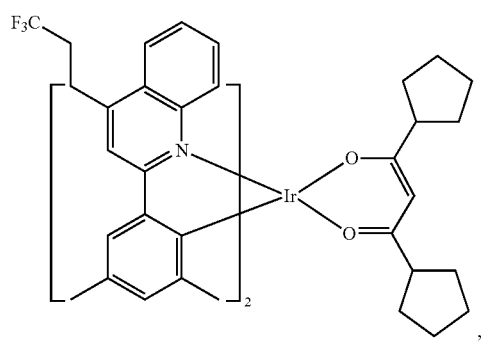
Emitter 117
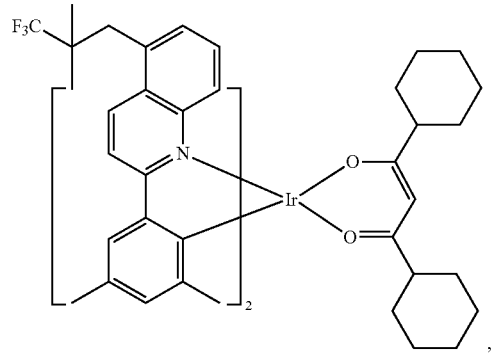
Emitter 114
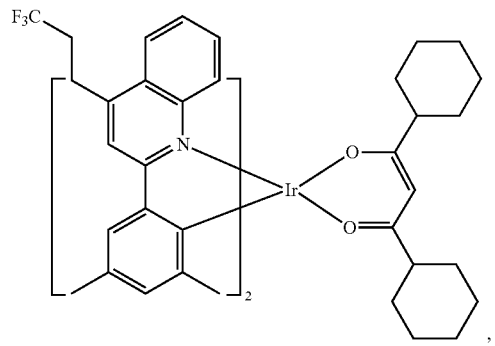
Emitter 118
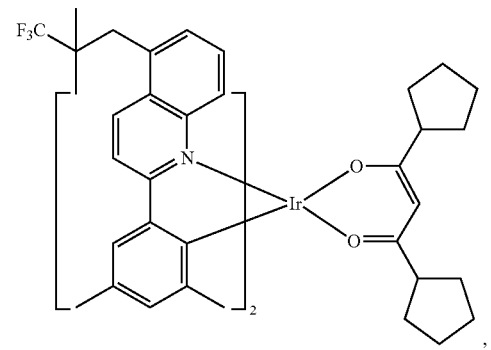

Emitter 119
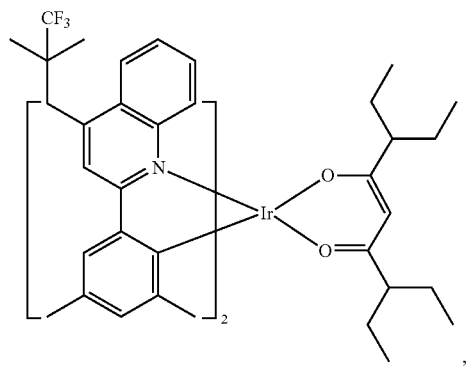
Emitter 120
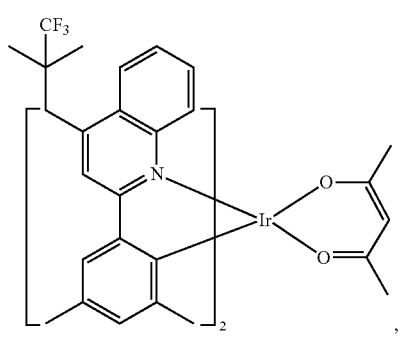
Emitter 121
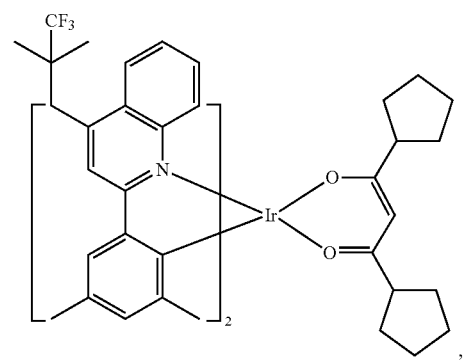
Emitter 122
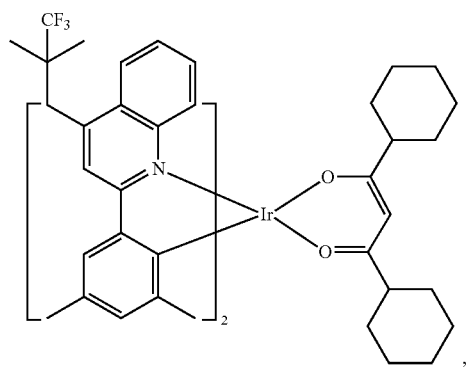
Emitter 123
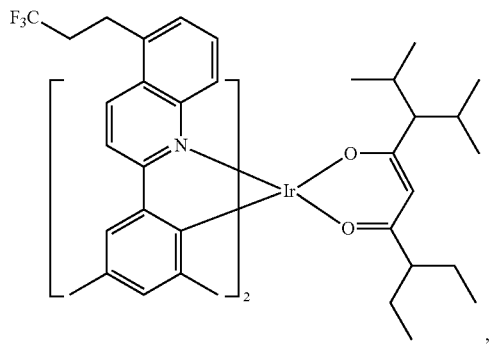
Emitter 124
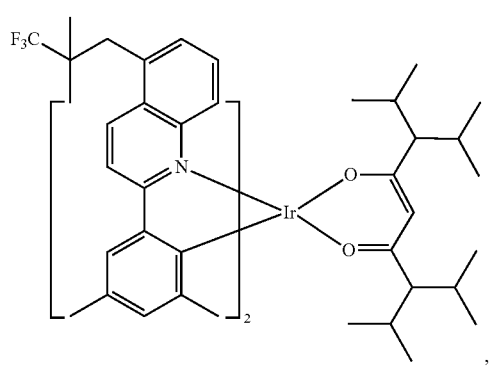
Emitter 125
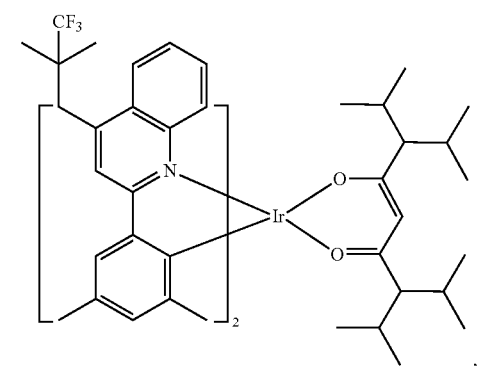
Emitter 126
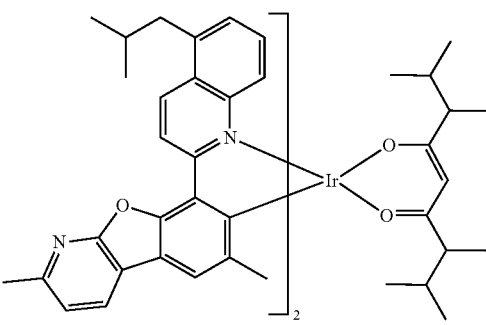

Emitter 127
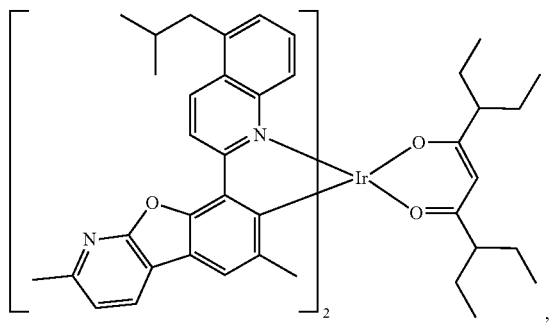
Emitter 128
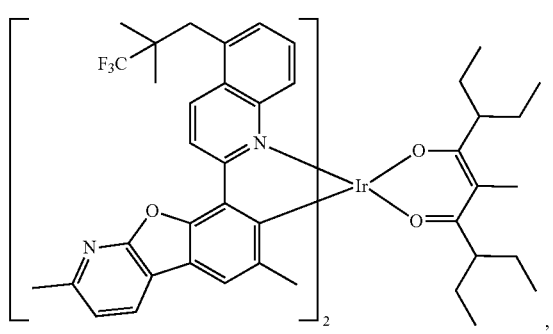
Emitter 129
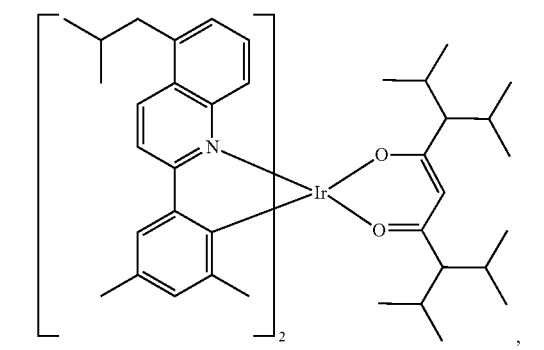
Emitter 130
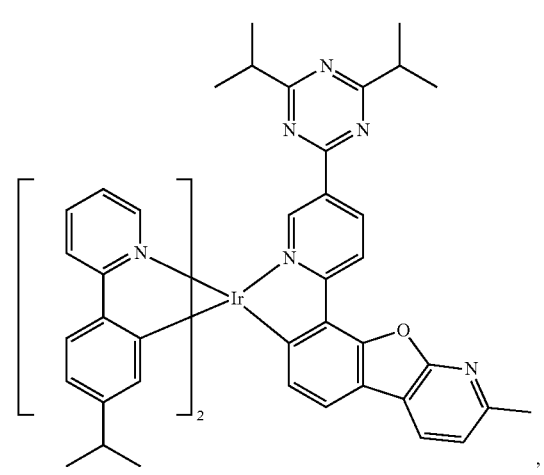
Emitter 131
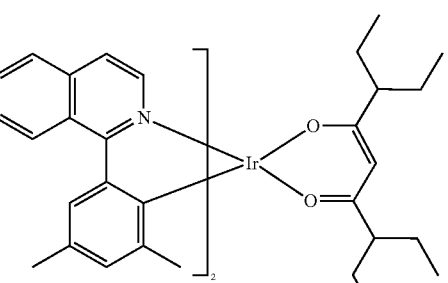
Emitter 132
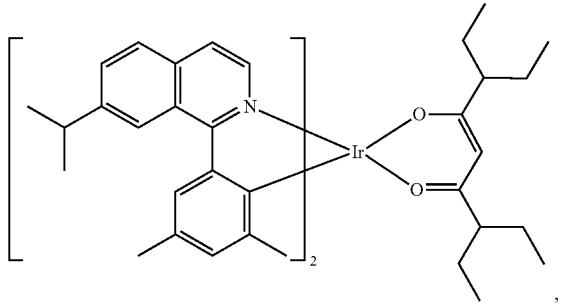
Emitter 133
Emitter 134
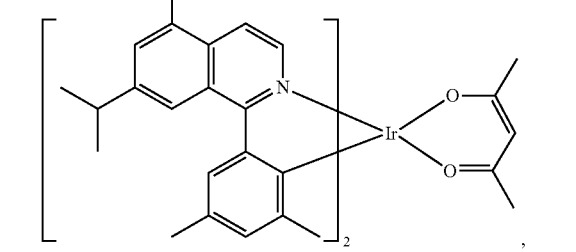
Emitter 135
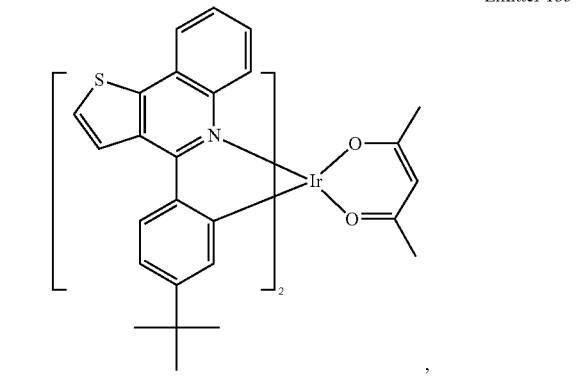

-continued

Emitter 136
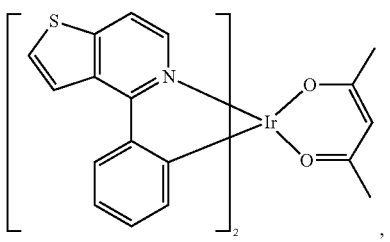,

Emitter 137
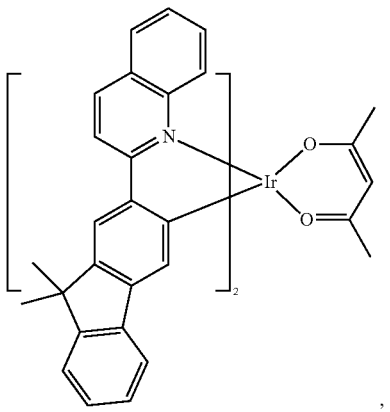,

Emitter 138
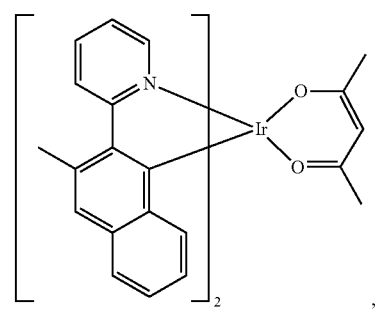,

Emitter 139
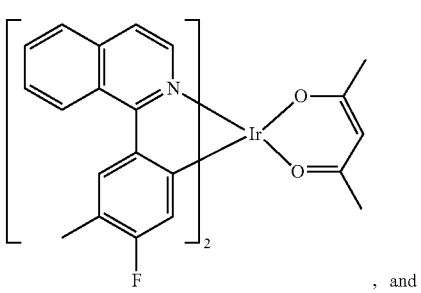, and

Emitter 140
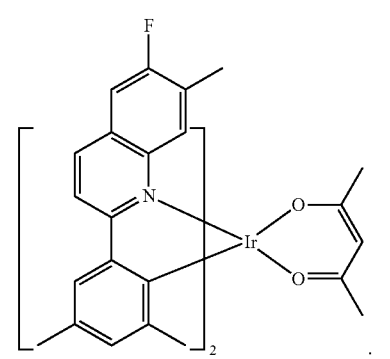.

According to some embodiments, the first mixture comprises a h-host, an e-host, and an emitter. In other embodiments, the first mixture comprises a first h-host, a second h-host, and an e-host. The possible materials for the h-host, the e-host, and the emitter are as defined above.

In some embodiments, the first mixture is selected from the following group of three-component mixtures consisting of (Compound A11, Compound A14, and Compound H26), (Compound A11, Compound C74, and Compound H17), (Compound A14, Compound C65, and Compound H5), (Compound C74, Compound H8, and Compound H17), (Compound C83, Compound H17, and Emitter 2), (Compound C83, Compound F20, and Compound F18), (Compound 83, Compound G2, and Compound G26), (Compound A5, Compound C239, and Emitter 65), and (Compound E2, Compound H5, and Emitter 25). The chemical structures of the specific compounds in this list are as defined above.

According to another aspect of the present disclosure, a method for fabricating a device using the disclosed first mixture is disclosed. The method comprises: providing a first container that contains a first mixture, the first mixture comprising:
a first compound;
a second compound; and
a third compound,
wherein the first compound, the second compound, and the third compound are all organic compounds and have different chemical structures from each other,
wherein the first compound, the second compound, and the third compound each has an evaporation temperature T1, T2, and T3, respectively, and is in the range of 150 to 350° C.,
wherein the T1, T2, and T3 differ from each other by less than 20° C.;
providing a substrate having a first electrode disposed thereon;
depositing an organic layer over the first electrode by evaporating the first mixture in the first container in a high vacuum deposition tool under a first deposition condition which is defined as depositing at a 2 Å/sec deposition rate with a chamber base pressure between $1\times10^{-6}$ Torr to $1\times10^{-9}$ Torr onto a surface positioned at a predefined distance from the first mixture,
wherein the first compound has a concentration C1 in the first mixture and a concentration C2 in the emissive layer and |(C1-C2)/C1| is less than 5%; and
depositing a second electrode over the emissive layer. All of the variations for the first mixture described above are applicable to this method.

According to another aspect of the present disclosure, a first device comprising first organic light emitting device is disclosed. The organic light emitting device comprises:
an anode;
a cathode; and
an organic layer, disposed between the anode and the cathode, comprising a first mixture of a first compound, a second compound, and a third compound,
wherein the first compound, the second compound, and the third compound are all organic compounds and have different chemical structures from each other,
wherein the first compound, the second compound, and the third compound each has an evaporation temperature T1, T2, and T3, respectively, and is in the range of 150 to 350° C.,
wherein the T1, T2, and T3 differ from each other by less than 20° C., wherein the first compound has a concentration C1 in the first mixture and concentration C2 in a film deposited by evaporating the first mixture in a high vacuum deposition tool under a first deposition condition which is defined as depositing at a 2 Å/sec deposition rate with a chamber base pressure between $1 \times 10^{-6}$ Torr to $1 \times 10^{-9}$ Torr onto a surface positioned at a predefined distance from the first mixture, wherein |(C1-C2)/C1| is less than 5%, wherein the first compound has a concentration C1' in a second mixture of the first and second compounds or has a concentration C1" in a third mixture of the first and third compounds, and the first compound has a concentration C2' in a film formed by evaporating the second mixture under the first deposition condition or has a concentration C2" in a film formed by evaporating the third mixture under the first deposition condition, and wherein at least one of |(C1'−C2')/C1'| and |(C1"−C2")/C1"| is greater than 5%.

In one embodiment of the first device, the organic layer is an emissive layer. In another embodiment of the first device, the organic layer is a non-emissive layer.

In one embodiment of the first device, the organic layer further comprises a phosphorescent emitting material.

In one embodiment of the first device, the organic layer further comprises a host material.

In one embodiment of the first device, the first compound functions as a phosphorescent emitting material at room temperature.

In one embodiment fo the first device, the first compound functions as a host material at room temperature.

In one embodiment of the first device, the first device further comprises a second organic light emitting device separate from the first organic light emitting device.

In one embodiment of the first device, the first organic light emitting device comprises a first emissive layer and a second emissive layer, wherein the first emissive layer is deposited by evaporating the first mixture.

In one embodiment of the first device, the organic layer is a hole transporting layer.

In one embodiment of the first device, the first device is a consumer product. In another embodiment, the first device is an organic light-emitting device. In another embodiment, the first device can comprise a lighting panel.

EXAMPLES

The feasibility of manufacturing multicomponent films with stable compositions was demonstrated by compositional analysis of films fabricated by single-source co-evaporation of the premixture of these components.

Comparative Premixture Example 1

A bicomponent premixture (BPM1) was prepared by physically mixing and grinding of Compound H8 and Compound C74 at a weight ratio of 2:1, and loaded into an evaporation source. The premixed compositions were thermally co-evaporated at a rate of 2 Å/s in a high vacuum chamber with a base pressure of less than $10^{-7}$ Torr, and deposited onto glass substrates. The substrates were replaced continuously after deposition of 500 Å of film without stopping the deposition and cooling the source till the depletion of the evaporation source. The compositions of films were analyzed by high-performance liquid chromatography (HPLC) and the results are collected in Table 1. The concentrations of Compound C74 in each film were plotted in FIG. 1.

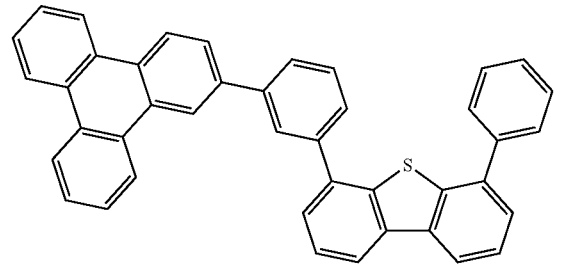

Compound H8

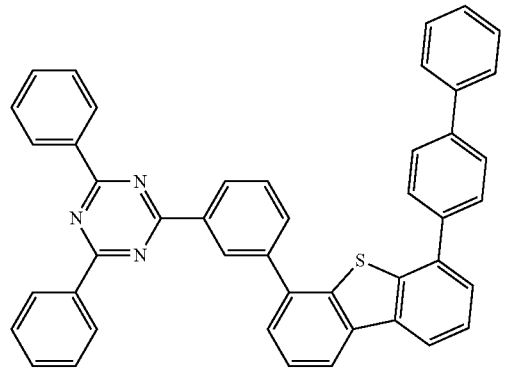

Compound C74

TABLE 1

HPLC composition (%) of sequentially deposited films from premixture (BPM1) (HPLC Conditions C18, 100 45 min, Detected wavelength 254 nm) (Due to different absorption coefficients, the HPLC composition may or may not agree with the weight ratio.)

| Films | Compound H8 | Compound C74 |
| --- | --- | --- |
| Plate1 | 68.4 | 31.6 |
| Plate2 | 68.2 | 31.8 |
| Plate3 | 68.2 | 31.8 |
| Plate4 | 68.4 | 31.6 |
| Plate5 | 69.3 | 30.7 |
| Plate6 | 70.6 | 29.4 |
| Plate7 | 71.7 | 28.3 |
| Plate8 | 73.0 | 27.0 |

Figure 3:
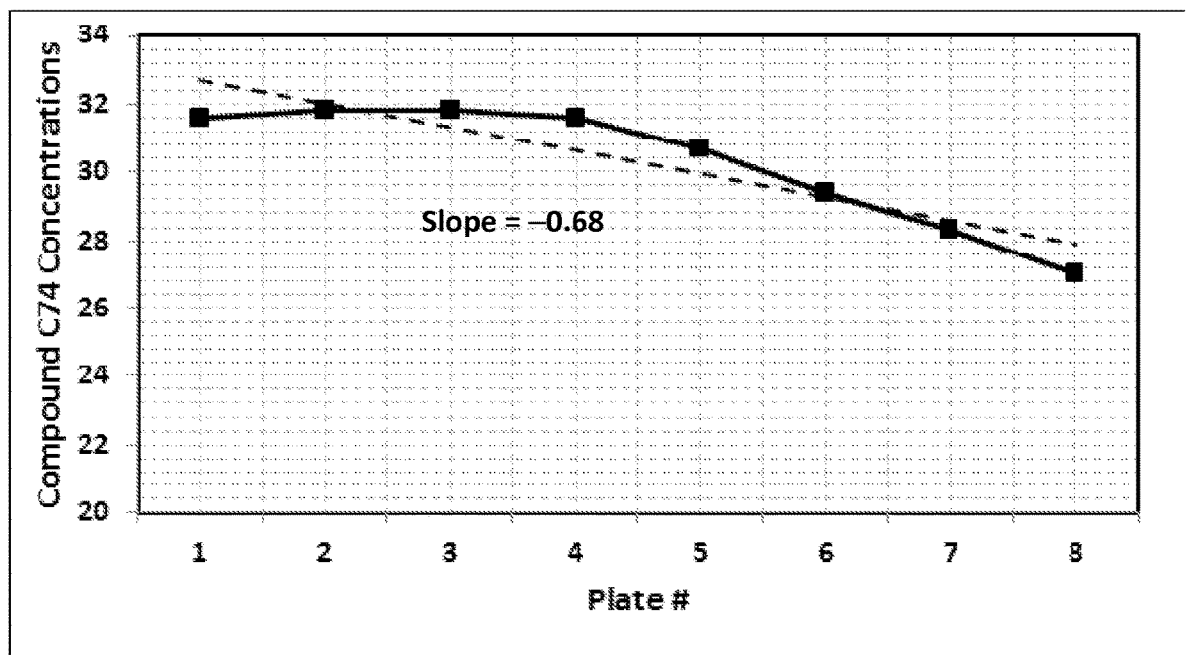
FIG. 3 shows HPLC composition (%) evolution of Compound C74 in sequentially deposited films from premixture BPM1.

FIG. 3 shows HPLC composition (%) evolution of Compound C74 in sequentially deposited films from premixture BPM1. The dashed line in the plot of FIG. 3 represents a linear fit of the data presented in solid line, which shows a slope of −0.68.

Premixture Example 1

A tricomponent premixture (TPM1) was prepared by physically mixing and grinding of Compound H8, Compound C74 and Compound H17 at a weight ratio of 1:1:1, and loaded into an evaporation source. The film preparation and concentration evaluation follow the same procedures as in BPM1. The compositions of films are collected in Table 2 and the concentrations of Compound C74 in each film were plotted in FIG. 2.

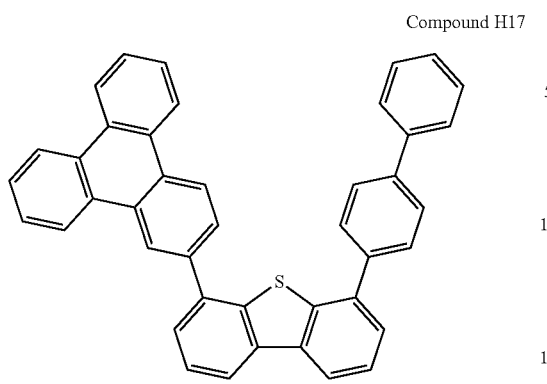

Compound H17

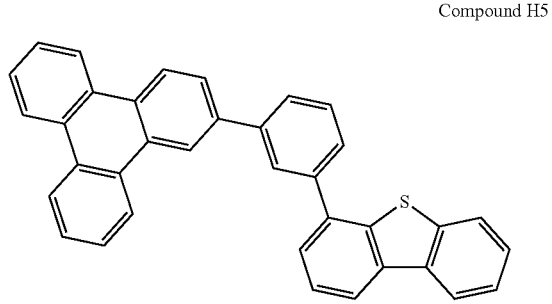

Compound H5

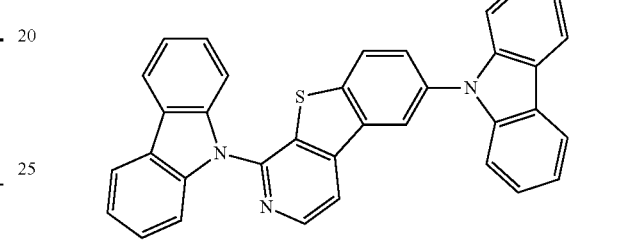

Compound E2

TABLE 2

HPLC composition (%) of sequentially deposited films from premixture (TPM1) (HPLC Conditions C18, 100 45 min, Detected wavelength 254 nm) (Due to different absorption coefficients, the HPLC composition may or may not agree with the weight ratio.)

| Films | Compound H8 | Compound H17 | Compound C74 |
|---|---|---|---|
| Plate1 | 36.9 | 37.4 | 25.7 |
| Plate2 | 35.2 | 38.2 | 26.6 |
| Plate3 | 34.3 | 38.1 | 27.6 |
| Plate4 | 33.0 | 38.7 | 28.3 |
| Plate5 | 31.3 | 40.1 | 28.6 |
| Plate6 | 30.3 | 41.2 | 28.5 |
| Plate7 | 30.0 | 41.7 | 28.3 |
| Plate8 | 29.0 | 43.5 | 27.5 |

Figure 4:
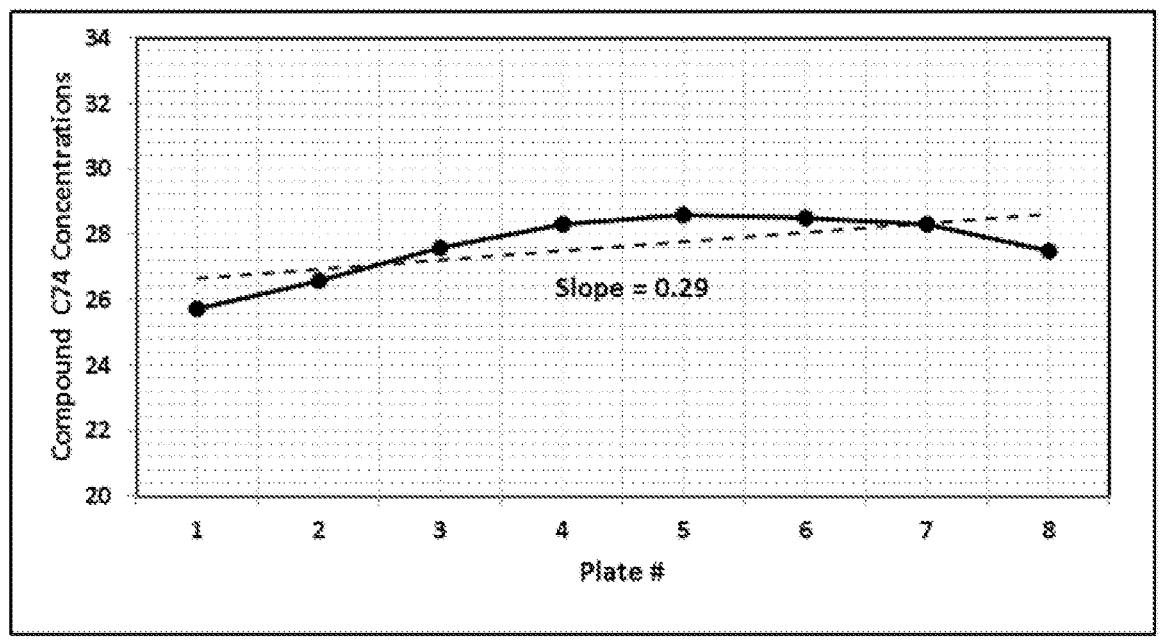
FIG. 4 shows HPLC composition (%) evolution of Compound C74 in sequentially deposited films from premixture TPM1.

FIG. 4 shows HPLC composition (%) evolution of Compound C74 in sequentially deposited films from premixture TPM1. The dashed line in the plot of FIG. 4 is a linear fit of the data presented in solid line, which shows a slope of 0.29.

The absolute value of slope in the concentration plot indicates the extent of concentration separation during sequential deposition of films from a premixture. The data in FIGS. 3 and 4 suggest that TPM1 has less concentration separation for Compound C74 than BPM1. This evaporation stability in TPM1 was achieved through the introduction of Compound H17, which shows opposite trend of concentration evolution against Compound H8 during sequential evaporation as revealed in Table 2.

Comparative Premixture Example 2

A bicomponent premixture (BPM2) was prepared by physically mixing and grinding of Compound H5 and Compound E2 at a weight ratio of 1:1, and loaded into an evaporation source. The film preparation and concentration evaluation follow the same procedures as in BPM1. The compositions of films are collected in Table 3 and the concentrations of Compound E2 in each film were plotted in FIG. 5.

TABLE 3

HPLC composition (%) of sequentially deposited films from premixture (BPM2) (HPLC Conditions C81, 100 45 min, Detected wavelength 254 nm) (Due to different absorption coefficients, the HPLC composition may or may not agree with the weight ratio.)

| Films | Compound H5 | Compound E2 |
|---|---|---|
| Plate1 | 63.6 | 36.4 |
| Plate2 | 64.8 | 35.2 |
| Plate3 | 64.3 | 35.7 |
| Plate4 | 62.2 | 37.8 |
| Plate5 | 59.0 | 41.0 |
| Plate6 | 53.8 | 46.2 |

Figure 5:
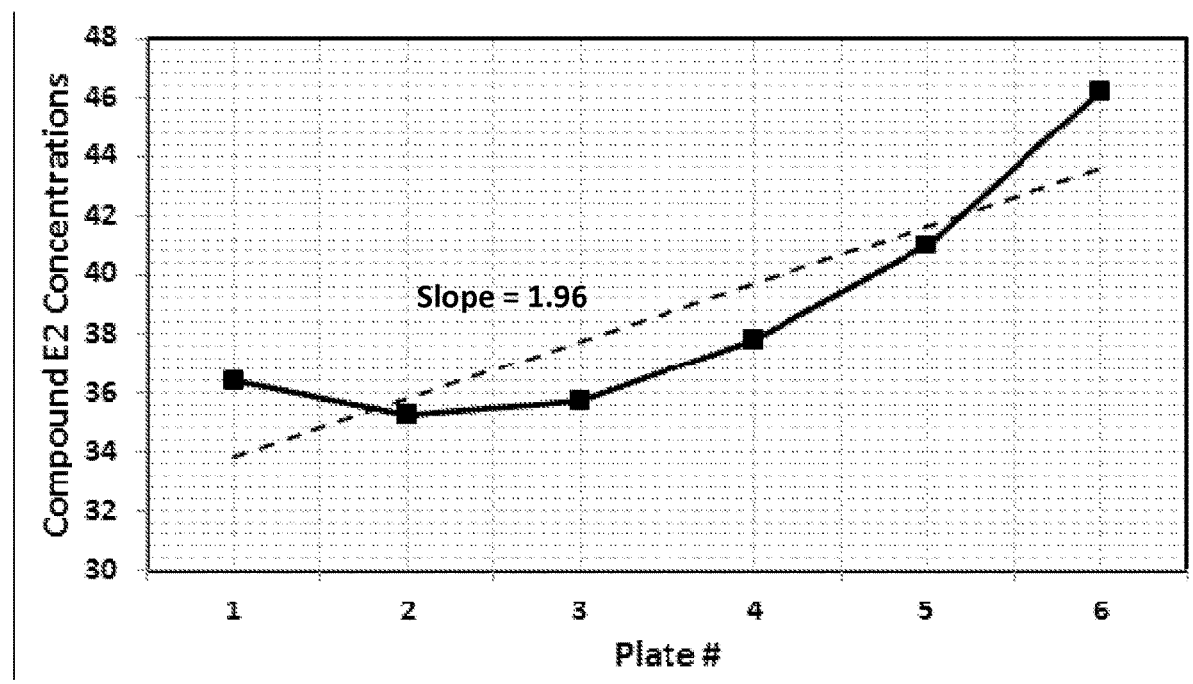
FIG. 5 shows HPLC composition (%) evolution of Compound E2 in sequentially deposited films from premixture BPM2.

FIG. 5 shows HPLC composition (%) evolution of Compound E2 in sequentially deposited films from premixture BPM2. The dashed line in the plot of FIG. 5 is a linear fit of the data presented in solid line, which shows a slope of 1.96.

Premixture Example 2

A tricomponent premixture (TPM2) was prepared by physically mixing and grinding of Compound H5, Compound E2 and Emitter 25 at a weight ratio of 2:2:1, and loaded into an evaporation source. The film preparation and concentration evaluation follow the same procedures as in BPM1. The compositions of films are collected in Table 4 and the concentrations of Emitter 25 in each film were plotted in FIG. 6.

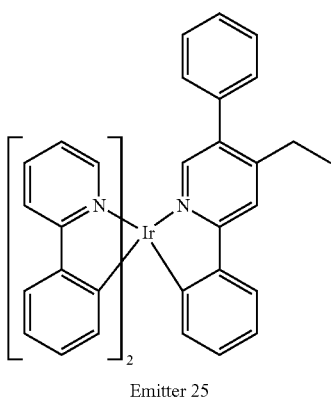

Emitter 25

TABLE 4

HPLC composition (%) of sequentially deposited films from premixture (TPM2) (HPLC Conditions C18, 100 45 min, Detected wavelength 254 nm) (Due to different absorption coefficients, the HPLC composition may or may not agree with the weight ratio.)

| Films | Compound H5 | Emitter 25 | Compound E2 |
|---|---|---|---|
| Plate1 | 54.4 | 11.4 | 34.2 |
| Plate2 | 55.5 | 11.0 | 33.5 |
| Plate3 | 56.7 | 10.2 | 33.1 |
| Plate4 | 57.5 | 9.5 | 33.0 |
| Plate5 | 55.2 | 9.4 | 35.4 |

Figure 6:
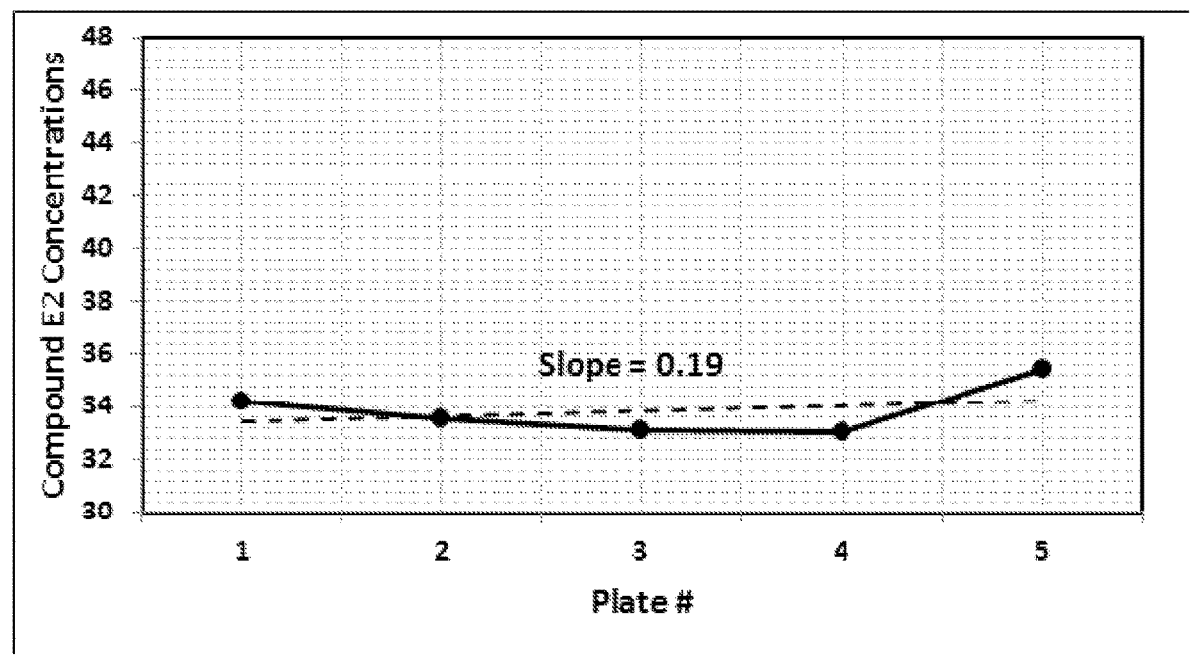
FIG. 6 shows HPLC composition (%) evolution of Compound E2 in sequentially deposited films from premixture TPM2.

FIG. 6 shows HPLC composition (%) evolution of Compound E2 in sequentially deposited films from premixture TPM2. The dashed line in the plot of FIG. 6 is a linear fit of the data presented in solid line, which shows a slope of 0.19.

The data in FIGS. 5 and 6 suggest that TPM2 has less concentration separation and is a more stable premixture than BPM2. This evaporation stability in TPM2 was achieved through the introduction of Emitter 25, which assists the co-evaporation of Compound H5 and Compound E2. Indeed, a comparison of data in Tables 3 and 4 suggests that there is much less concentration separation for both Compounds H5 and E2 in TPM2.

Combination with Other Materials

The materials described herein as useful tzar a particular layer in an organic tight emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

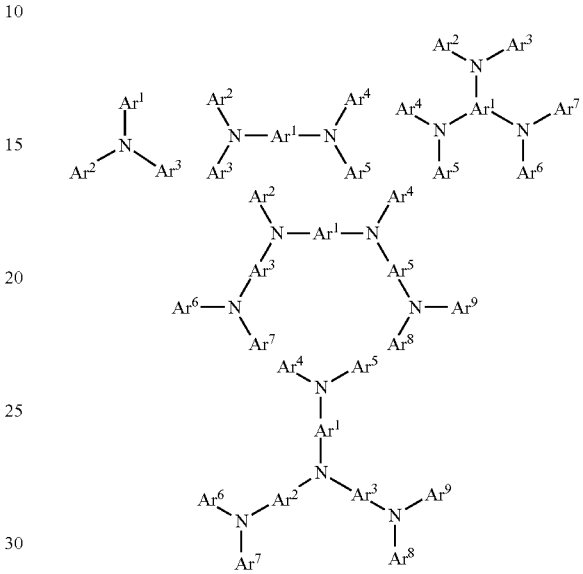

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

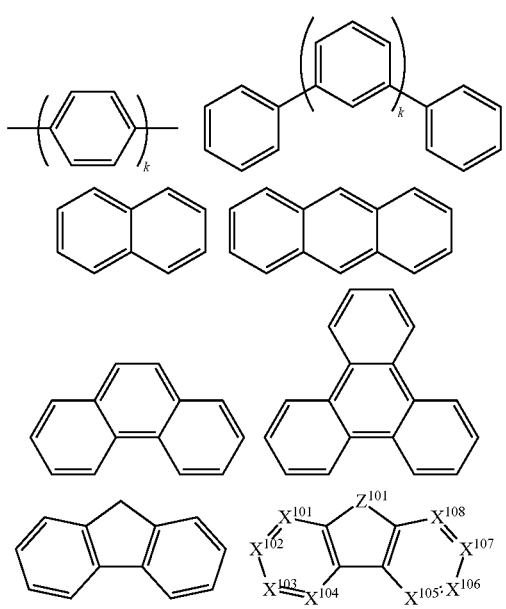

wherein k is an integer from 1 to 20; $X^{101}$ to $X^{108}$ is C (including CH) or N; $Z^{101}$ is $NAr^1$, or S; $Ar^1$ has the same group defined above.

Examples of metal complexes used in HIL or HTL include, but not limit to the following general formula:

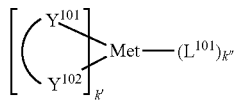

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y_{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^-/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

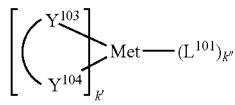

wherein Met is a metal; $(Y^{103}\text{-}Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

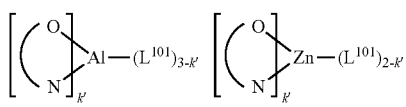

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrite, isonitrile, sulfanyl, sulfinyl, sulfonyl, phosphino, and combinations thereof.

In one aspect, host compound contains at least one of the following groups in the molecule:

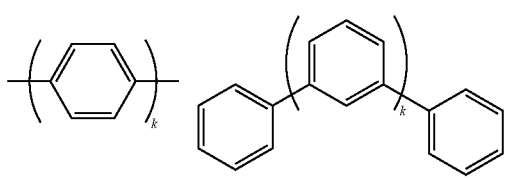

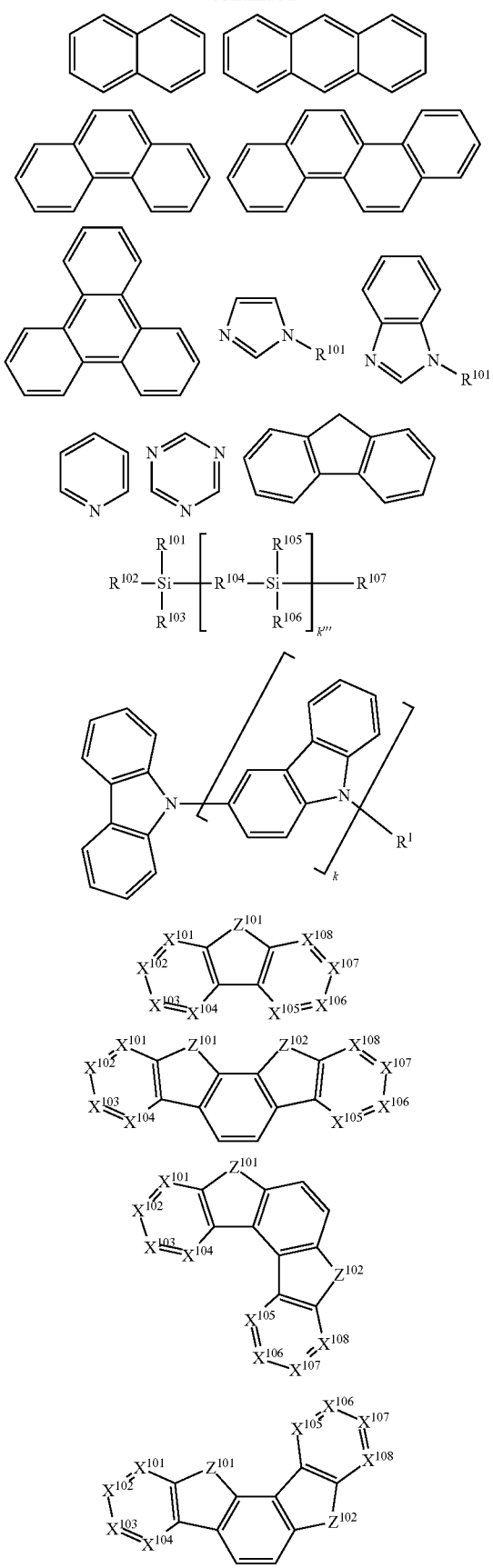

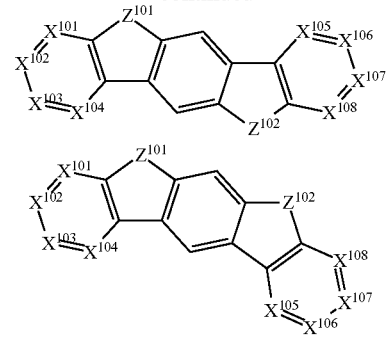

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

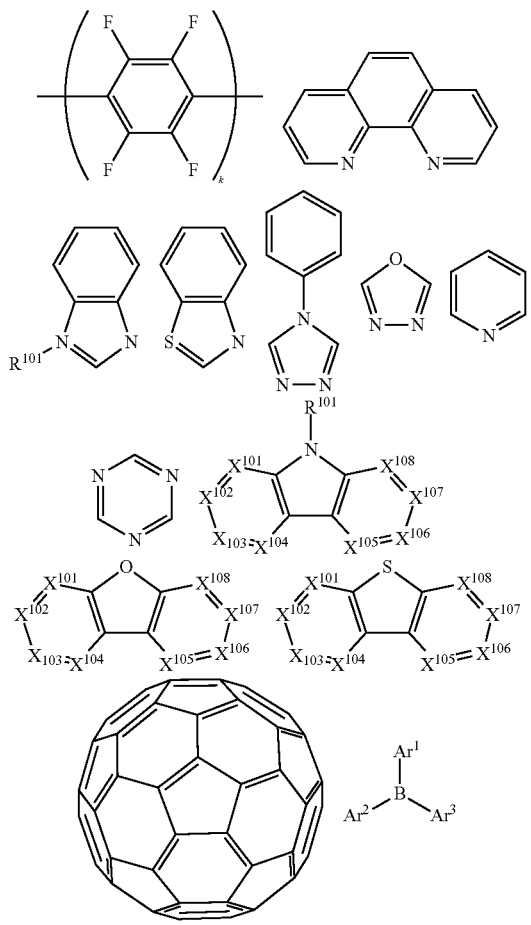

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

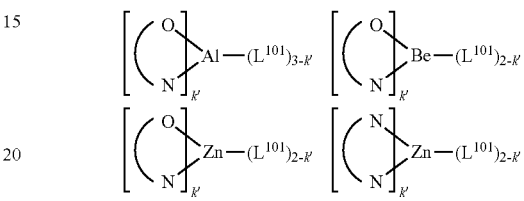

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. also encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table A below. Table A lists non-limiting classes of materials, non-limiting examples of compounds for each class, and references that disclose the materials.

TABLE A

| MATERIAL | EXAMPLES OF MATERIAL | PUBLICATIONS |
|---|---|---|
| | Hole injection materials | |
| Phthalocyanine and porphryin compounds | | Appl. Phys. Lett. 69, 2160 (1996) |

TABLE A-continued

| MATERIAL | EXAMPLES OF MATERIAL | PUBLICATIONS |
|---|---|---|
| Starburst triarylamines | (structure of starburst triarylamine with naphthyl and phenyl substituents) | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | (PEDOT structure) + (PSS structure with $SO_3^-(H^+)$) | Synth. Met. 87, 171 (1997) WO2007002683 |
| Phosphonic acid and sliane SAMs | $N-[\text{(C}_6\text{H}_4\text{)}-SiCl_3]_3$ | US20030162053 |
| Triarylamine or polythiophene polymers with conductivity dopants | (triarylamine structure with methoxy and benzoyl substituents) and | EP1725079A1 |

| MATERIAL | EXAMPLES OF MATERIAL | PUBLICATIONS |
|---|---|---|
| | 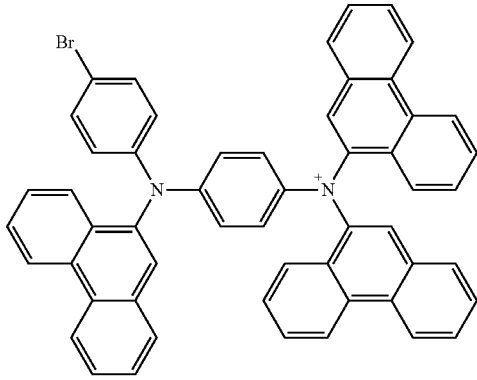 [SMILES: Brc1ccc(N(c2ccc(N(c3cc4ccccc4c4ccccc34)c3cc4ccccc4c4ccccc34)cc2)c2cc3ccccc3c3ccccc23)cc1] | |
| | 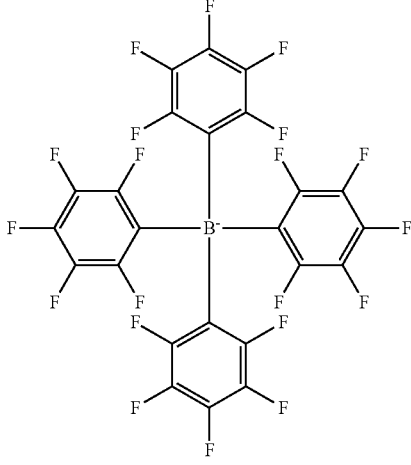 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum and tungsten oxides | 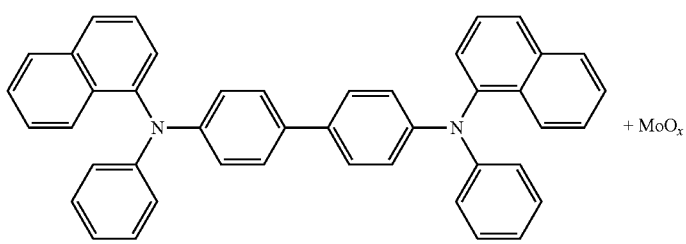 [SMILES: c1ccc(N(c2ccc(-c3ccc(N(c4ccccc4)c4cccc5ccccc45)cc3)cc2)c2cccc3ccccc23)cc1] + MoO$_x$ | US20050123751<br>SID Symposium Digest, 37, 923 (2006)<br>WO2009018009 |
| n-type semiconducting organic complexes | 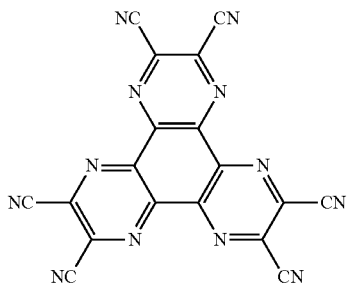 [SMILES: N#Cc1nc2c3nc(C#N)c(C#N)nc3c3nc(C#N)c(C#N)nc3c2nc1C#N] | US20020158242 |

TABLE A-continued

| MATERIAL | EXAMPLES OF MATERIAL | PUBLICATIONS |
|---|---|---|
| Metal organometallic complexes | | US20060240279 |
| Cross-linkable compounds | | US20080220265 |
| Polythiophene based polymers and copolymers | | WO 2011075644<br>EP2350216 |

Hole transporting materials

| | | |
|---|---|---|
| Triarylamines (e.g., TPD, α-NPD) | | Appl. Phys. Lett. 51, 913 (1987) |

TABLE A-continued
| MATERIAL | EXAMPLES OF MATERIAL | PUBLICATIONS |
|---|---|---|
| | 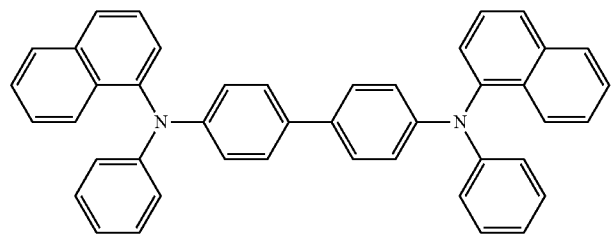 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 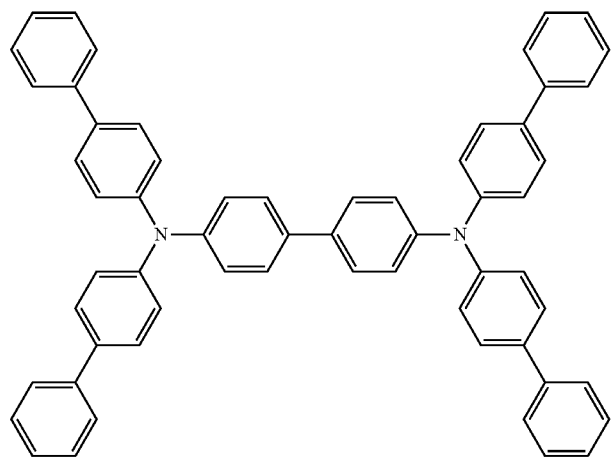 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 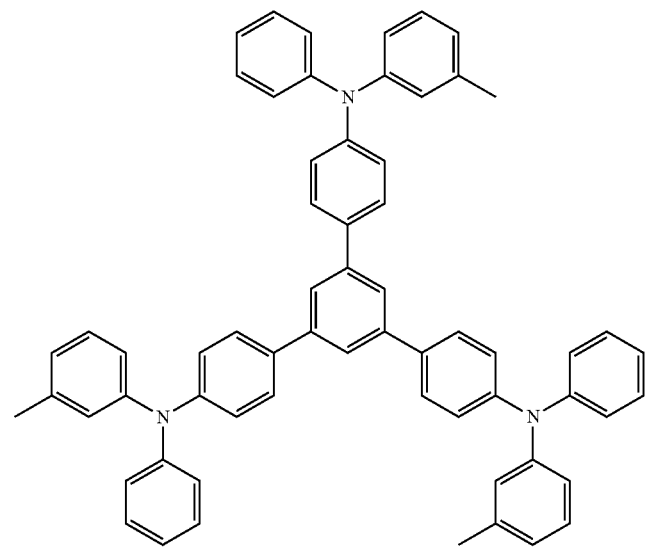 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE A-continued

| MATERIAL | EXAMPLES OF MATERIAL | PUBLICATIONS |
|---|---|---|
| | | Appl. Phys. Lett. 90, 183503 (2007) |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |

TABLE A-continued
| MATERIAL | EXAMPLES OF MATERIAL | PUBLICATIONS |
|---|---|---|
| Triarylamine with (di)benzothiophene/ (di)benzofuran | 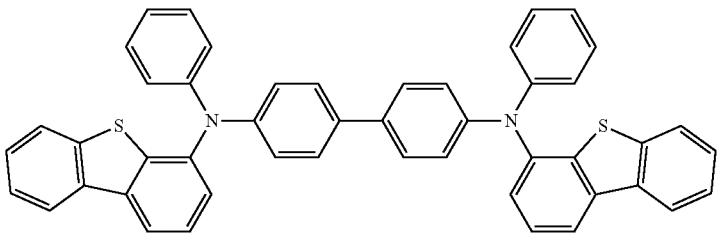 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 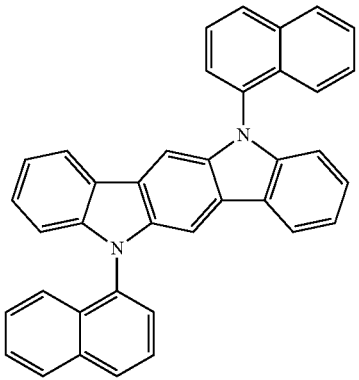 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 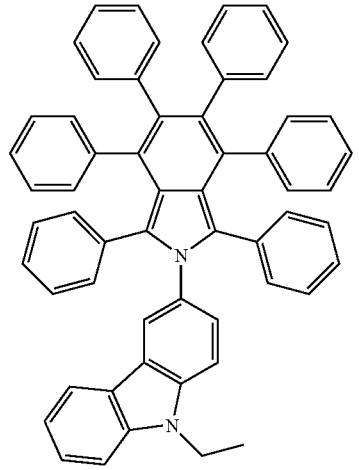 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 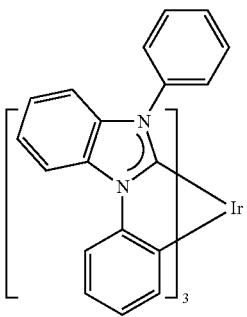 | US20080018221 |

TABLE A-continued

| MATERIAL | EXAMPLES OF MATERIAL | PUBLICATIONS |
| --- | --- | --- |
| Phosphorescent OLED hosts materials Red hosts | | |
| Arylcarbazoles | | Appl. Phys. Lett. 78, 1622 (2001) |
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxy-benzothiazole compounds | | Appl. Phys. Lett. 90, 123509 (2007) |
| Conjugated oligomers and polymers (e.g., polyfluorene) | | Org. Electron. 1, 15 (2000) |

TABLE A-continued

| MATERIAL | EXAMPLES OF MATERIAL | PUBLICATIONS |
| --- | --- | --- |
| Aromatic fused rings | | WO2009066779, WO2009066778. WO2009063833, US20090045731, US20090045730. WO2009008311, US20090008605, US20090009065 |
| Zinc complexes | | WO2010056066 |
| Chrysene based compounds | | WO2011086863 |
| Green hosts | | |
| Arylcarbazoles | | Appl. Phys. Lett. 78, 1622 (2001) |
| | | US20030175553 |
| | | WO2001039234 |

TABLE A-continued
| MATERIAL | EXAMPLES OF MATERIAL | PUBLICATIONS |
| --- | --- | --- |
| Aryltriphenylene compounds | 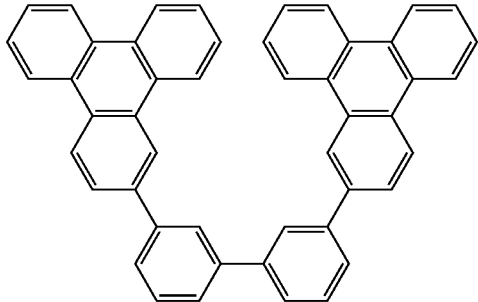 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 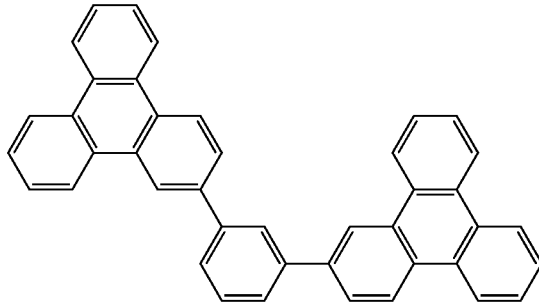 [SMILES: c1cc(-c2ccc3c4ccccc4c4ccccc4c3c2)cc(-c2ccc3c4ccccc4c4ccccc4c3c2)c1] | US20060280965 |
| | 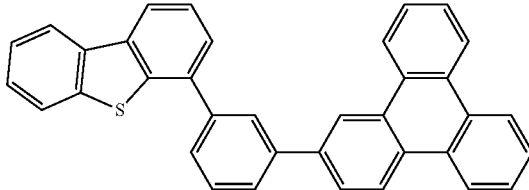 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 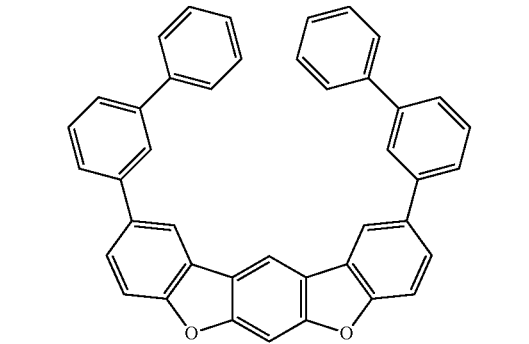 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 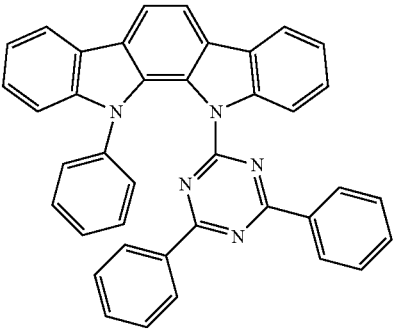 [SMILES: c1ccc(-c2nc(-c3ccccc3)nc(-n3c4ccccc4c4ccc5c6ccccc6n(-c6ccccc6)c5c43)n2)cc1] | WO2008056746 |

TABLE A-continued
| MATERIAL | EXAMPLES OF MATERIAL | PUBLICATIONS |
|---|---|---|
| | 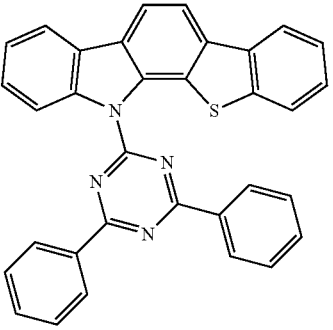 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 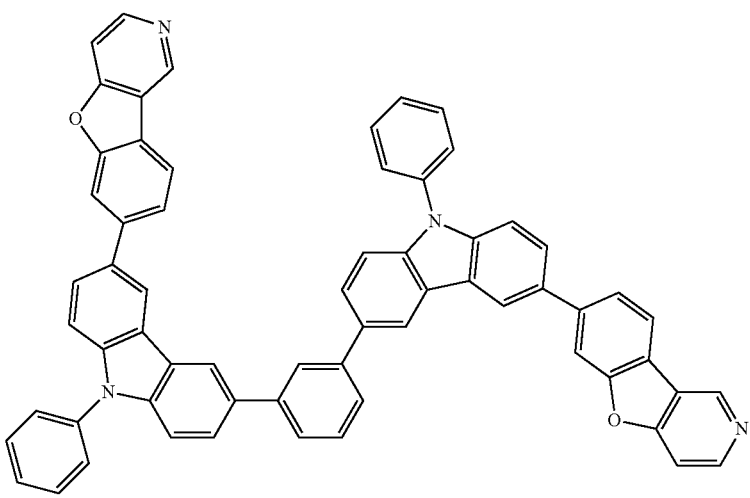 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 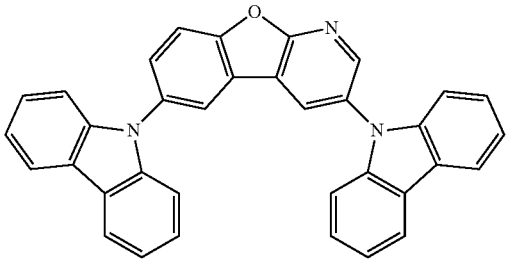 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 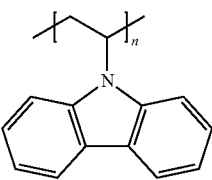 | Appl. Phys. Lett. 77, 2280 (2000) |
| Spirofluorene compounds | 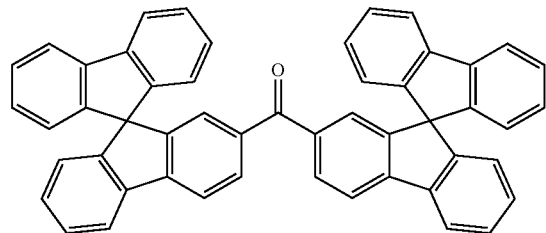 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE A-continued

| MATERIAL | EXAMPLES OF MATERIAL | PUBLICATIONS |
|---|---|---|
| Metal phenoxy-benzooxazole compounds | | WO2005089025 |
| | | WO2006132173 |
| | | JP200511610 |
| Spirofluorene-carbazole compounds | | JP2007254297 |
| | | JP2007254297 |

TABLE A-continued

| MATERIAL | EXAMPLES OF MATERIAL | PUBLICATIONS |
| --- | --- | --- |
| Indolocarbazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |

TABLE A-continued

| MATERIAL | EXAMPLES OF MATERIAL | PUBLICATIONS |
| --- | --- | --- |
| Metal phenoxypyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett. 82, 2422 (2003) |
| | | US20070190359 |
| Dibenzothiophene/ Dibenzofuran-carbazole compounds | | WO2006114966, US20090167162 |
| | | US20090167162 |

TABLE A-continued
| MATERIAL | EXAMPLES OF MATERIAL | PUBLICATIONS |
|---|---|---|
| | 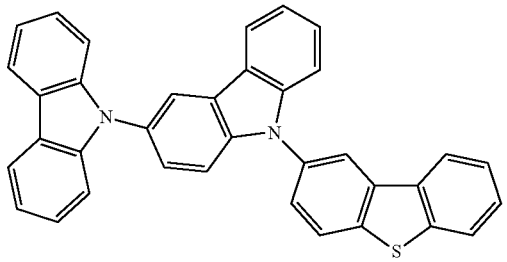 [SMILES: c1ccc2c(c1)sc1ccc(-n3c4ccccc4c4cc(-n5c6ccccc6c6ccccc65)ccc43)cc12] | WO2009086028 |
| | 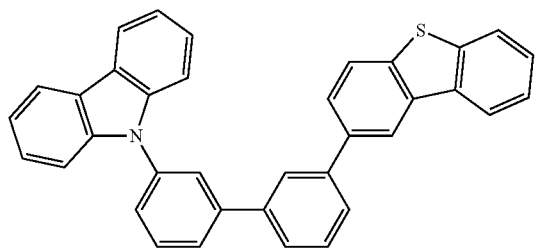 [SMILES: c1cc(-c2cccc(-n3c4ccccc4c4ccccc43)c2)cc(-c2ccc3sc4ccccc4c3c2)c1] | US20090030202, US20090017330 |
| | 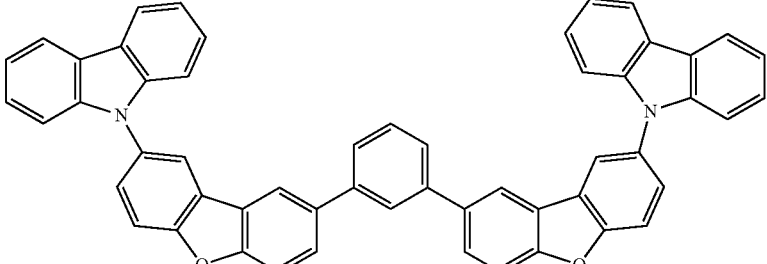 | US20100084966 |
| Silicon aryl compounds | 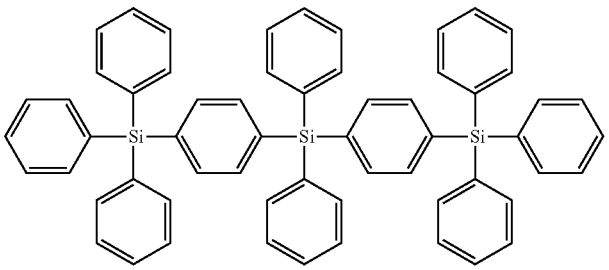 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 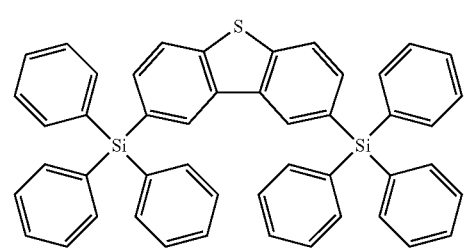 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE A-continued
| MATERIAL | EXAMPLES OF MATERIAL | PUBLICATIONS |
|---|---|---|
| Silicon/Germanium aryl compounds | 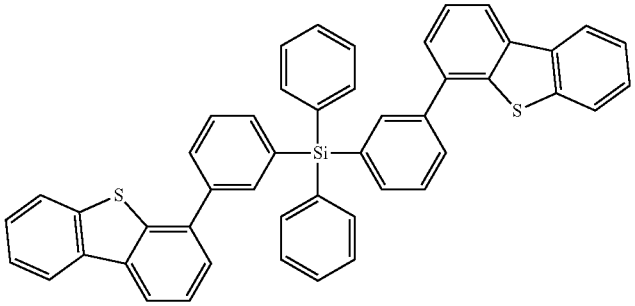 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 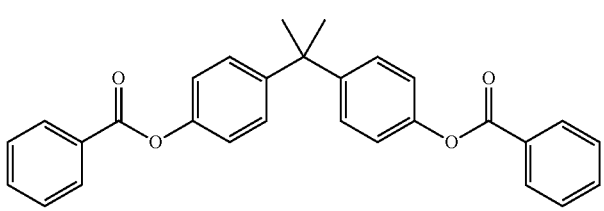 | WO2006100298 |
| Carbazole linked by non-conjugated groups | 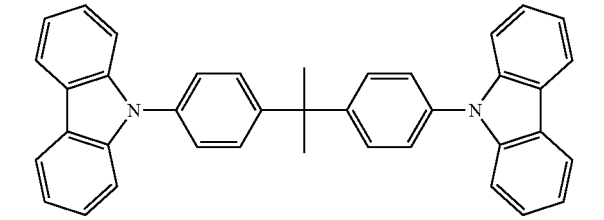 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 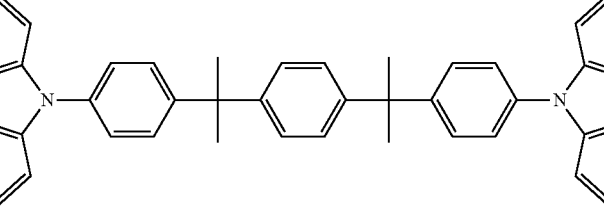 | US20060121308 |
| High triplet metal organometallic complex | 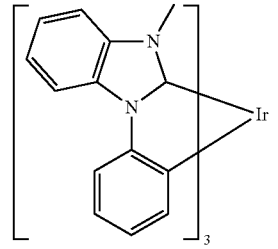 | U.S. Pat. No. 7,154,114 |

TABLE A-continued

| MATERIAL | EXAMPLES OF MATERIAL | PUBLICATIONS |
|---|---|---|
| | Phosphorescent dopants | |
| | Red dopants | |
| Heavy metal porphyrins (e.g., PtOEP) | | Nature 395, 151 (1998) |
| Iridium(III) organometallic complexes | | Appl. Phys. Lett. 78, 1622 (2001) |
| | | US20030072964 |
| | | US20030072964 |
| | | US20060202194 |

| MATERIAL | EXAMPLES OF MATERIAL | PUBLICATIONS |
|---|---|---|
| | | US20060202194 |
| | | US20070087321 |
| | | US20080261076<br>US20100090591 |
| | | US20070087321 |
| | | Adv. Mater. 19, 739 (2007) |

TABLE A-continued
| MATERIAL | EXAMPLES OF MATERIAL | PUBLICATIONS |
|---|---|---|
| | 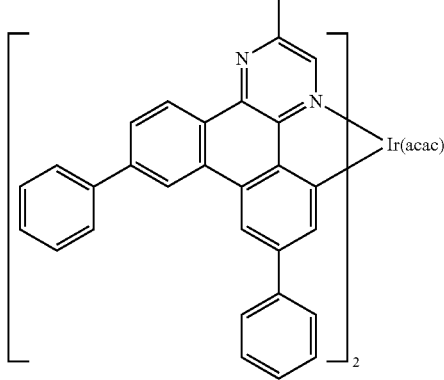 | WO2009100991 |
| | 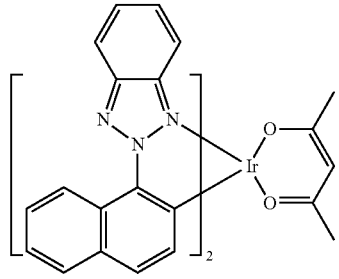 | WO2008101842 |
| | 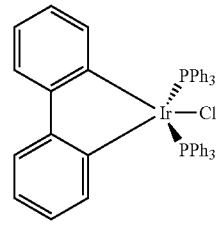 | U.S. Pat. No. 7,232,618 |
| Platinum(II) organometallic complexes | 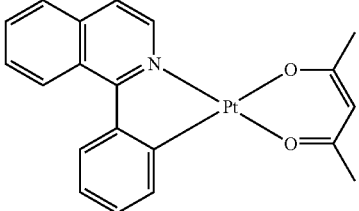 | WO2003040257 |
| | 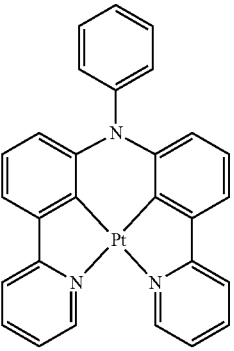 | US20070103060 |

TABLE A-continued

| MATERIAL | EXAMPLES OF MATERIAL | PUBLICATIONS |
| --- | --- | --- |
| Osmium(III) complexes | | Chem. Mater. 17, 3532 (2005) |
| Ruthenium(II) complexes | | Adv. Mater. 17, 1059 (2005) |
| Rhenium (I), (II), and (III) complexes | | US20050244673 |

Green dopants

| | | |
| --- | --- | --- |
| Iridium(III) organometallic complexes | and its derivatives | Inorg. Chem. 40, 1704 (2001) |
| | | US20020034656 |

TABLE A-continued
| MATERIAL | EXAMPLES OF MATERIAL | PUBLICATIONS |
|---|---|---|
| | 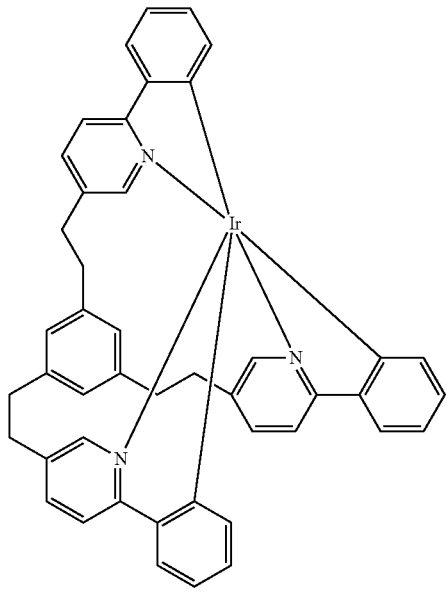 | U.S. Pat. No. 7,332,232 |
| | 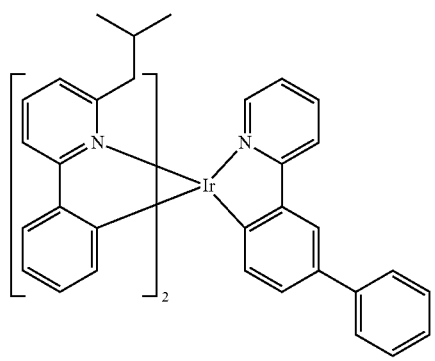 | US20090108737 |
| | 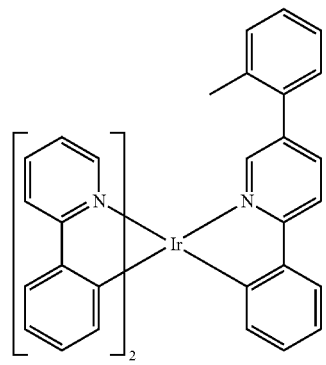 | WO2010028151 |

TABLE A-continued
| MATERIAL | EXAMPLES OF MATERIAL | PUBLICATIONS |
|---|---|---|
| | 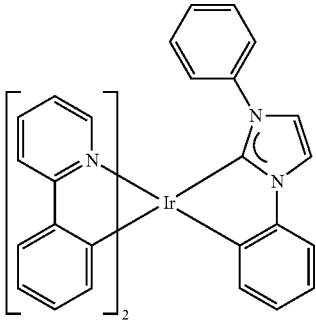 | EP1841834B |
| | 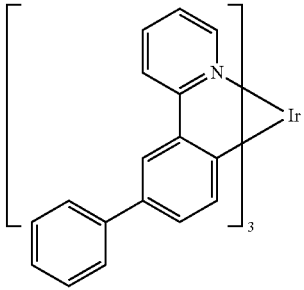 | US20060127696 |
| | 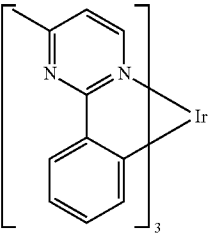 | US20090039776 |
| | 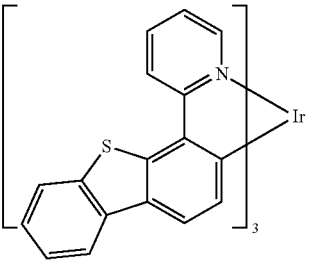 | U.S. Pat. No. 6,921,915 |
| | 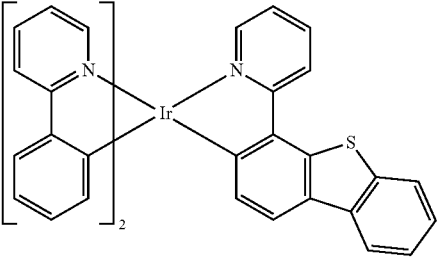 | US20100244004 |

TABLE A-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20076190359 |
| | | US 20060008670 JP2007123392 |
| | | WO2010086089, WO2011044988 |
| | | Adv. Mater. 16, 2003 (2004) |

TABLE A-continued
| MATERIAL | EXAMPLES OF MATERIAL | PUBLICATIONS |
|---|---|---|
| | 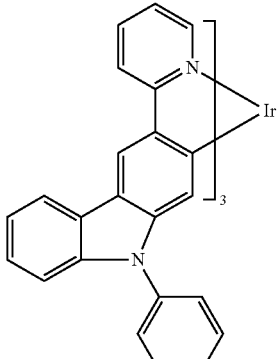 | Angew. Chem. Int. Ed. 2006, 45, 7800 |
| | 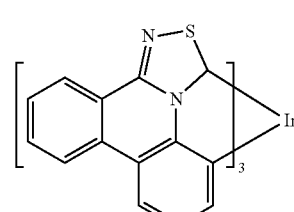 | WO2009050290 |
| | 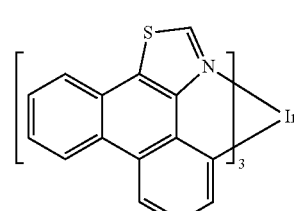 | US20090165846 |
| | 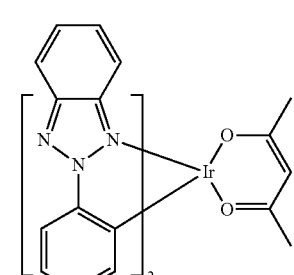 | US20080015355 |
| | 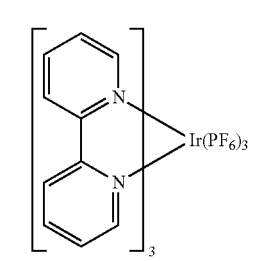 | US20010015432 |
| | 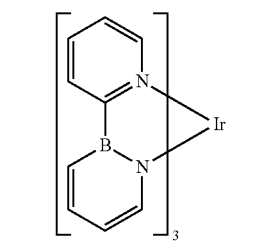 | US20100295032 |

TABLE A-continued

| MATERIAL | EXAMPLES OF MATERIAL | PUBLICATIONS |
|---|---|---|
| Monomer for polymeric metal organometallic compounds | | U.S. Pat. No. 7,250,226, U.S. Pat. No. 7,396,598 |
| Pt(II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |

TABLE A-continued
| MATERIAL | EXAMPLES OF MATERIAL | PUBLICATIONS |
|---|---|---|
| | 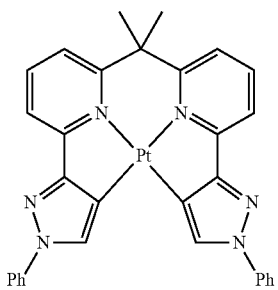 | US20060263635 |
| | 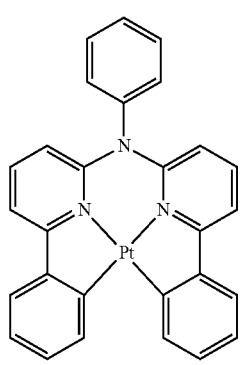 | US20060182992<br>US20070103060 |
| Cu complexes | | WO2009000673 |
| | 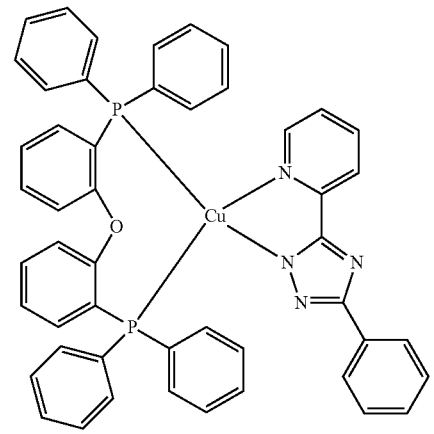 | |
| | 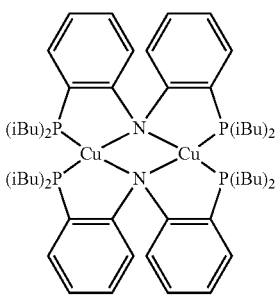 | US20070111026 |

TABLE A-continued
| MATERIAL | EXAMPLES OF MATERIAL | PUBLICATIONS |
|---|---|---|
| Gold complexes | 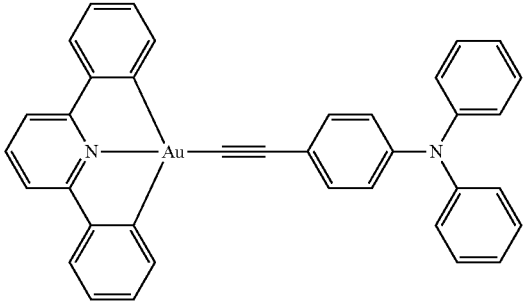 | Chem. Commun. 2906 (2005) |
| Rhenium(III) complexes | 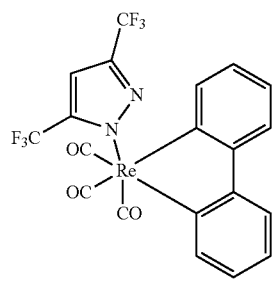 | Inorg. Chem. 42, 1248 (2003) |
| Osmium(II) complexes | 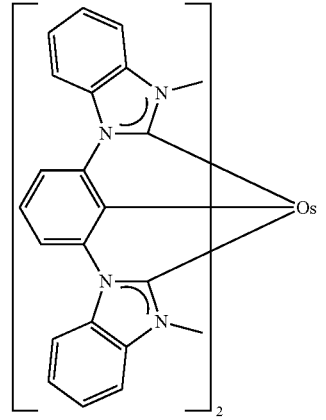 | U.S. Pat. No. 7,279,704 |
| Deuterated organometallic complexes | 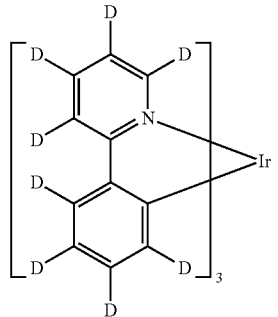 | US20030138657 |

TABLE A-continued
| MATERIAL | EXAMPLES OF MATERIAL | PUBLICATIONS |
|---|---|---|
| Organometallic complexes with two or more metal centers | 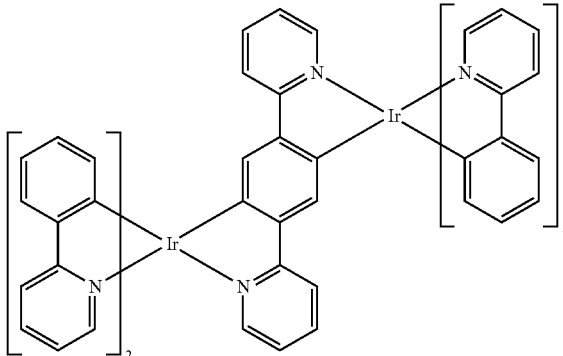 | US20030152802 |
| | 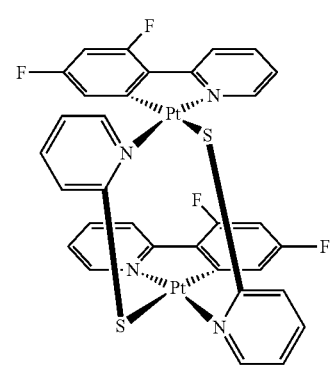 | U.S. Pat. No. 7,090,928 |
| Blue dopants | | |
| Iridium(III) organometallic complexes | 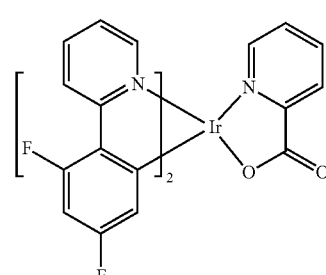 | WO2002002714 |
| | 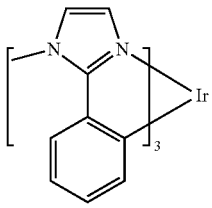 | WO2006009024 |
| | 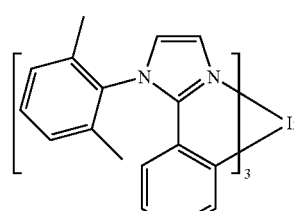 | US20060251923<br>US20110057559<br>US20110204333 |

TABLE A-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | WO2011051404 |
| | | U.S. Pat. No. 7,445,855 |
| | | US20070190359, US20080297033 US20100148663 |

TABLE A-continued

| MATERIAL | EXAMPLES OF MATERIAL | PUBLICATIONS |
|---|---|---|
|  |  | U.S. Pat. No. 7,338,722 |
|  |  | US20020134984 |
|  |  | Angew. Chem. Int. Ed. 47, 4542 (2008) |
|  |  | Chem. Mater. 18, 5119 (2006) |
|  |  | Inorg. Chem. 46, 4308 (2007) |

TABLE A-continued

| MATERIAL | EXAMPLES OF MATERIAL | PUBLICATIONS |
|---|---|---|
| | | WO2005123873 |
| | | WO2005123873 |
| | | WO2007004380 |
| | | WO2006082742 |
| Osmium(II) complexes | | U.S. Pat. No. 7,279,704 |

| MATERIAL | EXAMPLES OF MATERIAL | PUBLICATIONS |
|---|---|---|
| | 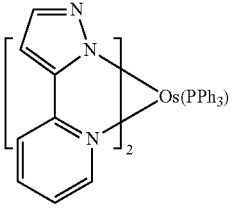 | Organometallics 23, 3745 (2004) |
| Gold complexes | 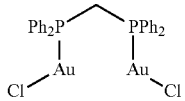 | Appl. Phys. Lett. 74, 1361 (1999) |
| Platinum(II) complexes | 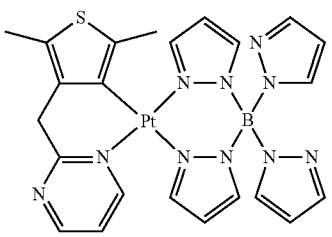 | WO2006098120, WO2006103874 |
| Pt tetradentate complexes with at least one metal-carbene bond | 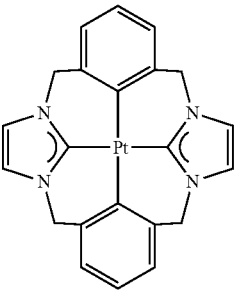 | U.S. Pat. No. 7,655,323 |
| Exciton/hole blocking layer materials | | |
| Bathocuprine compounds (e.g., BCP, BPhen) | 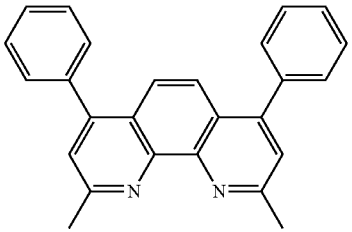 [SMILES: Cc1cc(-c2ccccc2)c2ccc3c(-c4ccccc4)cc(C)nc3c2n1] | Appl. Phys. Lett. 75, 4 (1999) |
| | 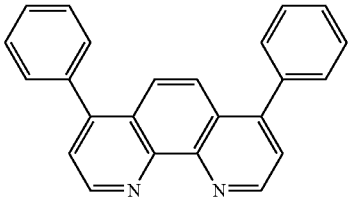 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 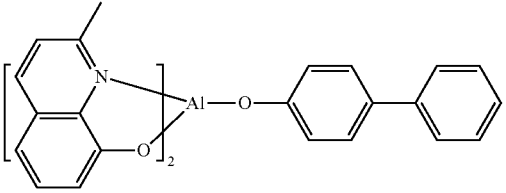 | Appl. Phys. Lett. 81, 162 (2002) |

TABLE A-continued
| MATERIAL | EXAMPLES OF MATERIAL | PUBLICATIONS |
|---|---|---|
| 5-member ring electron deficient heterocycles such as triazole, oxadiazole, imidazole, benzoimidazole | 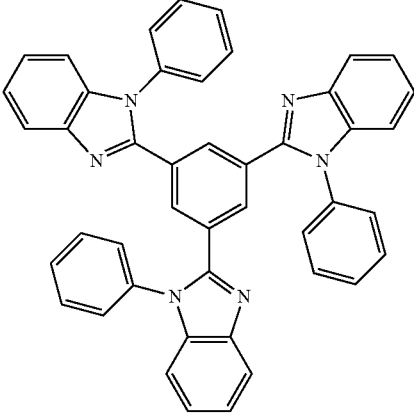 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 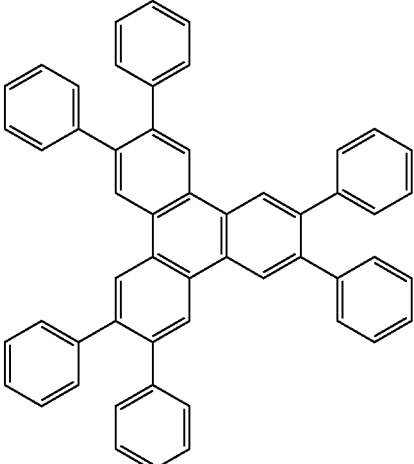 | US20050025993 |
| Fluorinated aromatic compounds | 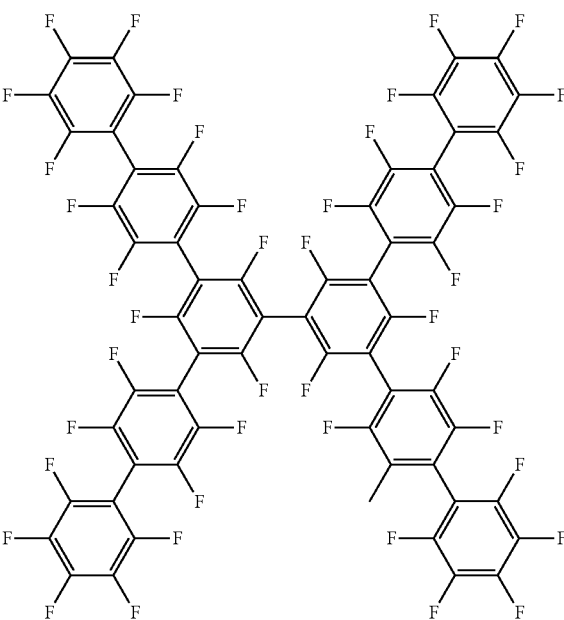 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |

TABLE A-continued
| MATERIAL | EXAMPLES OF MATERIAL | PUBLICATIONS |
| --- | --- | --- |
| Phenothiazine-S-oxide | 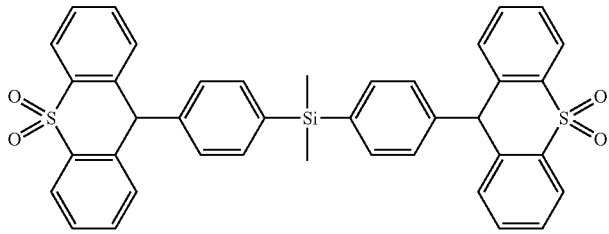 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 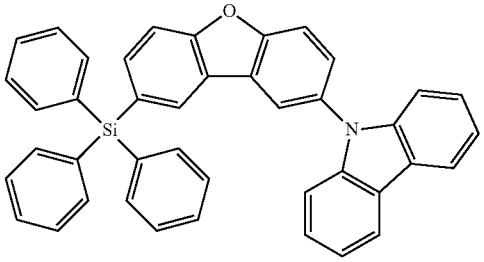 [SMILES: c1ccc([Si](c2ccccc2)(c2ccccc2)c2ccc3oc4ccc(-n5c6ccccc6c6ccccc65)cc4c3c2)cc1] | WO2010079051 |
| Aza-carbazoles | 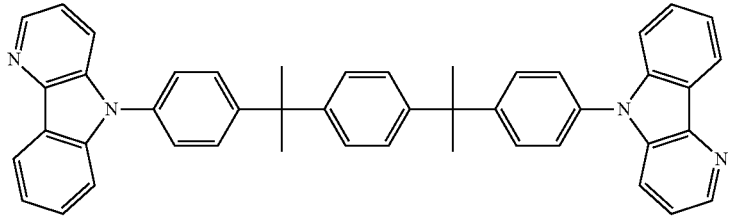 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 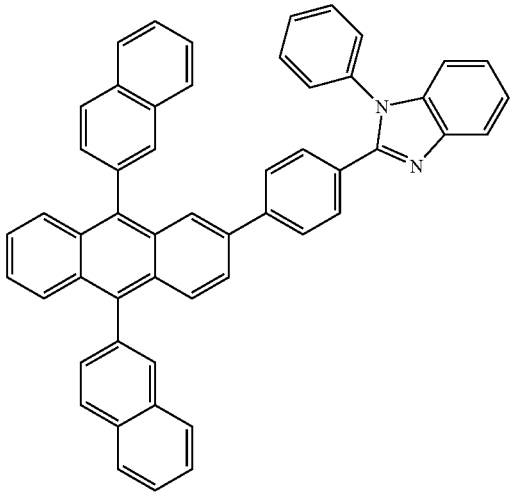 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 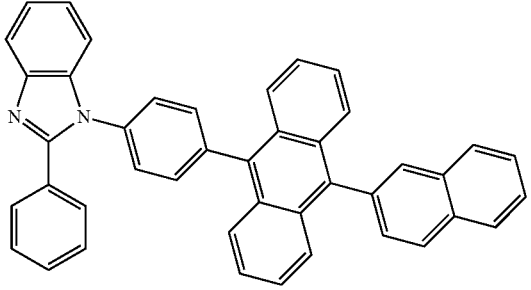 [SMILES: c1ccc(-c2nc3ccccc3n2-c2ccc(-c3c4ccccc4c(-c4ccc5ccccc5c4)c4ccccc34)cc2)cc1] | US20090179554 |

TABLE A-continued
| MATERIAL | EXAMPLES OF MATERIAL | PUBLICATIONS |
|---|---|---|
| Aza triphenylene derivatives | 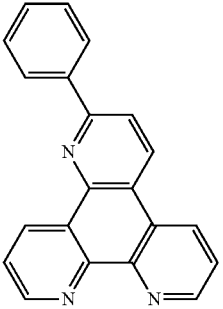 [SMILES: c1ccc(-c2ccc3c4cccnc4c4ncccc4c3n2)cc1] | US20090115316 |
| Anthracene-benzothiazole compounds | 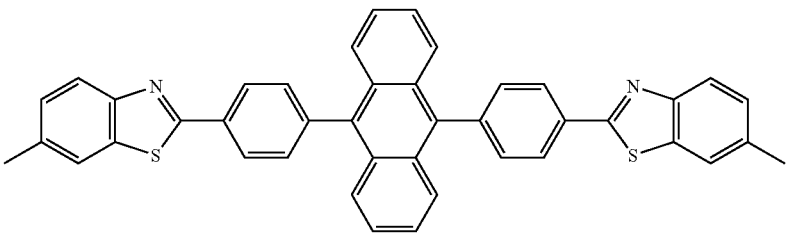 | Appl. Phys. Lett. 89, 063504 (2006) |
| Metal 8-hydroxyquinolates (e.g., $Alq_3$, $Zrq_4$) | 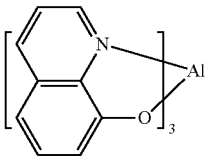 | Appl. Phys. Lett. 51, 913 (1987) U.S. Pat. No. 7,230,107 |
| Metal hydroxy-benoquinolates | 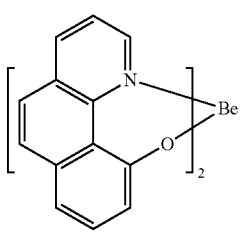 | Chem. Lett. 5, 905 (1993) |
| Bathocuprine compounds such as BCP, BPhen, etc | 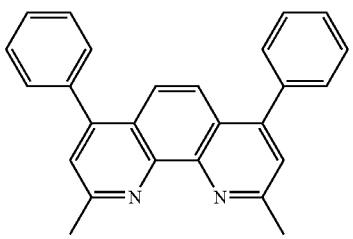 [SMILES: Cc1cc(-c2ccccc2)c2ccc3c(-c4ccccc4)cc(C)nc3c2n1] | Appl. Phys. Lett. 91, 263503 (2007) |
| | 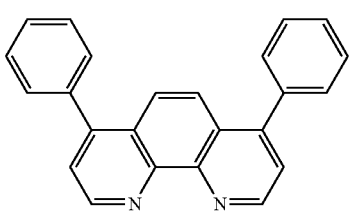 [SMILES: c1ccc(-c2ccnc3c2ccc2c(-c4ccccc4)ccnc23)cc1] | Appl. Phys. Lett. 79, 449 (2001) |

TABLE A-continued

| MATERIAL | EXAMPLES OF MATERIAL | PUBLICATIONS |
| --- | --- | --- |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |
| Fluorinated aromatic compounds | | J. Am. Chem. Soc. 122, 1832 (2000) |

TABLE A-continued

| MATERIAL | EXAMPLES OF MATERIAL | PUBLICATIONS |
|---|---|---|
| Fullerene (e.g. C60) | 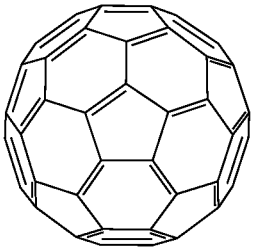 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 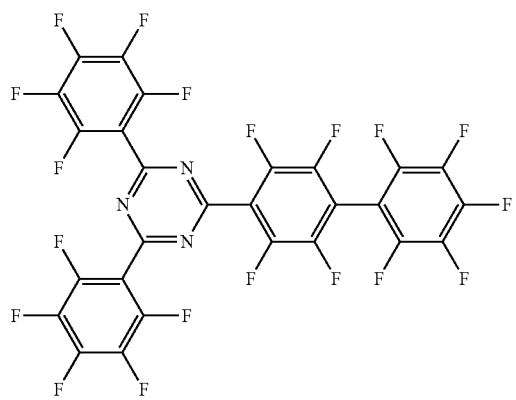 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 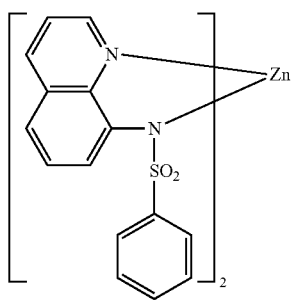 | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A method for fabricating a first organic light emitting device comprising an emissive layer, the method comprising:
providing a first container that contains a pre-mixed co-evaporation source for a vacuum deposition process, wherein the pre-mixed co-evaporation source is a mixture comprising: an electron-transporting co-host compound (e-host); a first hole-transporting co-host compound (h-host); and a second hole-transporting co-host compound (h-host), wherein

249 the e-host is Compound C74

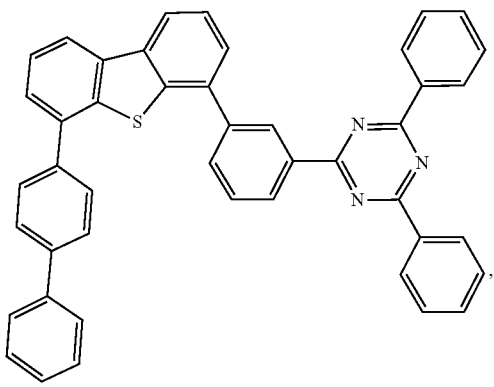 [SMILES: c1ccc(-c2ccc(-c3cccc4c3sc3c(-c5cccc(-c6nc(-c7ccccc7)nc(-c7ccccc7)n6)c5)cccc34)cc2)cc1]

the first h-host is Compound H8

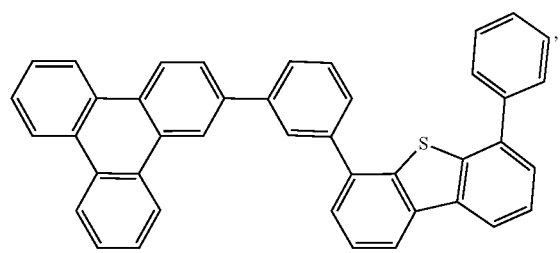 [SMILES: c1ccc(-c2cccc3c2sc2c(-c4cccc(-c5ccc6c7ccccc7c7ccccc7c6c5)c4)cccc23)cc1]

and
the second h-host is Compound H17

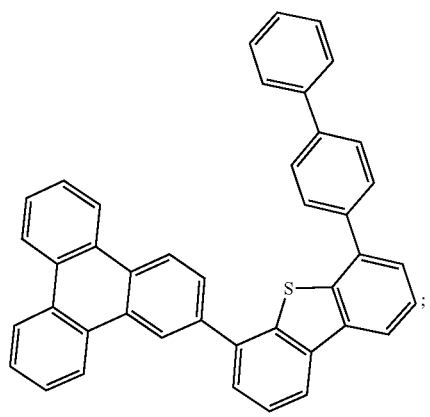 [SMILES: c1ccc(-c2ccc(-c3cccc4c3sc3c(-c5ccc6c7ccccc7c7ccccc7c6c5)cccc34)cc2)cc1]

or
a mixture comprising: an electron-transporting co-host compound (e-host); a hole-transporting co-host compound (h-host); and an emitter compound, wherein

250 the e-host is Compound E2

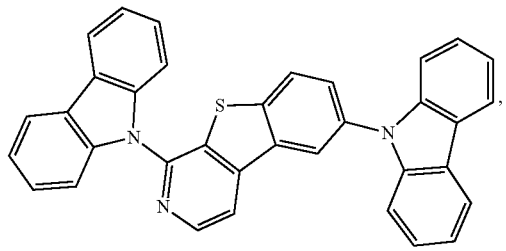 [SMILES: c1ccc2c(c1)c1ccccc1n2-c1ccc2sc3c(-n4c5ccccc5c5ccccc54)nccc3c2c1]

the h-host is Compound H5

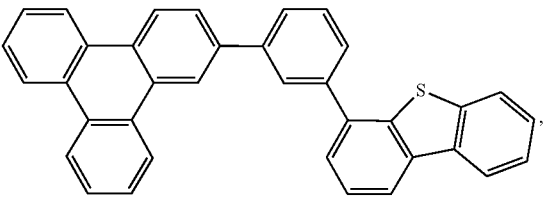 [SMILES: c1cc(-c2ccc3c4ccccc4c4ccccc4c3c2)cc(-c2cccc3c2sc2ccccc23)c1]

and
the emitter is

Emitter 25

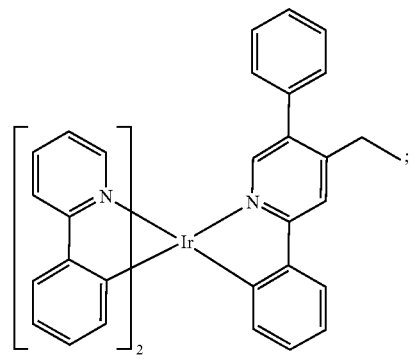

and
forming the emissive layer of the first device by co-evaporating the pre-mixed co-evaporation source in a vacuum deposition tool.

2. A pre-mixed co-evaporation source for vacuum deposition process, that is a mixture comprising: an electron-transporting co-host compound (e-host); a first hole-transporting co-host compound (h-host); and a second hole-transporting co-host compound (h-host), wherein the e-host is Compound C74

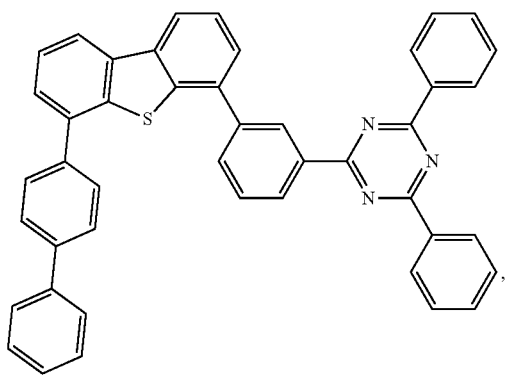 [SMILES: c1ccc(-c2ccc(-c3cccc4c3sc3c(-c5cccc(-c6nc(-c7ccccc7)nc(-c7ccccc7)n6)c5)cccc34)cc2)cc1]

the first h-host is Compound H8

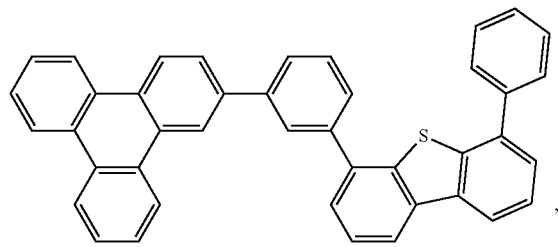 [SMILES: c1ccc(-c2cccc3c2sc2c(-c4cccc(-c5ccc6c7ccccc7c7ccccc7c6c5)c4)cccc23)cc1]

and
the second h-host is Compound H17

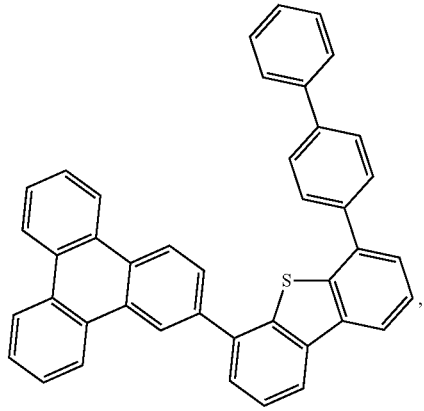 [SMILES: c1ccc(-c2ccc(-c3cccc4c3sc3c(-c5ccc6c7ccccc7c7ccccc7c6c5)cccc34)cc2)cc1]

3. A pre-mixed co-evaporation source for vacuum deposition process that is a mixture comprising: an electron-transporting co-host compound (e-host); a hole-transporting co-host compound (h-host); and an emitter compound, wherein the e-host is Compound E2

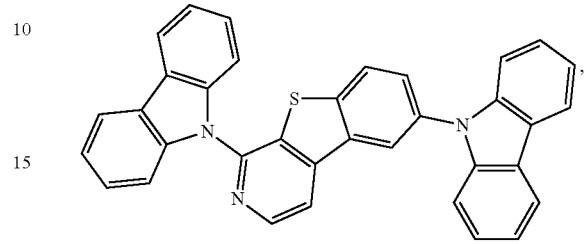

the h-host is Compound H5

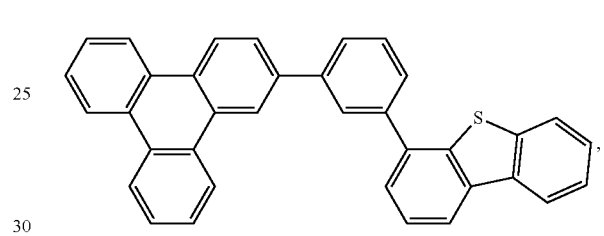

and
the emitter is

Emitter 25

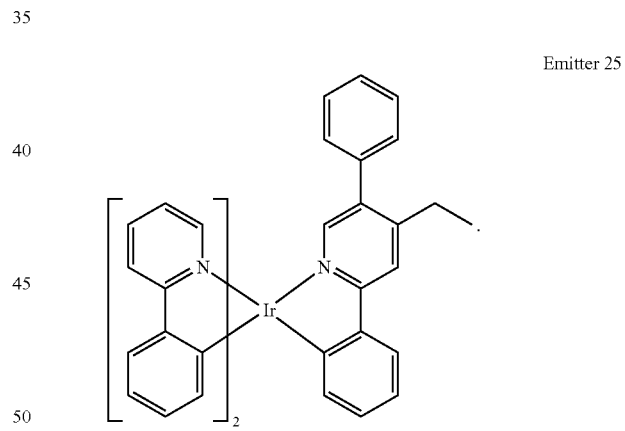

* * * * *